US010049740B2

(12) United States Patent
Sugahara et al.

(10) Patent No.: US 10,049,740 B2
(45) Date of Patent: Aug. 14, 2018

(54) MEMORY CIRCUIT WITH A BISTABLE CIRCUIT AND A NON-VOLATILE ELEMENT

(71) Applicants: JAPAN SCIENCE AND TECHNOLOGY AGENCY, Kawaguchi-shi, Saitama (JP); KANAGAWA ACADEMY OF SCIENCE AND TECHNOLOGY, Kawasaki-shi, Kanagawa (JP)

(72) Inventors: Satoshi Sugahara, Yokohama (JP); Yusuke Shuto, Yokohama (JP); Shuichiro Yamamoto, Yokohama (JP)

(73) Assignees: JAPAN SCIENCE AND TECHNOLOGY AGENCY, Saitama (JP); KANAGAWA INSTITUTE OF INDUSTRIAL SCIENCE AND TECHNOLOGY, Kanagawa (JP)

( * ) Notice: Subject to any disclaimer, the term of this patent is extended or adjusted under 35 U.S.C. 154(b) by 0 days.

(21) Appl. No.: 15/501,247

(22) PCT Filed: Aug. 6, 2015

(86) PCT No.: PCT/JP2015/072392
§ 371 (c)(1),
(2) Date: Feb. 2, 2017

(87) PCT Pub. No.: WO2016/024527
PCT Pub. Date: Feb. 18, 2016

(65) Prior Publication Data
US 2017/0229179 A1 Aug. 10, 2017

(30) Foreign Application Priority Data
Aug. 12, 2014 (JP) .................................. 2014-164526

(51) Int. Cl.
*G11C 11/00* (2006.01)
*G11C 14/00* (2006.01)
(Continued)

(52) U.S. Cl.
CPC ...... *G11C 14/0081* (2013.01); *G11C 11/1675* (2013.01); *G11C 11/1697* (2013.01); *G11C 11/419* (2013.01)

(58) Field of Classification Search
CPC ............ G11C 14/0081; G11C 11/1675; G11C 11/419; G11C 11/1697; G11C 11/412; G11C 11/415; G11C 11/417
(Continued)

(56) References Cited

U.S. PATENT DOCUMENTS 8,295,079 B2 * 10/2012 Yamamoto ......... G11C 14/0081
365/145
2006/0023503 A1 2/2006 Lee
(Continued)

FOREIGN PATENT DOCUMENTS

JP 2013-30240 A 2/2013
JP 2013-62319 A 4/2013
(Continued)

OTHER PUBLICATIONS

International Search Report dated Oct. 13, 2015, issued in counterpart of International Application No. PCT/JP2015/072392 (5 pages).
(Continued)

*Primary Examiner* — David Lam
(74) *Attorney, Agent, or Firm* — Westerman, Hattori, Daniels & Adrian, LLP

(57) ABSTRACT

A memory circuit includes: cells arranged in rows and columns so that the rows are grouped to form banks each including one or more rows, each cell including: a bistable
(Continued)

circuit storing data; and a non-volatile element storing data stored in the bistable circuit in a non-volatile manner and restoring data stored in a non-volatile manner to the bistable circuit; and a controller that performs a store operation on each row in turn; sets a voltage supplied, as a power-supply voltage, to cells in a first bank, which includes a row on which the store operation is performed, of the banks to a first voltage; and sets a voltage supplied, as a power-supply voltage, to cells in a bank of the banks other than the first bank to a second voltage that is less than the first voltage but at which data in the bistable circuit is retained.

12 Claims, 39 Drawing Sheets

(51) Int. Cl.
  *G11C 11/419* (2006.01)
  *G11C 11/16* (2006.01)
(58) Field of Classification Search
  USPC .......................... 365/154, 156, 189.09, 226
  See application file for complete search history.

(56) References Cited

U.S. PATENT DOCUMENTS

| 2011/0273925 | A1 | 11/2011 | Yamamoto et al. |
| 2015/0070974 | A1 | 3/2015 | Shuto et al. |
| 2015/0070975 | A1 | 3/2015 | Yamamoto et al. |

FOREIGN PATENT DOCUMENTS

| JP | 2014-29757 A | 2/2014 |
| KR | 10-2007-0045200 A | 5/2007 |
| WO | 2006/019653 A2 | 2/2006 |
| WO | 2009/028298 A1 | 3/2009 |
| WO | 2013/172065 A1 | 11/2013 |
| WO | 2013/172066 A1 | 11/2013 |
| WO | 2015/041305 A1 | 3/2015 |

OTHER PUBLICATIONS

Nebashi et al., "Investigation of stand-by power free electric system using non-volatile CPU", IPSJ SIG Technical Report, (Mar. 3, 2012), vol. 2012-SLDM-155 No. 25, pp. 145-150. (6 pages).

Office Action dated Feb. 7, 2018, issued in counterpart Korean Application No. 10-2017-7002083, with English translation. (9 pages).

* cited by examiner

MEMORY CIRCUIT WITH A BISTABLE CIRCUIT AND A NON-VOLATILE ELEMENT

TECHNICAL FIELD

The present invention relates to a memory circuit, for example, to a memory circuit including a plurality of cells each including a bistable circuit and a non-volatile element.

BACKGROUND ART

In recent years, power consumption by information processing apparatuses has rapidly increased. In the future, the reduction of energy consumption of the information processing apparatuses centered on Complementary Metal Oxide Semiconductor (CMOS) logic systems is expected to be more important than ever. In recent CMOS logic systems, such as microprocessors of personal computers (PC) and servers and system-on-chips (SoCs) of mobile terminals such as smartphones, transistors have been miniaturized and densely integrated, and thus the static or standby power, which is dissipation power during a standby mode owing to leak current, is distinctively large. As described above, increase in energy during a standby mode has been recognized as a serious problem. For example, the static power of the latest microprocessor has reached the same level as the dynamic power consumed while the CMOS works (operates). That is, such microprocessors consume the same level of power even without performing operations during the standby mode as that during operations. Therefore, the reduction of the static power has been an important issue in the CMOS logic systems.

Power Gating (PG) is a method for reducing static power, in which logic circuits are divided into blocks called power domains and individual power management (power restriction) of the power domains is performed by cutting off power supply. For the power management, used is a Metal Oxide Semiconductor Field Effect Transistor (MOSFET) switch called a power switch or a sleep transistor. Hereinafter, the power switch and the sleep transistor will be collectively referred to as a power switch. PG is now one of essential architectures for reducing energy in CMOS logic systems such as microprocessors and SoCs. Important factors for power saving (energy saving) effect in PG are the spatial granularity of the power domains (the size of the power domain) and the temporal granularity of execution of PG (the temporal frequency of execution of PG). The retention of information in the memory circuit inside the power domain limits the spatial and temporal granularity of PG. This is because important information stored in a memory circuit such as a register or a cash memory in the power domain is lost by cut of the power supply.

Non-volatile power gating (NVPG) resolves the aforementioned problems in conventional PG and achieves PG with optimal spatial and temporal granularity, which cannot be achieved only by a CMOS circuit. Thus, the NVPG is a technique that can reduce energy with high efficiency and drastically reduce power consumption during the standby mode. To achieve the NVPG, memory circuits such as cash memories, registers, or register files used in microprocessors or SoCs are replaced by non-volatile ones. These memory circuits are composed of bistable circuits such as Static Random Access Memories (SRAMs) or flip-flops (FFs). Addition of a non-volatile memory element such as a ferromagnetic tunnel junction (MTJ) to the bistable circuit can form a non-volatile bistable circuit such as a non-volatile SRAM (NV-SRAM) or a non-volatile FF (NV-FF).

Patent Document 1 discloses a memory circuit utilizing a cell including a bistable circuit and a non-volatile element. Called a non-volatile bistable circuit is a circuit that stores data in the bistable circuit to the non-volatile element and restores data in the non-volatile element to the bistable circuit. Patent Document 2 discloses a memory circuit that performs a normal SRAM operation, a sleep operation, a store operation, and power-off (shutdown) in a cell including a non-volatile bistable circuit. Patent Document 3 discloses a memory circuit that does not store data in the bistable circuit in the non-volatile element when the data stored in the bistable circuit and the data stored in the non-volatile element match.

PRIOR ART DOCUMENT

Patent Document

Patent Document 1: International Publication No. 2009/028298

Patent Document 2: International Publication No. 2013/172066

Patent Document 3: International Publication No. 2013/172065

SUMMARY OF THE INVENTION

Problem to be Solved by the Invention

However, in the memory circuits disclosed in Patent Documents 1 through 3, when data in the bistable circuit of the selected cell is stored in the non-volatile element, supply voltage during the store operation is also supplied to non-selected cells. Such non-selected cells become in a standby state for the store operation, causing wasteful static power.

In addition, as disclosed in Patent Documents 2 and 3, a power switch is used to put a cell into a sleep mode or a shutdown mode. During the store operation, electric current flows in a non-volatile element with low impedance. Thus, to maintain the virtual power-supply voltage applied to a cell high (or the virtual ground voltage low), the power switch for making the cell sleep or shutting down the cell needs to be large. Thus, the occupancy area of the power switch increases.

Furthermore, determination of necessity of storing for each cell described in Patent Document 3 increases the peripheral circuit in size.

The present invention has been made in views of the above-described problems, and aims to reduce static power or to reduce an occupancy area.

Means for Solving the Problem

The present invention is a memory circuit characterized by including: a plurality of cells arranged in a plurality of rows and a plurality of columns so that the plurality of rows are grouped to form a plurality of banks each including one or more rows, each of the plurality of cells including: a bistable circuit configured to store data; and a non-volatile element configured to store data stored in the bistable circuit in a non-volatile manner and to restore data stored in a non-volatile manner to the bistable circuit; and a controller configured to: perform a store operation on each of the plurality of rows in turn; set a voltage supplied, as a power-supply voltage, to cells in a first bank of the plurality of banks to a first voltage, the first bank including a row on which the store operation is performed; and set a voltage supplied, as a power-supply voltage, to cells in a bank of the plurality of banks other than the first bank to a second voltage that is less than the first voltage but at which data in the bistable circuit is retained.

In the above configuration, the controller can be configured to set a voltage supplied, as a power-supply voltage, to the cells in a bank to the second voltage every time the store operation on all rows of the bank ends.

In the above configuration, the controller can be configured to shut down a voltage supplied, as a power-supply voltage, to the cells in a bank every time the store operation on all rows of the bank ends.

In the above configuration, a configuration that the non-volatile element includes a first end coupled to a node in the bistable circuit and a second end coupled to a control line; each of the plurality of cells includes a switch connected in series to the non-volatile element between the node and the control line; and a voltage supplied, as a power-supply voltage, to the plurality of cells is supplied to the bistable circuit can be employed.

In the above configuration, each of the plurality of banks can be configured to include one row.

The present invention is a memory circuit characterized by including: a plurality of cells, each including: a bistable circuit configured to store data; and a non-volatile element configured to store data stored in the bistable circuit in a non-volatile manner and to restore data stored in a non-volatile manner to the bistable circuit; one or more power switches configured to change a voltage supplied, as a power-supply voltage, to the plurality of cells; and a controller configured to perform a store operation on each of a plurality of blocks at different times in a region, the region to which a same voltage is supplied by a single power switch being divided into the plurality of blocks.

In the above configuration, a configuration that the plurality of cells are arranged in a plurality of rows and a plurality of columns; the region includes one or more rows; and one row is divided into the plurality of blocks can be employed.

In the above configuration, a configuration that each of the plurality of cells includes a switch for performing storing of data; the switches in cells of each of the plurality of blocks are coupled to a same sub-switch line; sub-switch lines in a same row are coupled to a single switch line; and the memory circuit further comprises a selection circuit configured to select one block of the plurality of blocks, and to output a signal for turning on the switch to a sub-switch line of a selected block can be employed.

In the above configuration, a configuration that the non-volatile element includes a first end coupled to a node in the bistable circuit, and a second end coupled to a control line; the switch is connected in series to the non-volatile element between the node and the control line; and a voltage supplied, as a power-supply voltage, to the cell is supplied to the bistable circuit can be employed.

In the above configuration, each of the plurality of blocks can be configured to include consecutive cells in a same row.

In the above configuration, each of the plurality of blocks can be configured to include cells periodically arranged in a same row.

In the above configuration, the memory circuit can be configured to further include: a determination circuit configured to determine whether data in the bistable circuit and data in the non-volatile element match in cells of each of the plurality of blocks; and a selection circuit configured to perform the store operation of the cells in a corresponding block when the data fail to match, and not to perform the store operation of the cells in the corresponding block when the data match.

The present invention is a memory circuit characterized by including: a plurality of cells arranged in a plurality of rows and a plurality of columns, each of the plurality of rows being coupled to a corresponding switch line, each of the plurality of columns being coupled to a corresponding control line, each of the plurality of cells including: a bistable circuit configured to store data; a non-volatile element configured to store data stored in the bistable circuit in a non-volatile manner and to restore data stored in a non-volatile manner to the bistable circuit, a first end of the non-volatile element being coupled to a node in the bistable circuit, a second end of the non-volatile element being coupled to a control line; and a switch connected in series to the non-volatile element between the node and the control line; a determination circuit commonly provided for a same control line and configured to determine, based on a signal of a corresponding control line, whether data in the bistable circuit and data stored in the non-volatile element match in cells coupled to the corresponding control line; and a selection circuit configured to turn on the switches in the cells coupled to the corresponding control line when the data fail to match, and to turn off a switch coupled to the corresponding control line when the data match.

In the above configuration, a configuration that one row is divided into a plurality of blocks each including a plurality of cells; and the selection circuit is configured to turn on the switches in a corresponding block when the data fail to match in at least one of the plurality of cells in the corresponding block, and to turn off the switches in the corresponding block when the data match in all the plurality of cells in the corresponding block can be employed.

In the above configuration, the determination circuit cab be configured to be shared by a plurality of control lines in a same block.

In the above configuration, a configuration that a pair of the non-volatile elements are coupled to complementary nodes of the bistable circuit; a pair of the control lines are coupled to the pair of the non-volatile elements; and the determination circuit is configured to determine whether the data match or not based on data in the bistable circuit and signals of the pair of the control lines can be employed.

The present invention is a memory circuit characterized by including: a bistable circuit to which voltages are supplied from a power supply line and a ground line, and that is configured to store data; a non-volatile element of which a first end is coupled to a node in the bistable circuit, of which a second end is coupled to a control line, that is configured to store data stored in the bistable circuit in a non-volatile manner by change in a resistance value by a current flowing between the first end and the second end, and that is configured to restore data stored in a non-volatile manner to the bistable circuit; an FET of which a source and a drain are connected in series to the non-volatile element between the node and the control line; and a controller configured to set, during a first time period, a voltage applied to a gate of the FET to less than a voltage of the ground line when the FET is an n-channel FET, and to set, during the first time period, the voltage applied to the gate of the FET to greater than a voltage of the power supply line when the FET is a p-channel FET, the first time period being a time period during which data is written to and read from the bistable circuit in a volatile manner.

In the above configuration, the controller can be configured to set, during a second time period, the voltage applied to the gate of the FET to less than the voltage of the ground line during the first time period when the FET is an n-channel FET, and to set, during the second time period, the voltage applied to the gate of the FET to greater than the voltage of the power supply line during the first time period when the FET is a p-channel FET, the second time period being a time period during which data in the bistable circuit is retained and a difference between a voltage of the power supply line of the bistable circuit and a voltage of the ground line is less than a difference between the voltage of the power supply line and the voltage of the ground line during the first time period.

In the above configuration, the controller can be configured to: set the voltage applied to the gate of the FET in a time period during which the data stored in the non-volatile element is restored to the bistable circuit to less than the voltage applied to the gate of the FET in a time period during which data stored in the bistable circuit is stored in the nonvolatile memory in a non-volatile manner when the FET is an n-channel FET; and set the voltage applied to the gate of the FET in the time period during which the data stored in the non-volatile element is restored to the bistable circuit to greater than the voltage applied to the gate of the FET in the time period during which the data stored in the bistable circuit is stored in the nonvolatile memory in a non-volatile manner when the FET is a p-channel FET.

Effects of the Invention

The present invention can reduce static power or reduce an occupancy area.

MODES FOR CARRYING OUT THE EMBODIMENTS

Hereinafter, with reference to drawings, a description will be given of embodiments using an NV-SRAM as an example of a non-volatile bistable circuit. Memory circuits in accordance with the following embodiments are memory circuits included in power domains in which Power Gating is performed, which are, for example, cash memories or registers. Although a non-volatile SRAM will be described as an example, a non-volatile FF can be employed.

First Embodiment

A first embodiment is exemplary in-storing sleep architecture. In the first embodiment, during a store operation, cells coupled to rows, on which the store operation is not being performed, of a cell array are put into a sleep mode or a shutdown mode. Alternatively, cells coupled to rows other than neighboring several rows including the row on which the store operation is being performed are put into the sleep mode or the shutdown mode. Rows before their store operation are put into not the shutdown mode but the sleep mode, but rows after their store operation may be put into any of the sleep mode or the shutdown mode. The row means cells that are arranged in a direction parallel to, for example, a word line. This configuration can enhance, in a memory circuit including a non-volatile bistable circuit and being capable of Non-Volatile Power Gating (NVPG), the power reduction efficiency of the NVPG.

Figure 1:
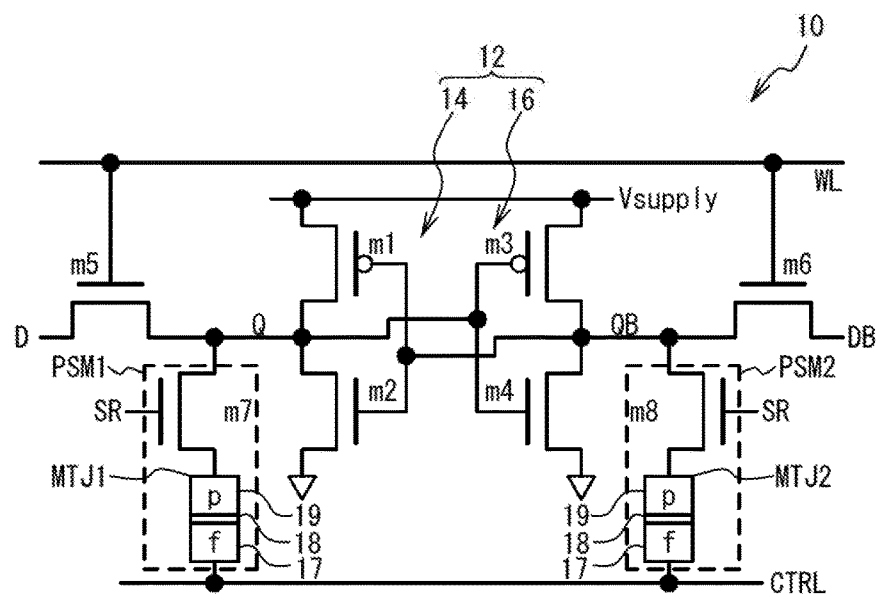
FIG. 1 is a circuit diagram of a cell in first through third embodiments.

FIG. 1 is a circuit diagram of a cell in the first through third embodiments. As illustrated in FIG. 1, an NV-SRAM cell 10 includes inverter circuits 14 and 16, and spin-transfer torque magnetic tunnel junction elements (STT-MTJ: hereinafter, simply referred to as a ferromagnetic tunnel junction element for the sake of ease) MTJ1 and MTJ2.

The inverter circuits 14 and 16 are coupled in a loop-like manner to form a bistable circuit 12. The inverter circuit 14 includes an n-type MOSFET m2 and a p-type MOSFET m1. The inverter circuit 16 includes an n-type MOSFET m4 and a p-type MOSFET m3.

A node to which the inverter circuit 14 is coupled is a node Q, and a node to which the inverter circuit 16 is coupled is a node QB. The node Q and the node QB are complementary nodes. The bistable circuit 12 is put in a stable state when the node Q and the node QB are respectively at a high level and a low level, or when the node Q and the node QB are respectively at a low level and a high level. The bistable circuit 12 in a stable state is capable of storing data.

The node Q is coupled to an input/output line D via a MOSFET m5, and the node QB is coupled to an input/output line DB via a MOSFET m6. The gates of the MOSFETs m5 and m6 are coupled to a word line WL. The MOSFETs m1 through m6 form a 6-transistor (FET) SRAM.

A MOSFET m7 and the ferromagnetic tunnel junction element MTJ1 are connected between the node Q and a control line CTRL, and a MOSFET m8 and the ferromagnetic tunnel junction element MTJ2 are connected between the node QB and the control line CTRL. One of the source and the drain of the MOSFET m7 is coupled to the node Q and the other is coupled to the ferromagnetic tunnel junction element MTJ1, while one of the source and the drain of the MOSFET m8 is coupled to the node QB and the other is coupled to the ferromagnetic tunnel junction element MTJ2. The gates of the MOSFETs m7 and m8 are coupled to a switch line SR. The MOSFET m7 may be connected between the ferromagnetic tunnel junction element MTJ1 and the control line CTRL, while the MOSFET m8 may be connected between the ferromagnetic tunnel junction element MTJ2 and the control line CTRL. Alternatively, the MOSFETs m7 and m8 may not be necessarily provided.

The ferromagnetic tunnel junction element MTJ1 and the MOSFET m7 form a pseudo-spin MOSFET (PS-MOSFET) PSM1. Similarly, the ferromagnetic tunnel junction element MTJ2 and the MOSFET m8 form a PSM2.

Each of the ferromagnetic tunnel junction elements MTJ1 and MTJ2 includes a free layer 17, a tunnel insulator layer 18, and a pin layer 19. The free layer 17 and the pin layer 19 are formed of a ferromagnetic material. When the magnetization directions of the free layer 17 and the pin layer 19 are parallel to each other (a parallel state), the resistance values of the MTJ1 and MTJ2 are low. When the magnetization directions of the free layer 17 and the pin layer 19 are antiparallel to each other (an antiparallel state), the resistance values of the MTJ1 and the MTJ2 are greater than those in the parallel state. The MTJ1 and the MTJ2 store data based on the resistance values of the MTJ1 and the MTJ2. In a virtual power-supply method described later, the free layer 17 is coupled to the control line CTRL, while in a virtual ground method, the pin layer 19 is coupled to the control line CTRL. In the virtual power-supply method, the MOSFETs m7 and m8 of the PSM1 and the PSM2 are of n-type, while in the virtual ground method, the MOSFETs m7 and m8 of the PSM1 and the PSM2 are of p-type.

Data is written to and read from the bistable circuit 12 in the same manner as in a conventional SRAM. That is, the word line WL is set at a high level to put the MOSFETs m5 and m6 into a conduction state, and data in the input/output lines D and DB is written to the bistable circuit 12. The input/output lines D and DB are put into an equipotential floating state and the word line WL is set at a high level to put the MOSFETs m5 and m6 to a conduction state, and data in the bistable circuit 12 is read to the input/output lines D and DB. Data in the bistable circuit 12 is held by putting the MOSFETs m5 and m6 into a cut-off state. When data is written to, read from, or held in the bistable circuit 12, the switch line SR is preferably set at a low level and the MOSFETs m7 and m8 are preferably put into the cut-off state. This configuration cutoffs most of the current flowing between the nodes Q and QB and the control line CTRL, achieves a stable operation, and reduces increase in power consumption.

Figure 2:
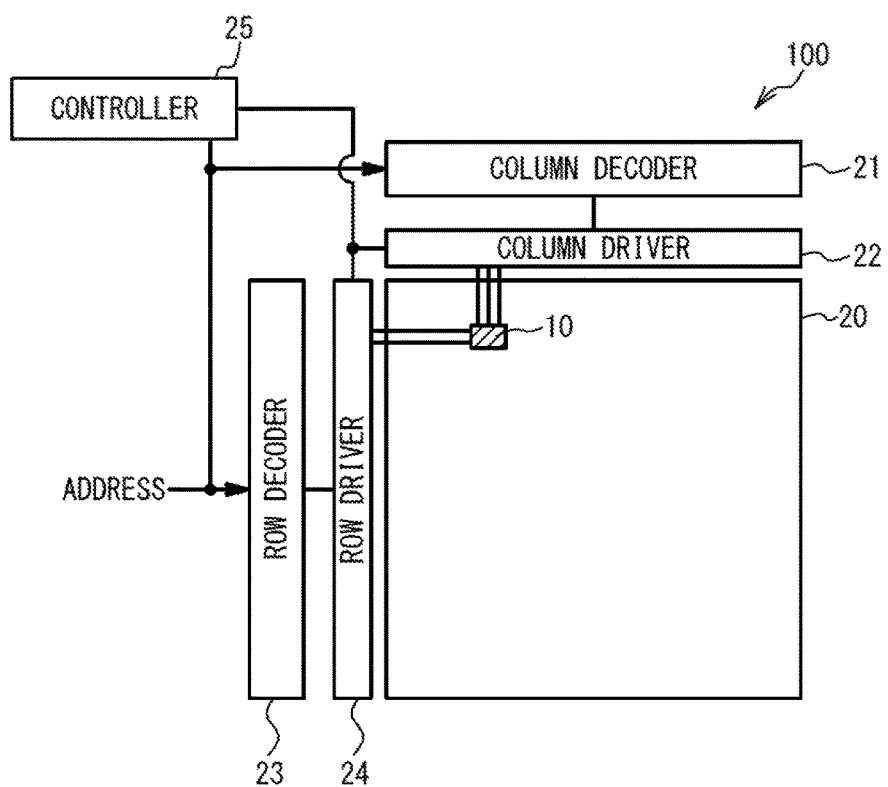
FIG. 2 is a block diagram of a memory circuit in the first through third embodiments.

FIG. 2 is a block diagram of a memory circuit in the first through third embodiments. As illustrated in FIG. 2, a memory circuit 100 includes a cell array 20, a column decoder 21, a column driver 22, a row decoder 23, a row driver 24, and a controller 25. In the cell array 20, a plurality of cells 10 are arranged in a plurality of rows and a plurality of columns in a matrix fashion. The column decoder 21 and the row decoder 23 select a column and a row in accordance with an address signal, respectively. The column driver 22 applies a voltage or the like to the input/output lines (also referred to as bit lines) D and DB and the control line CTRL of a selected column. The row driver 24 applies a voltage or the like to the word line WL and the switch line SR of a selected row. The controller 25 applies a voltage or the like to the input/output lines D and DB, the word line WL, the switch line SR, and the control line CTRL of the cell 10 via the column decoder 21, the column driver 22, the row decoder 23, and the row driver 24.

Figure 3:
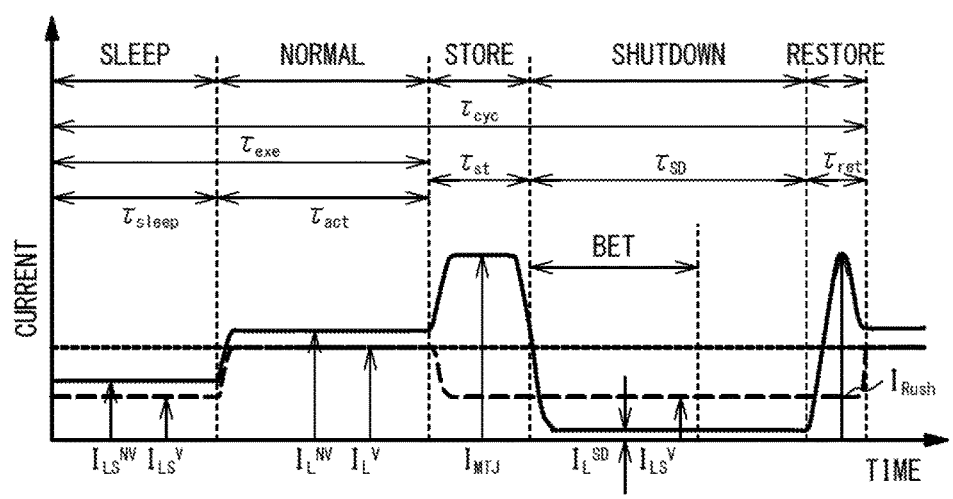
FIG. 3 illustrates consumption current of an NV-SRAM and a 6T-SRAM during each time period in the first through third embodiments.

FIG. 3 illustrates consumption current of an NV-SRAM and a 6T-SRAM during each time period in the first through third embodiments. The solid line indicates the consumption current of a memory circuit including the NV-SRAM illustrated in FIG. 1. The consumption current indicated by the solid line includes leakage current and current used for NVPG, and does not contain current for writing and reading during a normal SRAM operation. The dashed line indicates consumption current of a memory circuit using a 6 transistor SRAM (6T-SRAM) cell without the MOSFET m7, the MOSFET m8, the MTJ1 and the MTJ2. The dotted line indicates consumption current of the memory circuit using a 6T-SRAM cell during the normal SRAM operation period. The consumption current indicated by the dashed line and the dotted line includes leakage current, but does not contain current for writing and reading in an SRAM operation.

As illustrated in FIG. 3, the NV-SRAM cell 10 has the following operation periods: a sleep period, a normal SRAM operation period, a store period, a shutdown (power-supply cut-off) period, and a restore period. The sleep period and the normal SRAM operation period are the time period during which data is held in the bistable circuit 12. The normal SRAM operation period is the time period during which data in the bistable circuit 12 is rewritten as a normal SRAM and held in a volatile manner (this will be described as "data is rewritten in a volatile manner"). The sleep period is the time period during which the cell 10 is in a sleep mode and data in the bistable circuit 12 is only held, and is not rewritten. During the sleep period, the power-supply voltage Vsupply supplied to the bistable circuit 12 is set to a voltage lower than that during the normal SRAM operation period but enough to hold data. For example, the Vsupply during the normal SRAM operation period is set to 1.1 V, and the Vsupply during the sleep period is set to 0.9 V. This configuration can reduce power consumption. During the sleep period and the normal SRAM operation period, the control line CTRL and the switch line SR are at a low level, and the MOSFETs m7 and m8 are OFF.

The store period is the time period during which the store operation is performed, and the time period during data stored in the bistable circuit 12 is stored in the ferromagnetic tunnel junction elements MTJ1 and MTJ2 and held in a non-volatile manner (this will be described as "store data in a non-volatile manner"). In a part of the store period, the switch line SR and the control line CTRL are set at a high level, and in the remaining time period, the switch line SR is set at a high level (the MOSFETs m7 and m8 are turned ON) and the control line CTRL is set at a low level. For example, in the beginning of the store period, the control line CTRL is set at a low level, and in the time period remaining of the store period, the control line CTRL is set at a high level. When the nodes Q and QB are respectively at a high level and a low level, the ferromagnetic tunnel junction elements MTJ1 and MTJ2 respectively have a high resistance and a low resistance. When the nodes Q and QB are respectively at a low level and a high level, the ferromagnetic tunnel junction elements MTJ1 and MTJ2 respectively have a low resistance and a high resistance. In this manner, data in the bistable circuit 12 is stored in the ferromagnetic tunnel junction elements MTJ1 and MTJ2.

The shutdown period is the time period during which the cell 10 is put into a shutdown mode. During the shutdown period, the voltage supplied, as a power-supply voltage, to the cell 10 (Vsupply-Ground voltage) is set to approximately 0 V. This puts the cell 10 into the shutdown mode. At this time, little current flows in the cell 10, and thus power consumption can be reduced.

During the restore period, a restore operation is performed by ramping up the power-supply voltage Vsupply from 0 V while the control line CTRL is set at a low level and the switch line SR is set at a high level. When the ferromagnetic tunnel junction elements MTJ1 and MTJ2 respectively have a high resistance and a low resistance, the nodes Q and QB are respectively at a high level and a low level. When the ferromagnetic tunnel junction elements MTJ1 and MTJ2 respectively have a low resistance and a high resistance, the nodes Q and QB are respectively at a low level and a high level. In this manner, data held in the ferromagnetic tunnel junction elements MTJ1 and MTJ2 in a non-volatile manner (this will be described as "data stored in a non-volatile manner") is restored to the bistable circuit 12.

The length of the sleep period is represented by $\tau_{sleep}$, the leakage current of the 6T-SRAM is represented by $I_{LS}^V$, and the leakage current of the NV-SRAM is represented by $I_{LS}^{NV}$. The length of the normal SRAM operation period is represented by $\tau_{act}$, the leakage current of the 6T-SRAM is represented by $I_L^V$, and the leakage current of the NV-SRAM is represented by $I_L^{NV}$. The length of the store period is represented by $\tau_{st}$, and the current for writing data to the ferromagnetic tunnel junction elements MTJ1 and MTJ2 (the current generated at the time of the store operation) is represented by $I_{MTJ}$. The length of the shutdown period is represented by $\tau_{SD}$, and the leakage current of the NV-SRAM is represented by $I_L^{SD}$. The length of the restore period is represented by $\tau_{ret}$, and the current generated at the time of the restore operation of the NV-SRAM is represented by $I_{Rush}$. The total length of the sleep period and the normal SRAM operation period is represented by $\tau_{exe}$. The length from the sleep period to the restore period is represented by $\tau_{cyc}$.

During the sleep period and the normal SRAM operation period, leakage current flows in the MOSFETs m7 and m8, and therefore, the power consumption of the NV-SRAM due to leakage current is greater than that of the 6T-SRAM. In the NV-SRAM, current for storing is generated during the store period, while current generated via the ferromagnetic tunnel junction elements MTJ1 and MTJ2 and rush current generated in a circuit for restoring power supply are generated during the restore period. During the shutdown period, a very small amount of leakage current flows in the NV-SRAM, but the power consumption becomes sufficiently smaller. Since the 6T-SRAM cannot be shut down, the time period corresponding to the store period, the shutdown period, and the restore period in the NV-SRAM form the sleep period. The leakage current of the 6T-SRAM during these time periods is represented by $I_{LS}^V$.

In the NV-SRAM cell, BET (Break-Even Time) is given by a time period during which the increase in leakage current during the normal SRAM operation and the sleep operation from that of the 6T-SRAM cell and the increase in consumption energy during the store period and the restore period from that of the 6T-SRAM are equal to the saved energy by shutdown. Thus, when the waiting time period is equal to or longer than the BET, shutdown is performed, while when equal to or less than the BET, sleep is performed. This configuration can remarkably highly efficiently reduce the power.

Figure 4A:
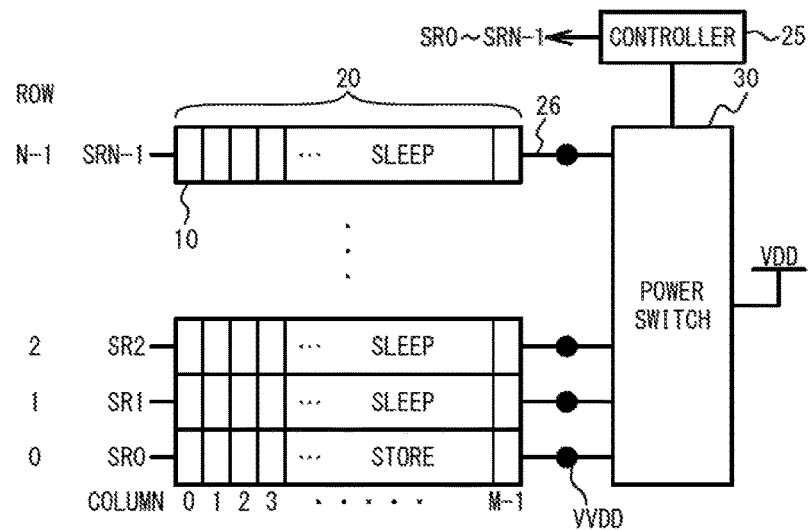
FIG. 4A and FIG. 4B are diagrams for describing operations in the first embodiment.
Figure 4B:
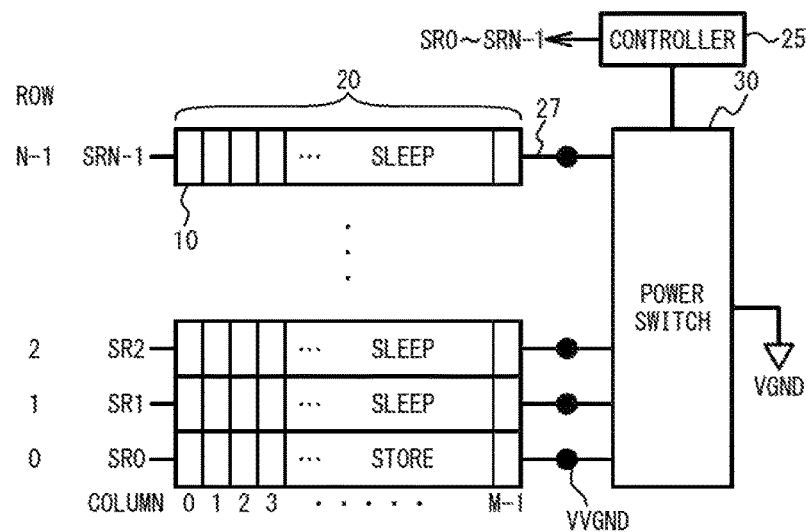

FIG. 4A and FIG. 4B are diagrams for describing operations in the first embodiment. FIG. 4A illustrates the virtual power-supply method, and FIG. 4B illustrates the virtual ground method. As illustrated in FIG. 4A, N rows by M columns of the cells 10 are arranged in the cell array 20. Each of switch lines SR0 through SRN−1 is coupled to the cells 10 in the corresponding row 0 through N−1. A power supply line and a ground line are coupled to each cell 10. The virtual power-supply method provides a power supply line 26 for each row. The power-supply voltage VDD is supplied to a power switch 30.

The power switch 30 changes the voltage VVDD (corresponding to the power-supply voltage Vsupply in FIG. 1) supplied to each power supply line 26 depending on the sleep period, the normal SRAM operation period, the store period, the shutdown period, and the restore period. For example, during the shutdown period, the power switch 30 sets the voltage supplied, as a power-supply voltage, to the cell 10 (the voltage of the power supply line−the voltage of the ground line) to approximately 0 V (or cut the voltage (brings VVDD close to 0 V)). During the sleep period, the power switch 30 sets the voltage supplied, as a power-supply voltage, to the cell 10 to less than those during the normal SRAM operation period, the store period, and the restore period.

The controller 25 causes the power switch 30 to change the voltage VVDD supplied to the power supply line 26 of each row. In addition, the controller 25 outputs switch signals to the switch lines SR0 through SRN-1. One of the switch lines SR0 through SRN-1 is selected by the switch signal.

As illustrated in FIG. 4B, the virtual ground method provides a ground line 27 for each row. The ground voltage VGND is supplied to the power switch 30. The power switch 30 changes, based on the instruction from the controller 25, the voltage VVGND supplied to each ground line 27 depending on the sleep period, the normal SRAM operation period, the store period, the shutdown period, and the restore period. Other configurations are the same as those of FIG. 4A, and the description thereof is thus omitted.

The supply voltage supplied to the cell 10 is equal to a voltage difference between the power supply line and the ground line. For example, in the virtual power-supply method illustrated in FIG. 4A, the supply voltage is approximately equal to (the voltage of the power supply line 26)−(the ground voltage). In the virtual ground method illustrated in FIG. 4B, the supply voltage is approximately equal to (the supply voltage)−(the voltage of the ground line 27). Thus, the same operation can be achieved by any of the virtual power-supply method or the virtual ground method. The following first through third embodiments and variations thereof will mainly describe the virtual power-supply method as an example, but may utilize the virtual ground method.

In SRAM circuits such as cash memories or the like, access for reading and writing is usually performed for each constituent row of the cell array 20. The row usually corresponds to a word line, and may be referred to as a line when viewed from a higher architecture. The number of cells 10 per row is, for example, a number of bits of a word (for example, 32 bits), which is a processing unit of a processor. Similarly, the store operation can be performed for each constituent row of the cell array 20 during the store operation of the NVPG.

However, the time necessary for single store operation is relatively long, approximately 10 nanoseconds or greater when the probability of spin injection magnetization reversal of the MTJ1 and the MTJ2 is considered. Thus, in the cell array 20 that performs the store operation, the majority of cells 10 other than the cell 10 that is to perform the store operation are put into a waiting state where the store operation is not performed but a voltage is supplied. Leakage current flows in the cells 10 in the waiting state. This increases static power. The increase in static power becomes prominent as the cell array 20 becomes larger.

Thus, the first embodiment, as illustrated in FIG. 4A and FIG. 4B, allows for voltage setting for each row or every small number of rows of the cell array 20. The voltage for the store operation is supplied to the row on which the store operation is being performed or a small number of rows including the row on which the store operation is being performed. In the remaining rows, the voltage supplied, as a power-supply voltage, to the cell 10 is made low to perform the sleep mode. This operation will be called an in-storing sleep operation. This operation reduces leakage current flowing in the cell 10 in the sleep mode compared to that in the cell 10 supplied with the voltage for the store operation. Therefore, the power consumption of the cell 10 is reduced.

Figure 5:
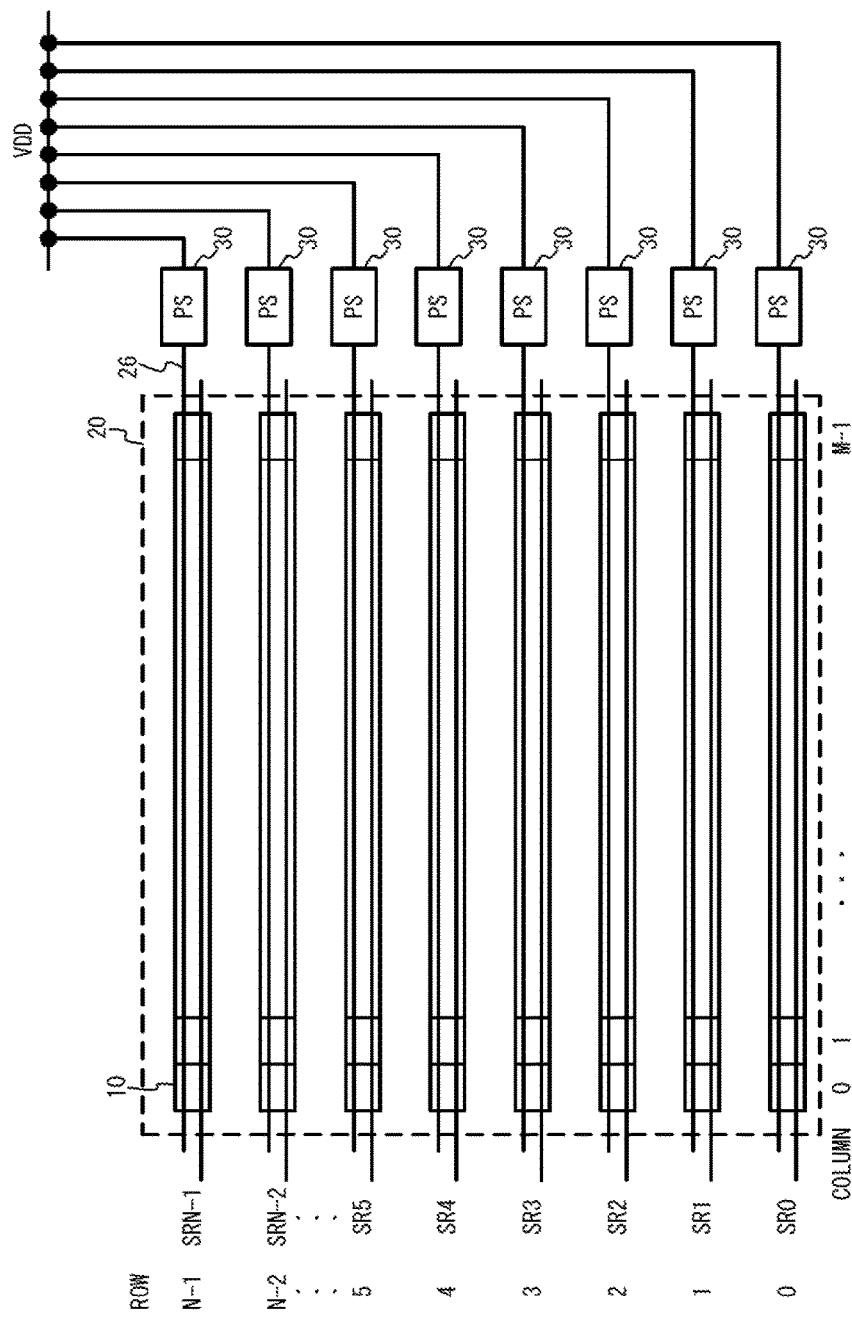
FIG. 5 is a block diagram illustrating a connection between a cell array and power switches in the first embodiment.

FIG. 5 is a block diagram illustrating a connection between the cell array and the power switches in the first embodiment. As illustrated in FIG. 5, the power switch 30 is provided in the power supply line 26 for each row 0 through N-1. This configuration allows the voltage of the power supply line 26 to be changed for each row 0 through N-1. In this example, each row 0 through N-1 corresponds to a bank.

Figure 6:
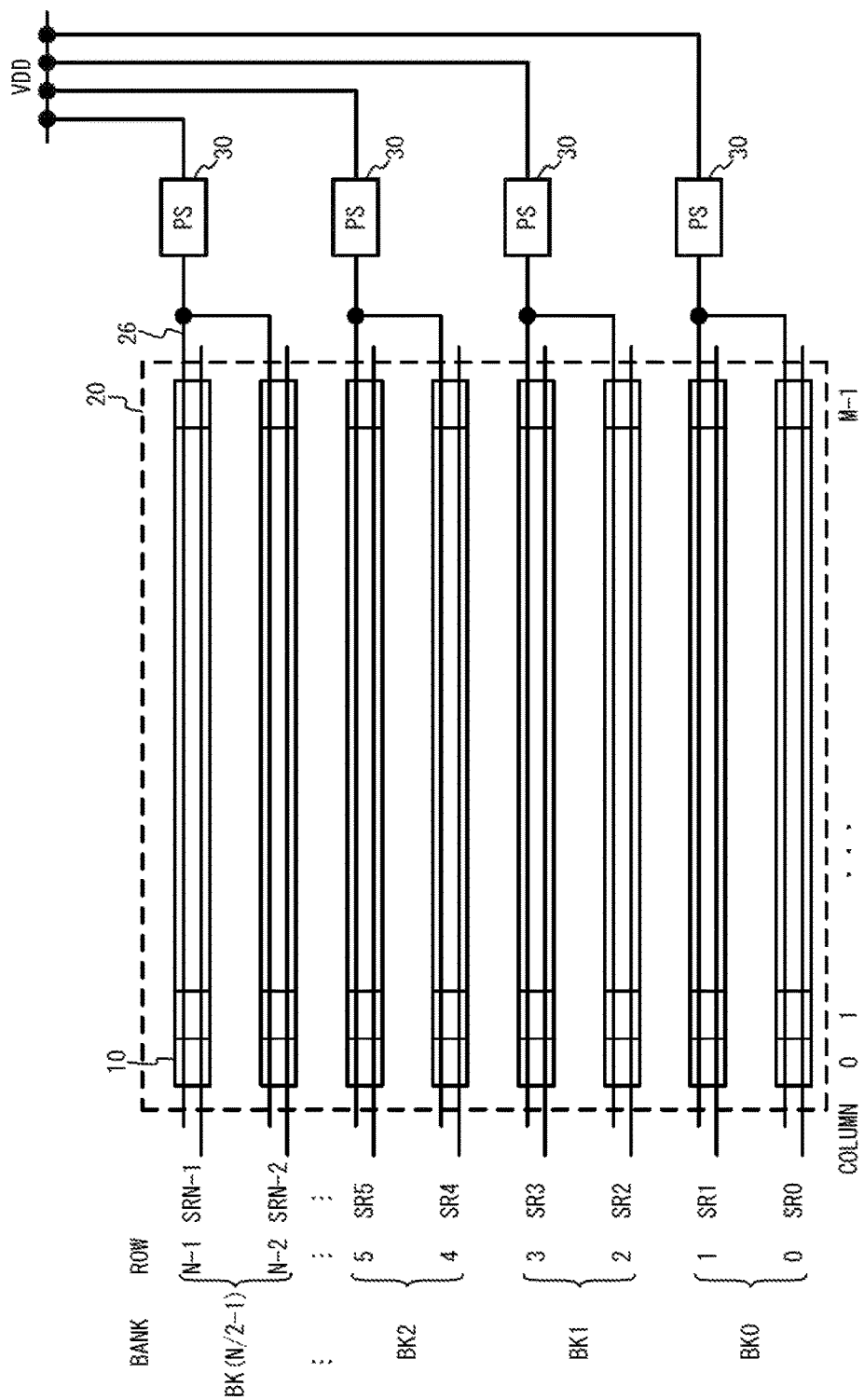
FIG. 6 is a block diagram illustrating another connection between the cell array and the power switches in the first embodiment.

FIG. 6 is a block diagram illustrating another connection between the cell array and the power switches in the first embodiment. As illustrated in FIG. 6, the power switch 30 is shared by the power supply lines 26 for the rows. The rows sharing the power switch 30 form bank BK0 through BK(N/2-1). For example, the bank BK0 includes rows 0 and 1. Accordingly, the voltages of the power supply lines 26 of rows 0 and 1 included in a single bank BK0 can be changed at once. This configuration can reduce the occupancy area of the power switches 30.

Figure 7:
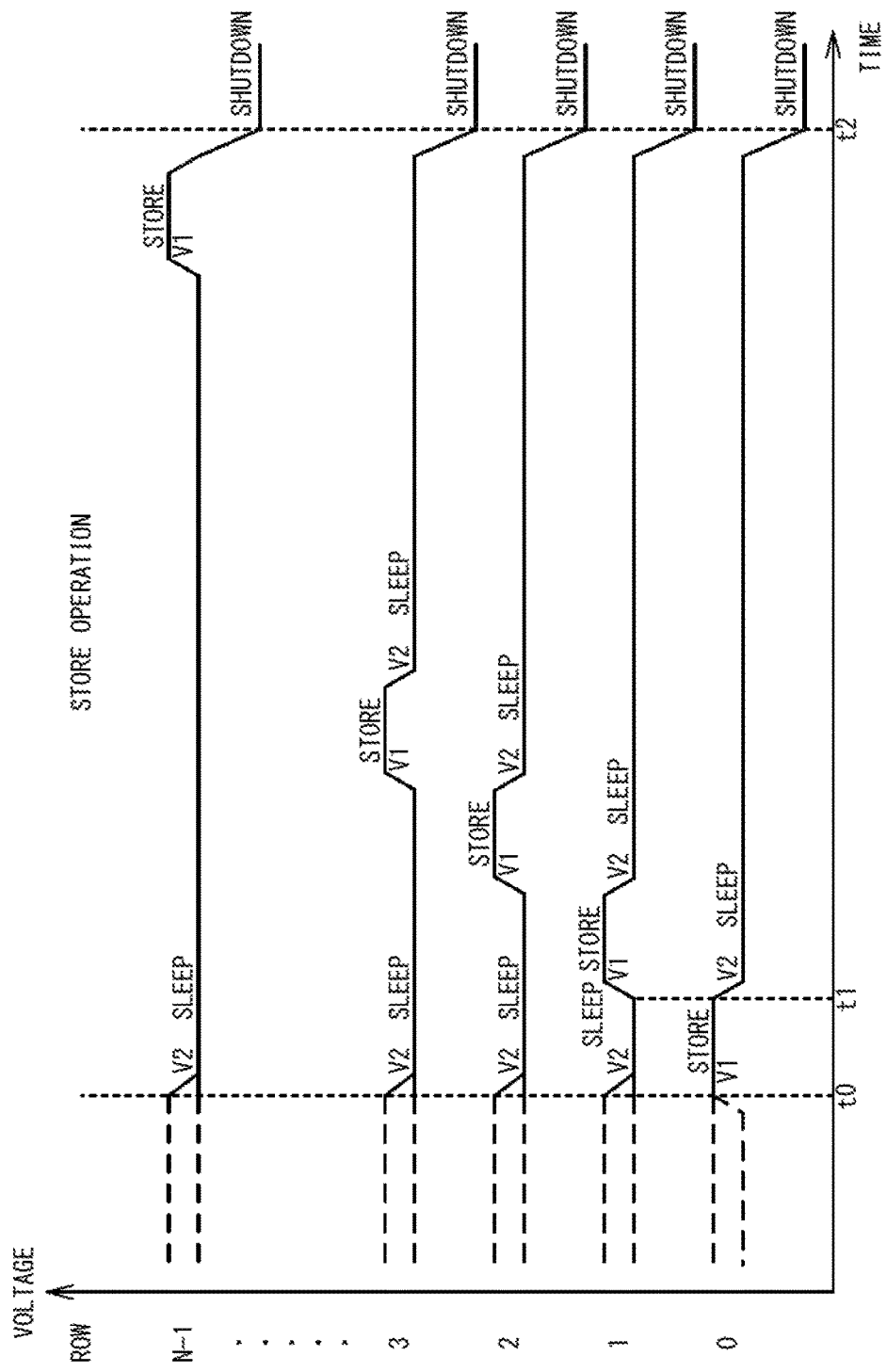
FIG. 7 is a timing chart illustrating a first example of a store operation in the first embodiment.

FIG. 7 is a timing chart illustrating a first operation of the store operation in the first embodiment. The example of FIG. 5 in which a single bank includes one row will be described. The vertical axis represents a supply voltage (the voltage of the power supply line−the voltage of the ground line) supplied to the cells 10 in each row. As illustrated in FIG. 7, the SRAM operation and the sleep operation of a typical 6T-SRAM are performed till time t0. At time t0, the store operation of a power domain including the cell array 20 is started. From time t0 to t1, the controller 25 causes the power switch 30 to supply the voltage V1 as a supply voltage to the cells 10 in row 0. The voltage V1 is, for example, VDD-VGND—(drop in voltage by the power switch 30). The controller 25 causes the power switches 30 to supply the voltage V2 for the sleep mode as a supply voltage to the cells 10 in remaining rows 1 through N-1. The voltage V2 is a voltage that is less than the voltage V1 but at which data in the bistable circuit 12 is not lost.

The controller 25 performs the store operation on row 0. At time t1, when the store operation on row 0 ends, the controller 25 causes the power switch 30 to supply the voltage V2 for the sleep mode as a supply voltage to the cells 10 in row 0. Thereafter, the controller 25 causes the power switch 30 to supply the voltage V1 as a supply voltage to the cells 10 in each of rows 1 through N-1 in turn. The controller 25 supplies the voltage V2 as a supply voltage to the cells 10 in rows other than the row to which the voltage V1 is supplied as a supply voltage. The controller 25 performs the store operation on the row to which the voltage V1 is supplied as a supply voltage. At time t2, when the store operation on all rows ends, the controller 25 causes the power switches 30 to shut down the supply voltage to the cells 10 in all rows 0 through N-1, thereby shutting down the cell array 20.

Figure 8:
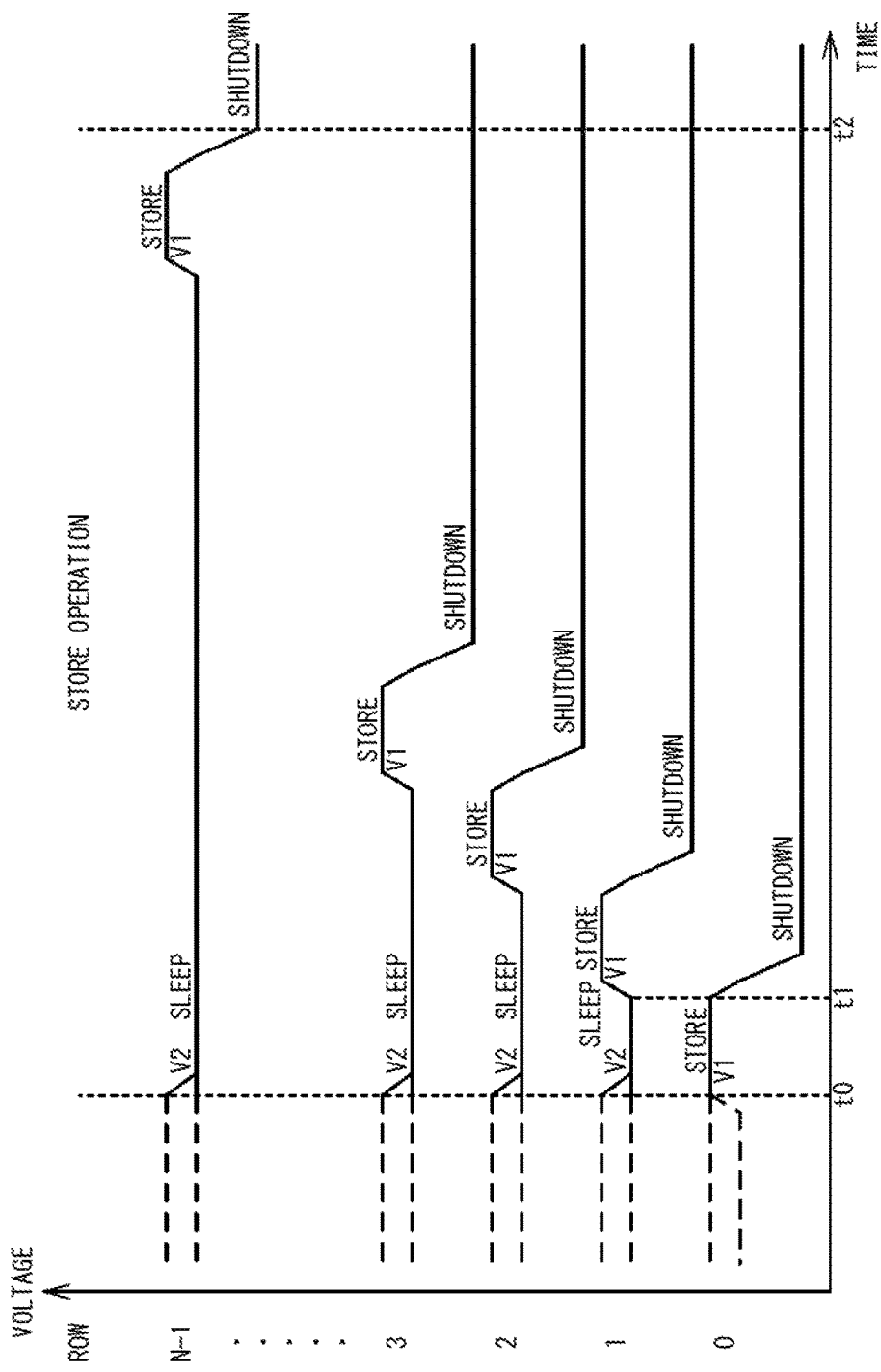
FIG. 8 is a timing chart illustrating a second example of the store operation in the first embodiment.

FIG. 8 is a timing chart illustrating a second example of the store operation in the first embodiment. As illustrated in FIG. 8, at time t1, when the store operation on row 0 ends, the controller 25 causes the power switch 30 to shut down the supply voltage to the cells 10 in row 0. Then, every time the storing operation ends in each row 1 through N-1, the controller 25 causes the power switch 30 to shut down the supply voltage supplied to the cells 10 in the row. Other operations are the same as those of FIG. 7, and the description thereof is thus omitted. The cell 10 before performing the store operation is put into the sleep mode to retain data. The cell 10 after its store operation is shut down because the cell 10 does not need to retain data. The example of FIG. 8 can reduce static power more than the example of FIG. 7.

Figure 9:
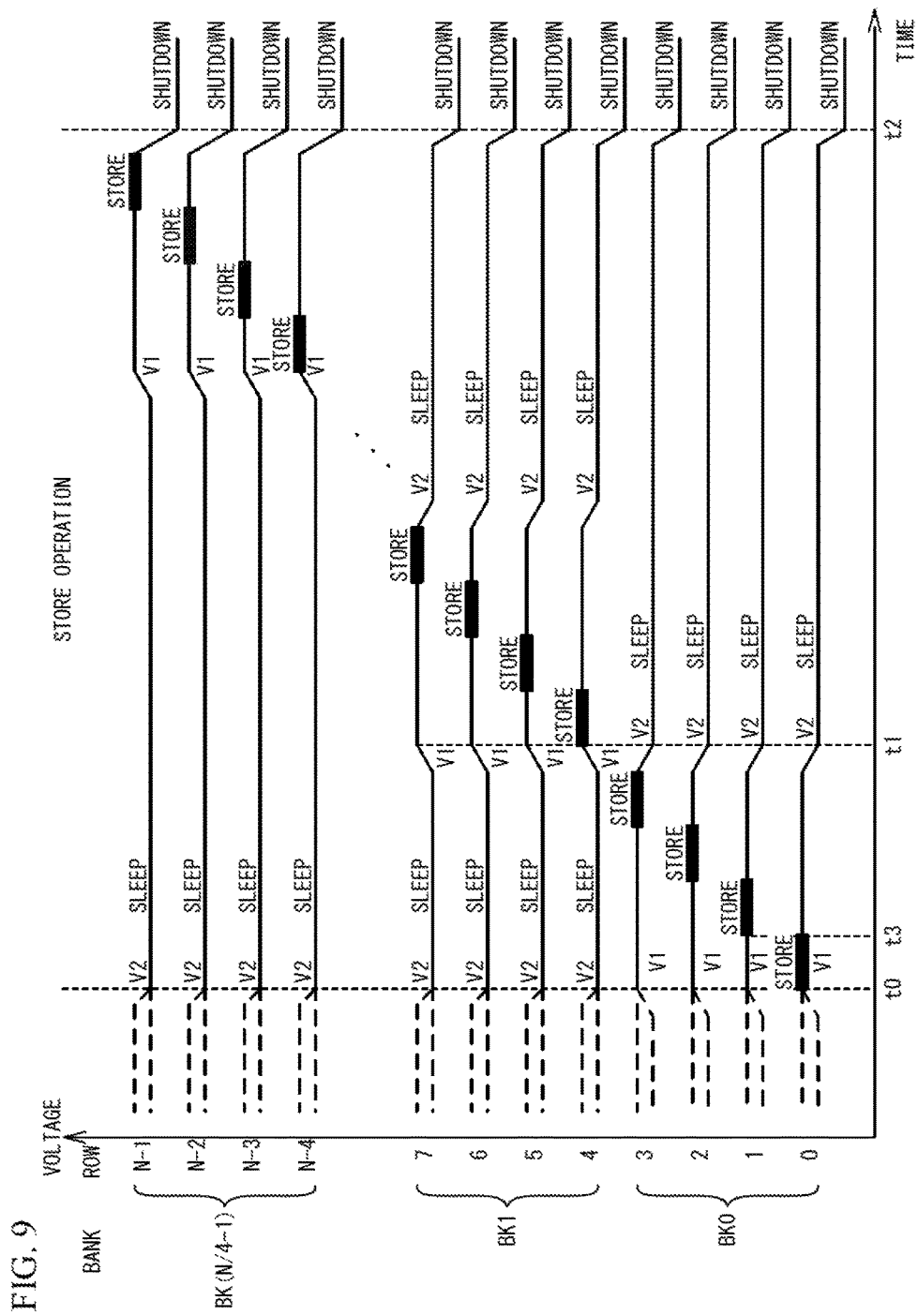
FIG. 9 is a timing chart illustrating a third example of the store operation in the first embodiment.

FIG. 9 is a timing chart illustrating a third example of the store operation in the first embodiment. This illustrates, for example, an example of FIG. 6 in which a single bank includes a plurality of rows. As illustrated in FIG. 9, rows 0 through N−1 are grouped into banks BK0 through BK(N/4−1). Each of the banks BK0 through BK(N/4−1) includes a plurality of rows (in this example, four rows). For example, the banks BK0, BK1, and BK(N/4−1) respectively include rows 0 through 3, rows 4 through 7, and rows N−4 through N−1. At time t0, the controller 25 causes the power switch 30 to supply the voltage V1 as a supply voltage to the cells 10 in rows 0 through 3 in the bank BK0. The controller 25 performs the store operation on row 0 (indicated by a bold line).

At time t3, when the store operation on row 0 ends, the controller 25 performs the store operation on row 1. Thereafter, the controller 25 performs the store operation on each of rows 2 and 3 in turn. At time t1, when the store operation on rows 0 through 3 ends, the controller 25 causes the power switch 30 to supply the voltage V2 as a supply voltage to the cells 10 in rows 0 through 3. The controller 25 performs the store operation in each bank BK1 through BK(N/4−1) in the same manner. Other operations are the same as those of FIG. 7, and the description thereof is thus omitted. The example of FIG. 9 can reduce the occupancy area of the power switches 30 more than the example of FIG. 7.

Figure 10:
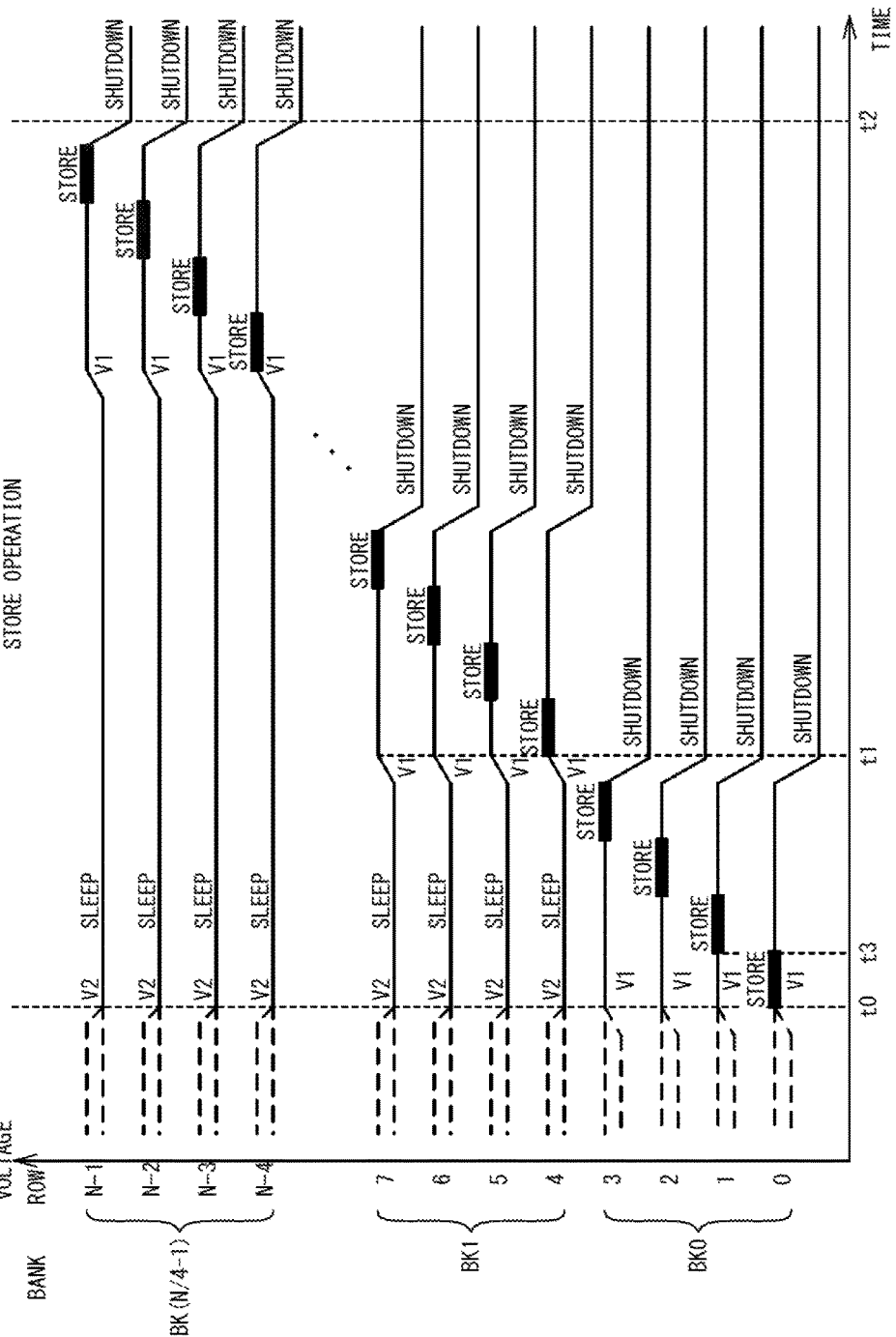
FIG. 10 is a timing chart illustrating a fourth example of the store operation in the first embodiment.

FIG. 10 is a timing chart illustrating a fourth example of the store operation in the first embodiment. At time t1, when the store operation on rows 0 through 3 ends, the controller 25 causes the power switch 30 to shut down the supply voltage to the cells 10 in the bank BK0. Thereafter, the controller 25 performs the store operation in each bank BK1 through BK(N/4−1) in the same manner. Other operations are the same as those of FIG. 9, and the description thereof is thus omitted. The example of FIG. 10 can reduce static power more than the example of FIG. 9.

Figure 11:
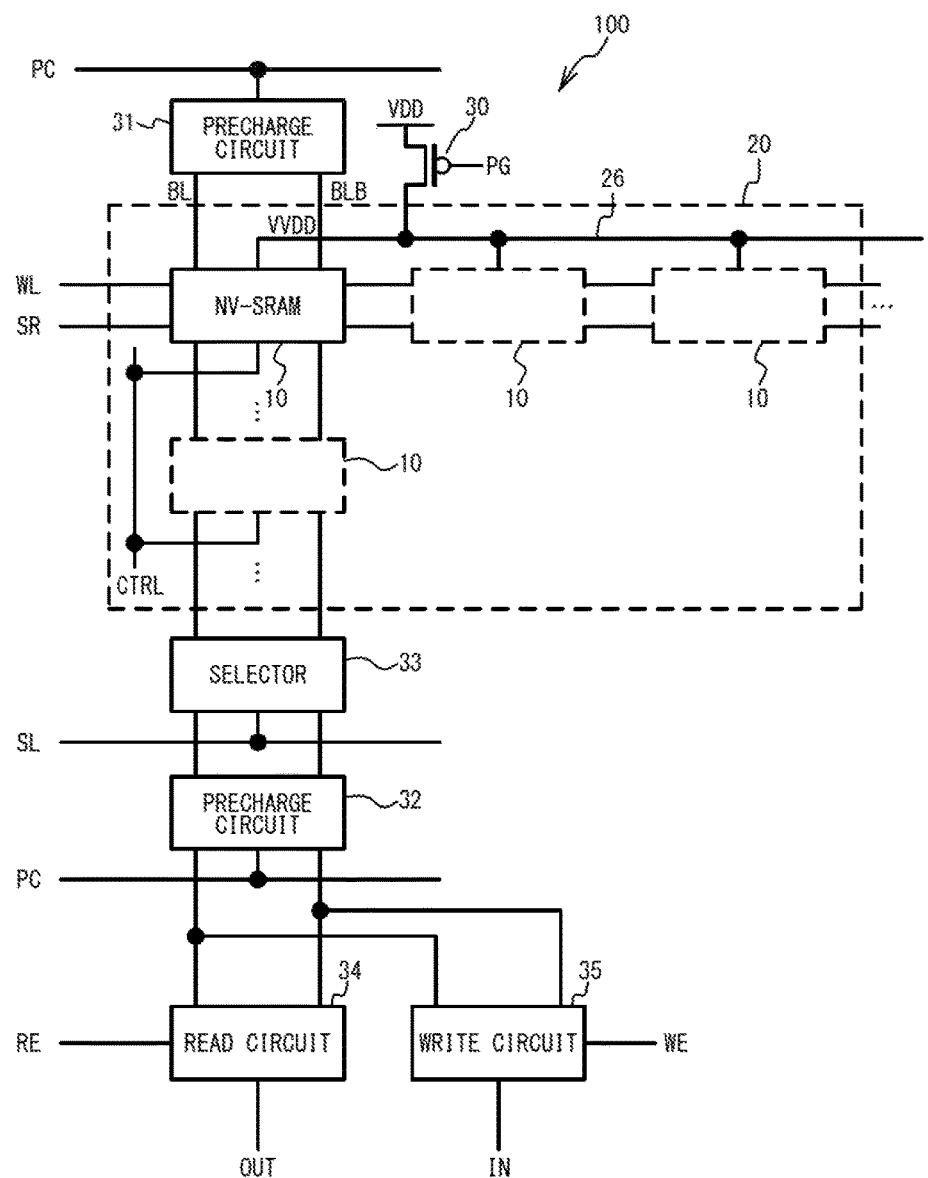
FIG. 11 is a block diagram illustrating a memory circuit used for a simulation in the first embodiment.

The first embodiment was simulated. FIG. 11 is a block diagram of a memory circuit that was used for the simulation in the first embodiment. As illustrated in FIG. 11, the memory circuit 100 includes the cell array 20, precharge circuits 31 and 32, a selector 33, a read circuit 34, and a write circuit 35. The cell array 20 includes pseudo cells 10 (indicated by dashed lines) of the NV-SRAM cell 10 to be operated. In the row direction, the word line WL, the switch line SR, and the power supply line 26 are located. In the column direction, bit lines BL and BLB and the control line CTRL are located.

The power supply line 26 is coupled to the power-supply voltage VDD via the power switch 30. The power switch 30 is, for example, a P-type MOSFET. The precharge circuits 31 and 32 respectively precharge the bit lines BL and BLB based on a precharge signal PC. The selector 33 selects one of the bit lines BL and BLB based on a select signal SL. The read circuit 34 reads output data OUT in the bistable circuit 12 of the selected cell 10 based on a read signal RE. The write circuit 35 writes input data IN to the bistable circuit 12 of the selected cell 10 based on a write signal WE.

Figure 12A:
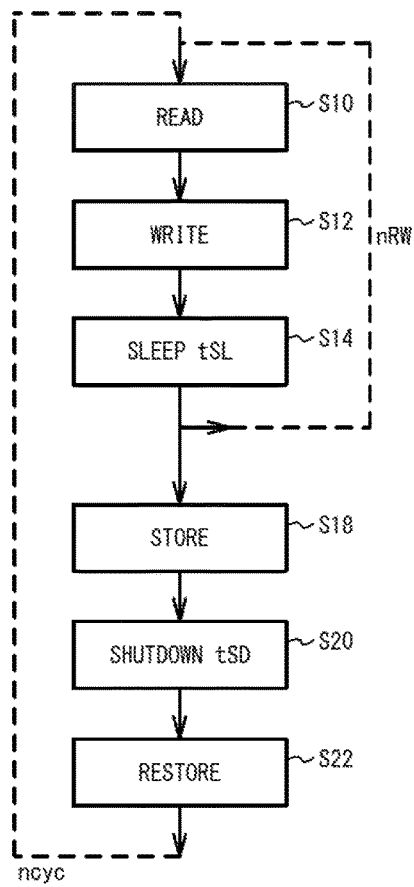
FIG. 12A and FIG. 12B illustrate sequences used for the simulation in the first embodiment.
Figure 12B:
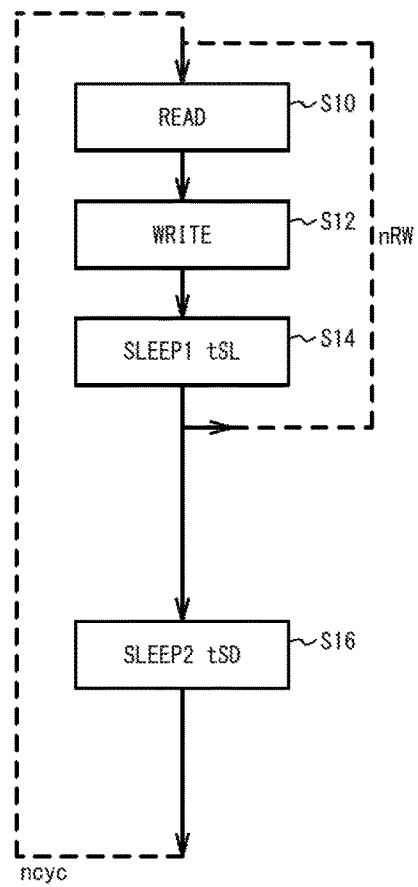

FIG. 12A and FIG. 12B illustrate sequences that were used for the simulation in the first embodiment. FIG. 12A is a sequence assuming an NV-SRAM, and FIG. 12B is a sequence assuming a 6T-SRAM. As illustrated in FIG. 12A, in the NV-SRAM, a read operation from the bistable circuit 12 (step S10), and a write operation to the bistable circuit 12 (step S12) are performed. These operations are the same as those of a typical 6T-SRAM. Thereafter, a short sleep operation for a period of tSL is performed (step S14). Steps S10 through S14 are repeated nRW times. Thereafter, the store operation is performed (step S18). During time period tSD, the cell 10 is put into the shutdown mode (step S20). Thereafter, a restore operation is performed (step S22). This step restores the power supply of the cell array 20. The operations from steps S10 to S22 are repeated ncyc times. The energy per cell 10 in the case of ncyc=1 is represented by Ecyc.

As illustrated in FIG. 12B, in the 6T-SRAM, after steps S10 through S14 are repeated nRW times, the sleep mode is set instead of the shutdown mode. That is, a sleep 2 operation is performed instead of steps S18 through S22 (step S16). As described previously, during the sleep period, the voltage supplied to the bistable circuit 12 is reduced to a voltage at which data in the bistable circuit 12 is not lost.

In the simulation, the power-supply voltage Vsupply during the normal SRAM operation period, the store period, and the restore period was set to 1.1 V. The Vsupply during the sleep period was set to 0.9 V and the voltage of the control line CTRL during the sleep period was set to 0.1 V. During the store period, the voltage of the switch line SR when a high level is stored was set to 0.7 V. The voltages of the control line CTRL and the switch line SR when a low level is stored were respectively set to 0.4 V and 0.7 V.

Figure 13A:
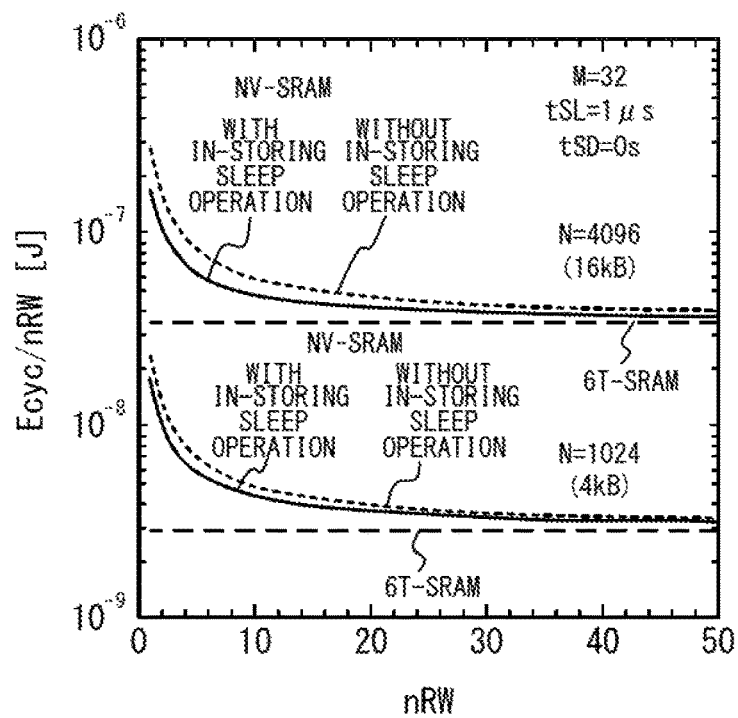
FIG. 13A is a graph of Ecyc versus nRW.
Figure 13B:
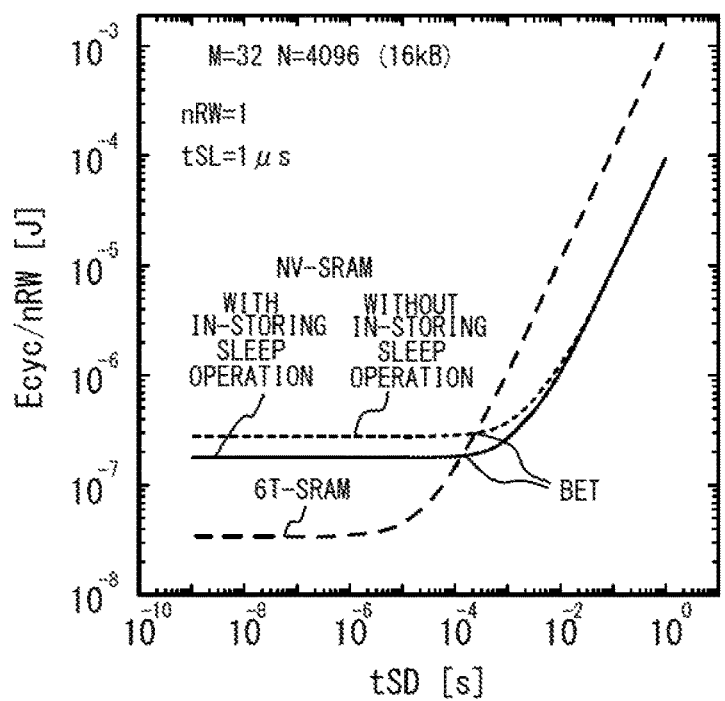
FIG. 13B is a graph of Ecyc versus tSD.

FIG. 13A is a graph of Ecyc versus nRW, and FIG. 13B is a graph of Ecyc versus tSD. Dashed lines indicate the 6T-SRAM. Dotted lines indicate a case where the voltage V1 is supplied to all the rows during the store operation in the NV-SRAM (a case without the in-storing sleep operation). Solid lines indicate a case where rows other than the row for storing are put into the sleep mode (supplied with the voltage V2) during the store operation (a case with the in-storing sleep operation).

In FIG. 13A, assume that time period tSD=0 s (second). Under this condition, since the shutdown period is zero, the increase in energy by the store operation and the restore operation can be examined. Column M is set to 32 bits. Assume that Row N=1024 (corresponding to 4 kB (Byte) of a cell array size) and N=4096 (corresponding to 16 kB of a cell array size). Assume that time period tSL=1 µs. The increase in Ecyc of the NV-SRAM with respect to that of the 6T-SRAM corresponds to the increase in energy by the store operation and the restore operation. The case with the in-storing sleep operation reduces energy increase more than the case without the in-storing sleep operation. Especially when nRW is small, the in-storing sleep operation has a profound effect.

As illustrated in FIG. 13B, nRW is fixed to one. Assume that N=4096. When the shutdown period tSD is short, the energy of the 6T-SRAM is less than that of the NV-SRAM. When the tSD becomes longer, the BET is given by the tSD at which the NV-SRAM and the 6T-SRAM cross. The case with in-storing sleep operation can reduce the BET to approximately half that of the case without the in-storing sleep operation.

Figure 14:
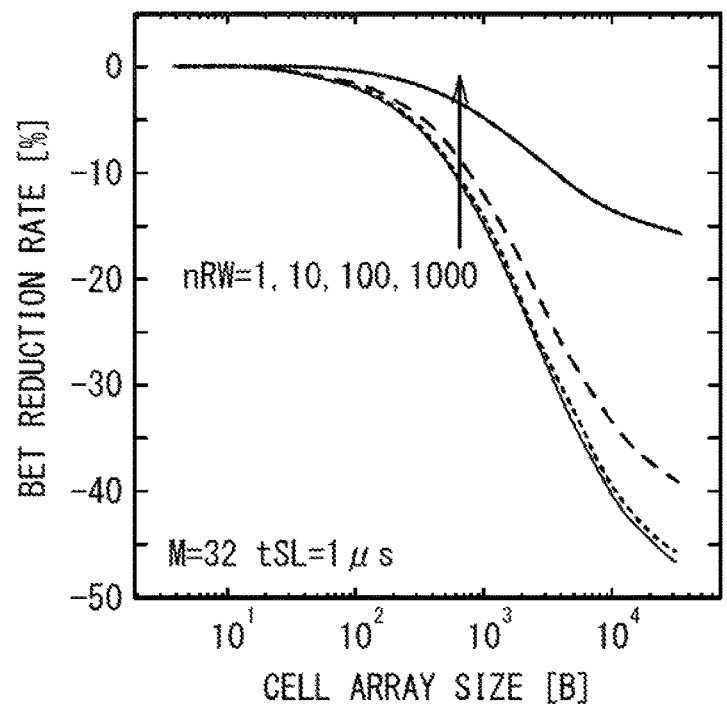
FIG. 14 is a graph of BET reduction rate versus cell array size in the first embodiment.

FIG. 14 illustrates BET reduction rate versus cell array size in the first embodiment. The BET reduction rate is a reduction rate of the BET in the case with the in-storing sleep operation to the BET in the case without the in-storing sleep operation, and its negatively larger value indicates the more reduction of the BET by the in-storing sleep operation. The nRW is 1, 10, 100, and 1000 in this order in the arrow direction of FIG. 14. M is 32 bits, and tSL is 1 µs. As illustrated in FIG. 14, as the cell array size increases, BET reduction rate increases. As the nRW decreases, the BET reduction rate increases. Even when the cell array size is a practical size such as several kilobytes, the execution of the in-storing sleep operation allows for the reduction in static power during the store operation, and therefore, the BET can be effectively reduced.

In the first embodiment, as illustrated in FIG. 7 through FIG. 10, the controller 25 controls the store operation on rows 0 through N−1 in sequence. The controller 25 sets the supply voltage supplied to a first bank including a row on which the store operation is performed among a plurality of banks each including one or more rows to the voltage V1 (a first voltage). The controller 25 sets the supply voltage supplied to the cells 10 in other than the first bank among the plurality of banks to the voltage V2 (a second voltage). As described above, since the voltage V2 less than the voltage V1 is supplied to banks other than the bank including the row on which the store operation is performed, static power during the store operation can be reduced, and therefore, the BET can be effectively reduced.

Each of the banks formed by grouping the plurality of rows 0 through N−1 may include only a single row as illustrated in FIG. 7 and FIG. 8, or may include a plurality of rows as illustrated in FIG. 9 and FIG. 10. A plurality of rows included in each bank are preferably consecutive rows.

As illustrated in FIG. 7 and FIG. 9, the controller 25 may set the supply voltage supplied to the cells 10 in the bank the store operation on the rows of which has ended to the voltage V2. As illustrated in FIG. 8 and FIG. 10, the controller 25 may shut down the supply voltage supplied to the cells 10 in the bank the store operation on the rows of which has ended. This control can further reduce static power. The supply voltage may be shut down by setting the supply voltage (the voltage between the power supply line and the connection line) to 0 V, or by cutting the supply voltage.

The first embodiment has described, as the cell 10, an NV-SRAM cell in which the ferromagnetic tunnel junction elements MTJ1 and MTJ2 are respectively connected between the nodes Q and QB in the bistable circuit 12 and the control line CTRL and the MOSFETs m7 and m8 (switches) are respectively connected in parallel to the MTJ1 and MTJ2. The cell 10 may be any non-volatile bistable circuit including the bistable circuit 12 and a non-volatile element.

As illustrated in FIG. 5 and FIG. 6, the switch for the cells 10 in the same row is connected to the same switch line SR. This configuration allows the store operation to be performed for each row.

An exemplary case where the MTJ1 and the MTJ2 are respectively coupled to the nodes Q and QB has been described, but it is only required that one of the MTJ1 and the MTJ2 is coupled to the node Q or QB. The MTJ has been described as an example of a non-volatile element, but the non-volatile element may be a giant magnetoresistance (GMR) element, a variable resistive element used for a Resistance Random Access Memory (ReRAM) or a phase-change element used for a Phase change RAM (PRAM).

Second Embodiment

A second embodiment is exemplary power switch architecture by time-sharing store control. The second embodiment can reduce the size of the power switch by applying time-sharing to the store operation for cells coupled to the same power switch.

Figure 15A:
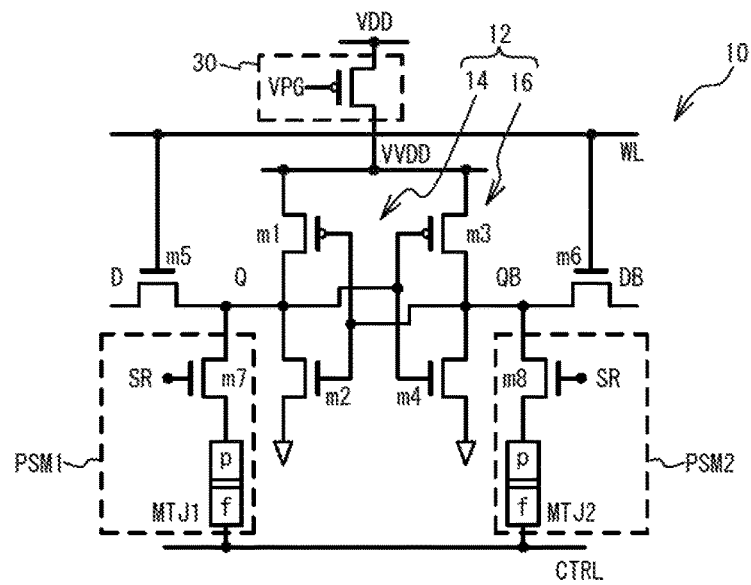
FIG. 15A and FIG. 15B are circuit diagrams illustrating a cell and a power switch in a second embodiment.
Figure 15B:
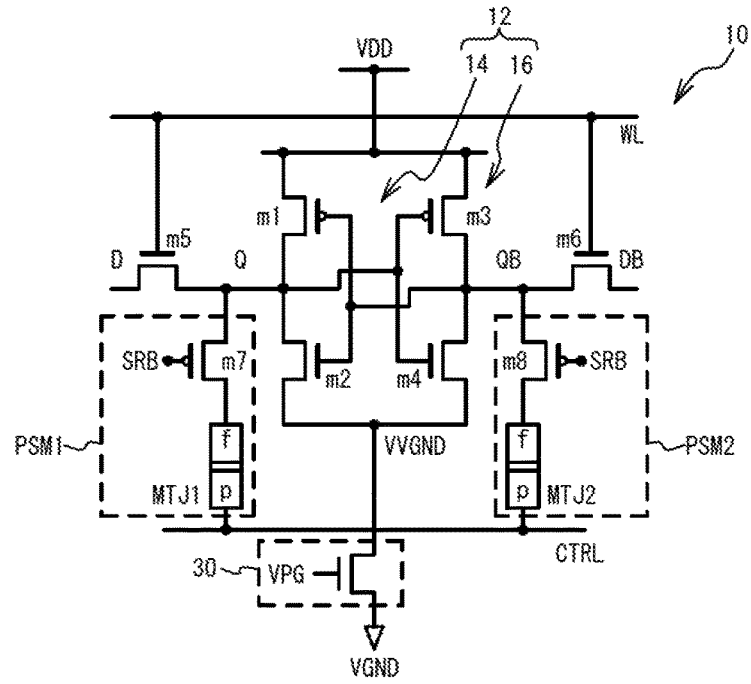

FIG. 15A and FIG. 15B are circuit diagrams of a cell and a power switch in the second embodiment. FIG. 15A illustrates an example of the virtual power-supply method, and FIG. 15B illustrates an example of the virtual ground method. As illustrated in FIG. 15A, in the virtual power-supply method, the power switch 30 is connected between the bistable circuit 12 of the cell 10 and the power source. The power switch 30 is a p-type MOSFET. Not the supply voltage VDD but the virtual power-supply voltage VVDD (pseudo VDD), which is a reduced voltage by the power switch 30, is supplied to the bistable circuit 12. As illustrated in FIG. 15B, in the virtual ground method, the power switch 30 is connected between the bistable circuit 12 of the cell 10 and a ground. The power switch 30 is an n-type MOSFET. The MOSFETs m7 and m8 are p-type MOSFETs, and SRB, which is a complementary signal of the switch line SR, is input to the gates of the MOSFETs m7 and m8. Not the ground voltage VGND but the virtual ground voltage VVGND (pseudo VGND), which is a reduced (increased) voltage by the power switch 30, is supplied to the bistable circuit 12. Hereinafter, the virtual power-supply method will be mainly described, but the embodiment is applicable to the virtual ground method.

In the NV-SRAM cell 10, during the normal SRAM operation, the MOSFETs m7 and m8 are OFF, and the MTJ1 and the MTJ2 are electrically separated from the bistable circuit 12. Thus, the NV-SRAM cell 10 can be operated with the power switch 30 having the same size as that of a typical 6T-SRAM cell. However, when data in the bistable circuit 12 is stored in the MTJ1 and the MTJ2 during the store operation, the nodes Q and QB of the bistable circuit 12 are coupled to ground via the MTJ1 or the MTJ2 with a low resistance. Accordingly, since the impedance of the cell 10 greatly decreases, to keep the virtual power-supply voltage VVDD high (or to keep the virtual ground voltage VVGND low), a sufficiently large power switch needs to be used. For the cell 10 to stably hold data during the store operation, it is preferable to ensure the supply voltage (VVDD-VGND) equal to or greater than 95% of (supply voltage VDD-ground voltage VGND).

Figure 16:
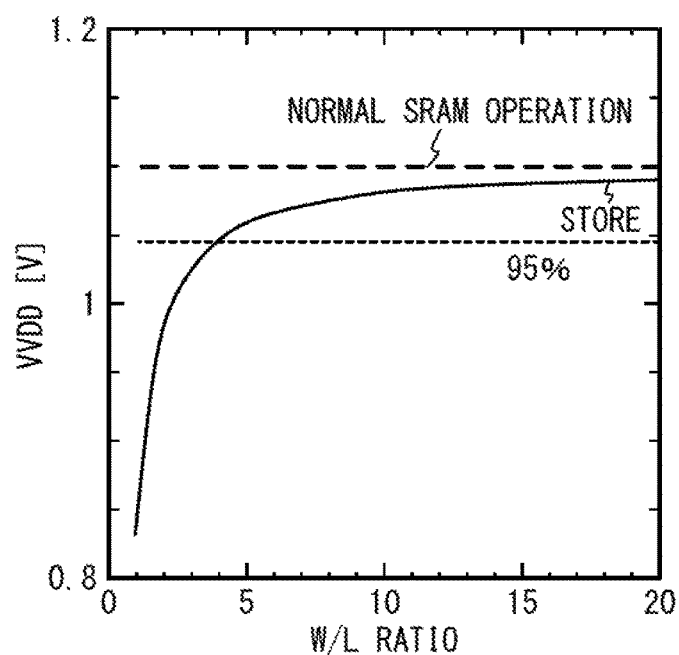
FIG. 16 is a graph of virtual power-supply voltage VVDD versus the channel width W of the power switch.

FIG. 16 is a graph of the virtual power-supply voltage VVDD versus the channel width W of the power switch. The channel width W is divided by the channel width L, being represented by W/L ratio. The solid line indicates the VVDD during the store operation in the NV-SRAM, and the dashed line indicates the VVDD during the normal SRAM operation in the NV-SRAM. During the normal SRAM operation, the VVDD does not decrease. During the store operation, since current flows in the MTJ, the VVDD decreases. To make the VVDD 95% of the VDD (indicated by a dotted line). W/L needs to be four or greater. As described above, to reduce the decrease in VVDD, the power switch 30 needs to be larger.

As illustrated in FIG. 2, when the NV-SRAM cells 10 are arranged in a matrix fashion, similar to the read and write operations of the 6T-SRAM, causing the cells 10 connected to a single word line WL to simultaneously perform the store operation is well-suited for the configuration of the circuit. A plurality of cells 10 having the same word line WL of the cell array 20 are called a row. In the NV-SRAM, since the impedance of the cell 10 decreases, the power switch 30 of which the size per cell is large is used. Thus, when a single power switch 30 is allocated to one row, a very large (or many) power switch 30 needs to be used. Therefore, the occupancy area of the power switches 30 raises a big problem in the layout.

As illustrated in FIG. 5 in the first embodiment, when the power switch 30 is provided for each row, the store operation can be simultaneously performed in the row direction. Assume that the size per cell of the transistor used as the power switch 30 is a channel width W0. Assume that the number of cells in the row direction of the cell array 20 is M, and the number of cells in the column direction is N. In this case, the channel width of the transistors for the power switches 30 used in the N×M cell array 20 is W0×M×N, fairly large. The total channel width W0×M×N is achieved by, for example, a plurality of power switches 30 illustrated in FIG. 5.

As illustrated in FIG. 6, a plurality of rows included in a bank share the power switch 30, and the supply voltage is simultaneously controlled for the rows in the same bank. In the store operation, each row in the bank is selected by the switch line SR. Thus, the number of cells driven at a time in the store operation is only the number of cells in one row. Therefore, the size (or the number) of the power switch 30 can be reduced. The number of rows that share the power switch 30 (the number of rows included in a single bank) is represented by nbk. In this case, the channel width of the transistors of the power switches 30 can be reduced to W0×M×N/nbk. However, when nbk is made too large, static power during the store operation becomes too large. Thus, nbk cannot be made too large. Normally, the occupancy area of the power switches 30 is preferably 10% to 20% of the whole. Since the W0 is large and nbk cannot be made large, it is not easy to make the occupancy area of the power switches 30 10% to 20% of the whole of the memory circuit.

Figure 17:
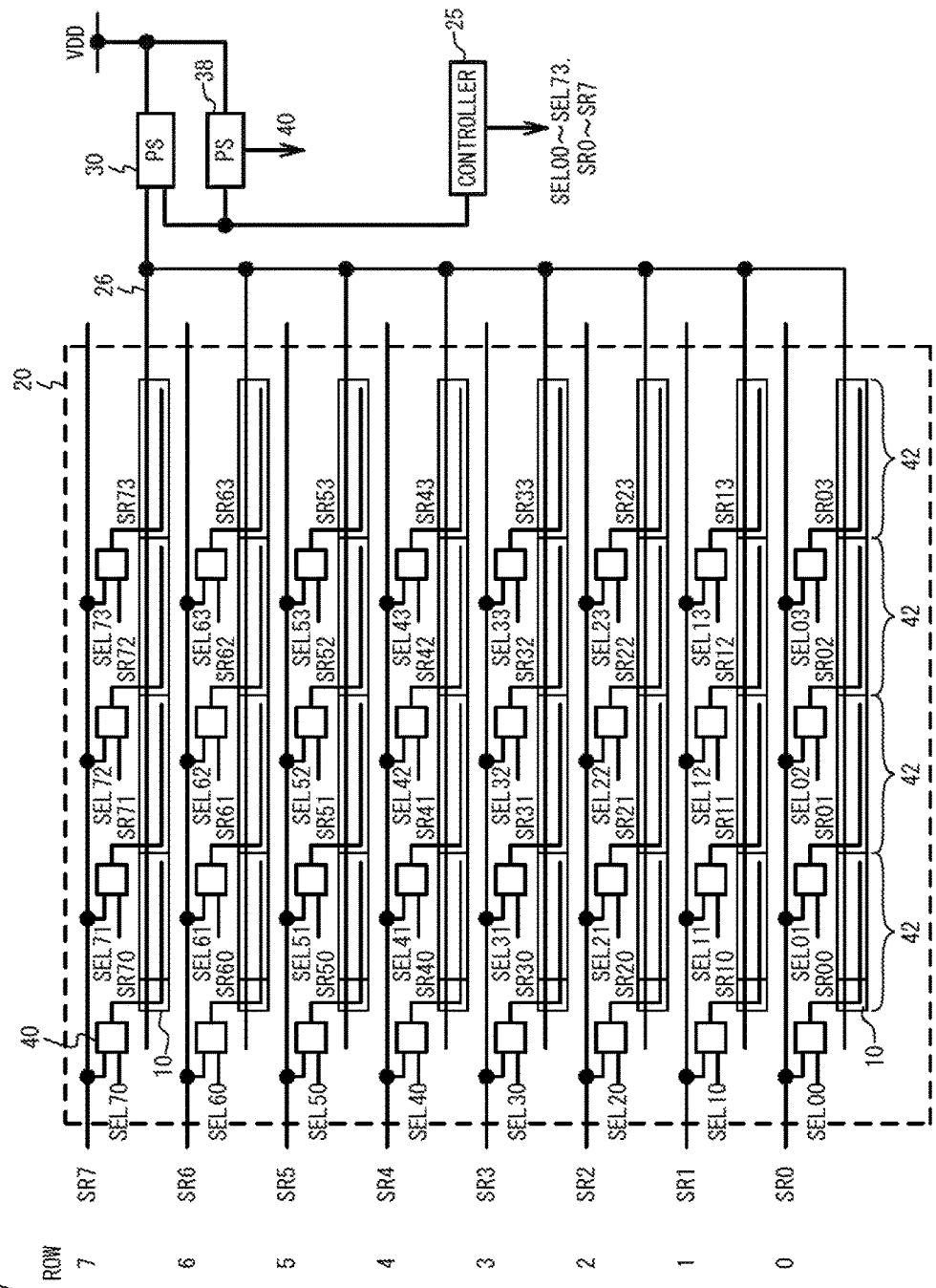
FIG. 17 is a block diagram illustrating a part of a cell array in the second embodiment.

FIG. 17 is a block diagram illustrating a part of a cell array in the second embodiment. FIG. 17 illustrates rows 0 through 7 in the cell array 20. As illustrated in FIG. 17, the power supply lines 26 for a plurality (nbk: eight in FIG. 17) of rows 0 through 7 share a single power switch 30. One power switch 30 may be shared by all the rows of the cell array 20, or by one or some rows of the cell array 20. The power switch 30 may be composed of more than one transistor. The rows are divided into a plurality (nSR: four in FIG. 17) of blocks 42. For example, the bit number of the row is 32 bits, and the bit number of the block 42 is 8 bits. The switch lines SR0 through SR7 are divided for each divided block 42. For example, in row 0, the switch line SR0 is divided into sub-switch lines SR00 through SR03. Between the switch line SR0 and the sub-switch lines SR00 through SR03, selection circuits 40 are located. The power switch 38 supplies a power-supply voltage to the selection circuits 40. The controller 25 controls the power switches 30 and 38. The controller 25 outputs select signals SEL00 through SEL73 to the selection circuits 40 and outputs switch signals to the switch lines SR0 through SR7.

Figure 18A:
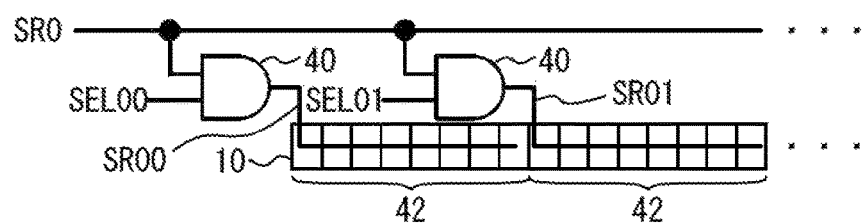
FIG. 18A and FIG. 18B are block diagrams illustrating examples of a selection circuit in the second embodiment.
Figure 18B:
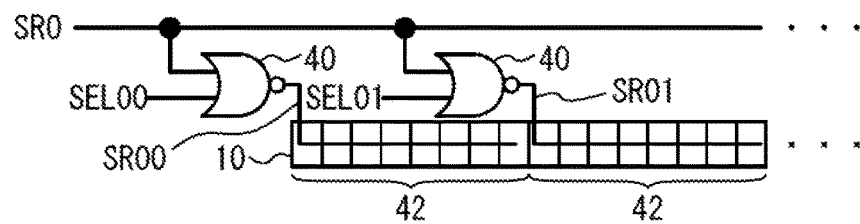

FIG. 18A and FIG. 18B are block diagrams illustrating examples of the selection circuit in the second embodiment. As illustrated in FIG. 18A, the selection circuit 40 is an AND circuit that performs an AND operation of the switch line SR0 and the select signal SEL00. The selection circuit 40 sets the sub-switch line SR00 at a high level, for example, when the switch line SR0 is at a high level and the select signal SEL00 is at a high level. In other cases, the sub-switch line SR00 is set at a low level.

As illustrated in FIG. 18B, the selection circuit 40 is an NOR circuit that performs an NOR operation of the switch line SR0 and the select signal SEL00. The selection circuit 40 sets the sub-switch line SR00 at a high level, for example, when the switch line SR0 is at a low level and the select signal SEL00 is at a low level. In other cases, the sub-switch line SR00 is set at a low level.

The selection circuit 40 can be appropriately designed depending on the conductive type of the MOSFETs m7 and m8, signal levels of the switch lines SR0 through SR7, and levels of the select signals SEL00 through SEL73.

Figure 19:
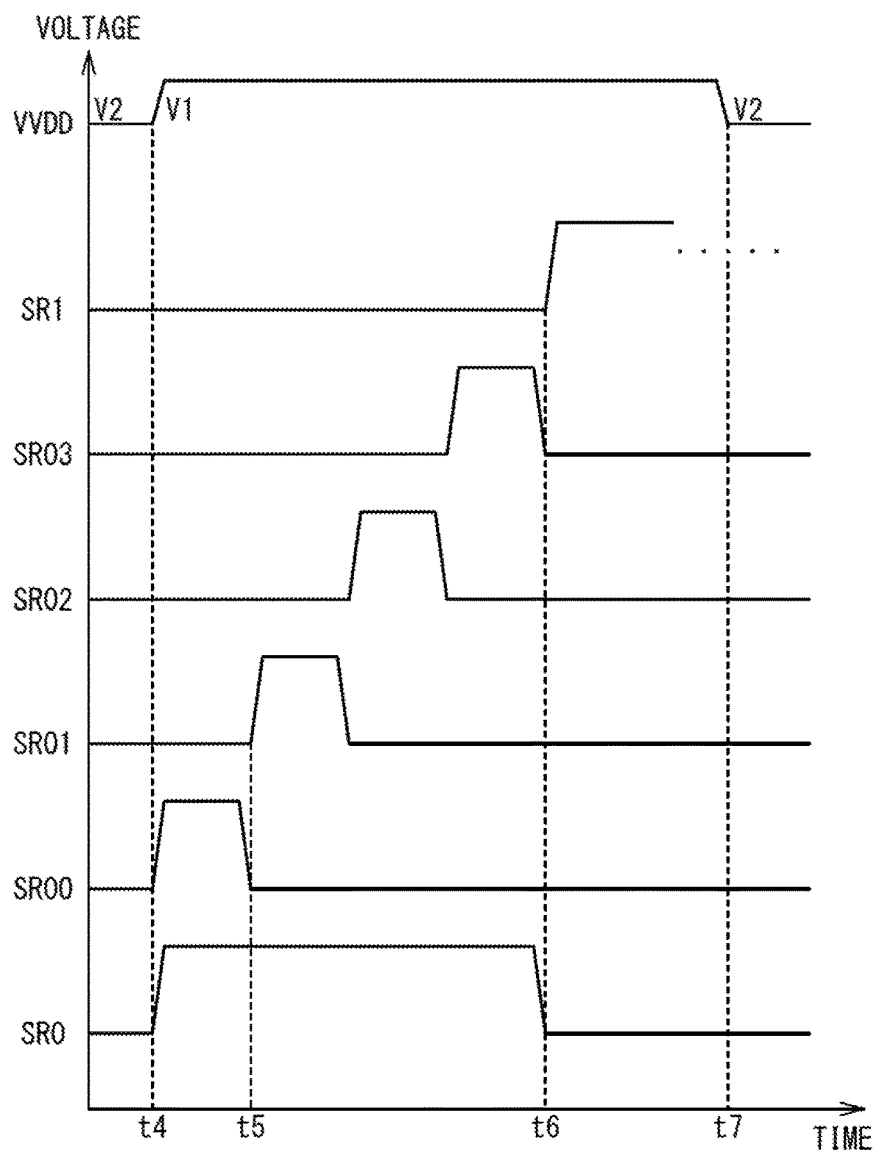
FIG. 19 is a timing chart of switch lines, sub-switch lines, and the virtual power-supply voltage VVDD in the second embodiment.

FIG. 19 is a timing chart of the switch lines, the sub-switch lines, and the virtual power-supply voltage VVDD in the second embodiment. An example using the AND circuit illustrated in FIG. 18A as the selection circuit 40 will be described. As illustrated in FIG. 19, at time t4, the controller 25 causes the power switch 30 to change the virtual power-supply voltage VVDD from the voltage V2 to the voltage V1. The voltage V2 is, for example, a voltage for the sleep mode, and the voltage V1 is a voltage for the store operation. The controller 25 sets the switch line SR0 and the select signal SEL00 corresponding to the sub-switch line SR00 at a high level, and sets the select signals SEL01 through SEL03 respectively corresponding to other sub-switch lines SR01 through SR03 at a low level. This control sets the sub-switch line SR00 at a high level and the sub-switch lines SR01 through SR03 at a low level. Accordingly, the MOSFETs m7 and m8 of the cells 10 coupled to the sub-switch line SR00 are turned ON. Since the MOSFETs m7 and m8 of the cells 10 coupled to the sub-switch lines SR01 through SR03 are OFF, current does not flow in the MTJ1 or the MTJ2 coupled to these sub-switch lines. As described above, current flows only in the MTJ1s and the MTJ2s of the cells 10 in one block 42, and current does not flow in the MTJ1s or the MTJ2s of the cells 10 in other blocks 42.

When the store operation of the cells 10 coupled to the sub-switch line SR00 ends, at time t5, the controller 25 sets only the select signal SEL01 of the sub-switch line SR01 at a high level. The store operation of the sub-switch line SR01 is performed. Thereafter, the controller 25 performs the store operation for each of the sub-switch lines SR02 through SR03 in turn. When the store operation for the bank BK0 ends, at time t6, the controller 25 sets the switch line SR0 at a low level and the switch line SR1 at a high level. Thereafter, the controller 25 performs the store operation on each row from row 1 in turn. When the store operation for the bank (rows 0 through 7) coupled to the power switch 30 ends, at time t7, the controller 25 sets the virtual power-supply voltage VVDD to the voltage V2. The controller 25 may shut down the virtual power-supply voltage VVDD at time t7.

Figure 20:
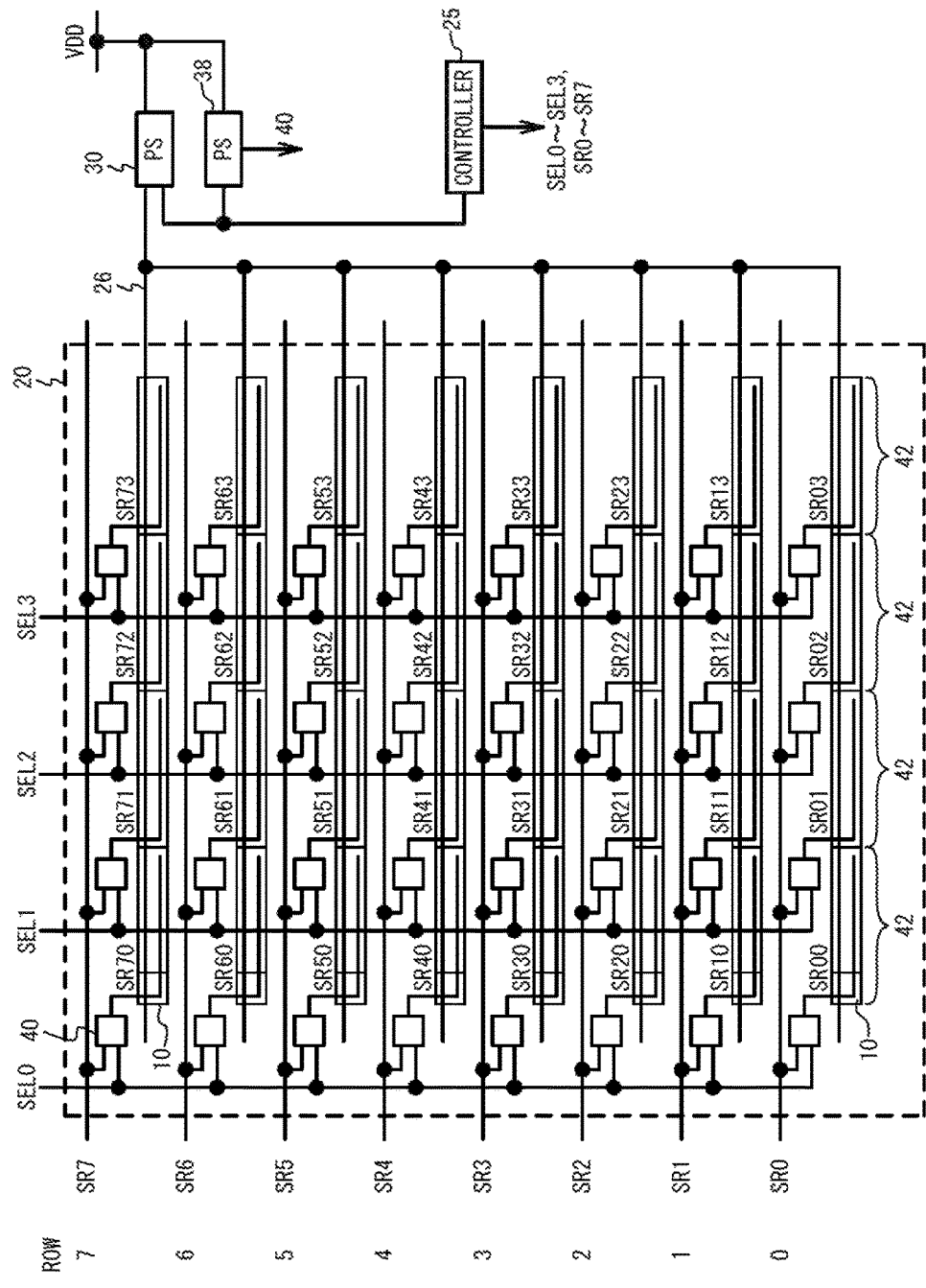
FIG. 20 is a block diagram of a memory circuit in accordance with a variation of the second embodiment.

FIG. 20 is a block diagram of a memory circuit in accordance with a variation of the second embodiment. As illustrated in FIG. 20, a wiring line for providing the same select signal for the same column is provided. For example, a select signal SEL0 is provided instead of the select signals SEL00, SEL00. SEL20, SEL30, SEL40, SEL50, SEL60, and SEL70 (see FIG. 17). Similarly, select signals SEL1 through SEL3 are commonly supplied in the column direction. As described above, the columns are selected by the select signals SEL0 through SEL3, and the rows are selected by the switch lines SR0 through SR7. This configuration allows for the selection of the sub-switch line to be activated by the select signal and the switch line. Other configurations are the same as those of FIG. 17 of the second embodiment, and thus the description is omitted.

As illustrated in FIG. 17 and FIG. 20, each of the switch lines SR0 through SR7 used for signals for performing the store operation of the NV-SRAM is divided into more than one line. This configuration can reduce the number of cells that simultaneously perform the store operation in a single row. Accordingly, the size (or the number of) the power switch 30 can be reduced (or decreased). For example, when the dividing number of rows is represented by nSR, the total channel width of the power switches 30 is reduced to W0×(M/nSR)×(N/nbk). In practice, this size is achieved by a plurality of transistors. However, this method needs the addition of the selection circuits 40 for performing the separate control of the switch line SR. Thus, the addition of the transistor of the selection circuit 40 needs to be taken into consideration. The appropriate selection of nbk, nSR, and the selection circuit 40 can greatly reduce the size (the number) of the power switch 30.

Figure 21A:
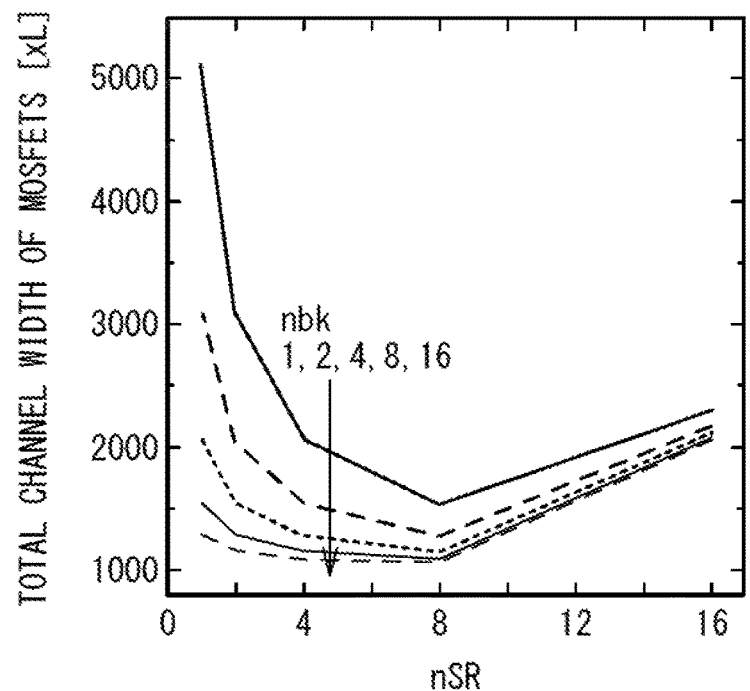
FIG. 21A is a graph of the total channel width of MOSFETs versus nSR in the second embodiment.

FIG. 21A is a graph of the total channel width of MOSFETs versus nSR in the second embodiment. In FIG. 21A, the total channel width is a value calculated by dividing the total channel width WT of the MOSFETs in the selection circuits 40 and the power switches 30 and 38 by the channel width L when the selection circuit 40 is composed of an NOR circuit. The channel width of the power switch 30 that supplies a voltage to the cell 10 is represented by W0, the channel width of one MOSFET in the selection circuit 40 is represented by W1, and the channel width of the power switch 38 that supplies a voltage to the selection circuit 40 is represented by W2. In this case, the total channel width $WT=W0 \times (M/nSR) \times (N/nbk) + W1 \times 4 \times nSR \times N + W2$. The width W0 was set to $W0=4L$ so that the virtual power-supply voltage VVDD is 95% of the supply voltage VDD based on FIG. 16. To achieve sufficient driving capability, the width W1 per cell was set to L/4, that is, $W1=(L/4) \times (M/nSR)$. However, when the W1 is equal to or less than 1L, the W1 was set to $W1=1 \times L$. Since the selection circuits 40 do not simultaneously operate, the number of the power switches 38 coupled to the selection circuits 40 was assumed to be one in total. The channel width W2 of the power switch 38 was set to $W2=2 \times W1$. M was assumed to be 32 bits, N was assumed to be 32 rows, and nbk was assumed to be 1, 2, 4, 8, and 16. The total channel width WT can be considered the number of MOSFETs, for example, when the channel width is equal to the channel width L.

As illustrated in FIG. 21A, as nbk increases and nSR decreases, the channel width decreases. At any nbk, the total channel width has a minimum value when nSR=8. Thus, in this example, it is optimal to divide one row into eight blocks 42.

Figure 21B:
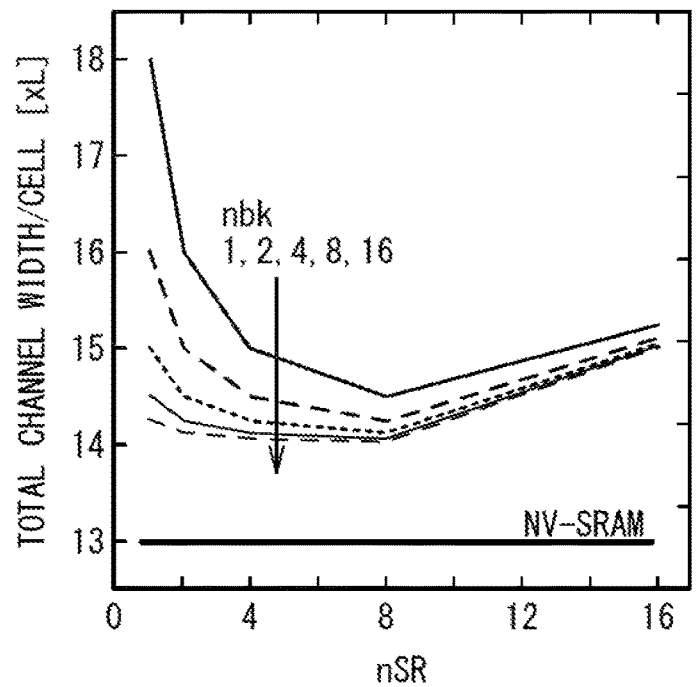
FIG. 21B is a graph of the total channel width/cell versus nSR in the second embodiment.

FIG. 21B is a graph of the total channel width/cell versus nSR in the second embodiment. In FIG. 21B, the total channel width/cell is a value representing the total channel width of the transistors included in the NV-SRAM cell 10, the power switches 30 and 38, and the NOR-type selection circuits 40 per cell. The total channel width/cell can be considered the number of MOSFETs per cell 10, for example, when the channel width of one MOSFET is assumed to be equal to the channel width L. The straight line at the total channel width/cell=13 in FIG. 21B indicates the channel width of the NV-SRAM cell 10 alone without a peripheral circuit/cell.

As illustrated in FIG. 21B, when nSR=8, the total channel width/cell is approximately 14 when nbk is 1 through 16. When time-sharing is not applied to the store operation, the area of the peripheral circuit increases by 40% with respect to the occupancy area of the NV-SRAM cell 10. In contrast, in the second embodiment, the total channel width/cell including the peripheral circuit increases only by approximately 8% with respect to the channel width/cell of the NV-SRAM cell 10 alone. As described above, the occupancy area of the memory circuit can be significantly reduced.

In the second embodiment and the variation thereof, the memory circuit includes one or more power switches 30. The power switch 30 changes the voltage supplied, as a power-supply voltage, to a plurality of cells 10. A region (for example, the cell array 20 in FIG. 17) to which the same voltage is supplied by one power switch 30 is divided into a plurality of blocks 42. As illustrated in FIG. 18, the controller 25 performs the store operation for each of the blocks 42 at different times in this region. This control can reduce, as illustrated in FIG. 21A and FIG. 21B, the occupancy area of the power switch 30. The power switch 30 provided for the region in which the same voltage is supplied to a plurality of cells 10 and is changed at almost the same timing is called "one" power switch 30. One power switch 30 may include more than one transistor or switch.

As illustrated in FIG. 6, FIG. 9, and FIG. 10, a block may correspond to a row. To further reduce the occupancy area of the power switch 30, as illustrated in FIG. 17, one row is preferably divided into a plurality of blocks 42.

As illustrated in FIG. 17 and FIG. 20, the MOSFETs m7 and m8 (switches for storing data) of the cells 10 in each of the blocks 42 are coupled to the same sub-switch line SR00 through SR73. Sub-switch lines (for example, SR00 through SR03) in the same row are coupled to one switch line (for example, SR0). As illustrated in FIG. 19, the selection circuits 40 select one block from a plurality of blocks 42, and outputs a signal for turning ON the switch to the sub-switch line (for example, SR00) of a selected block. Signals for turning OFF the switches are output to sub-switch lines (for example, SR01 through SR03) of other blocks. Accordingly, the MOSFETs m7 and m8 (switches) in each block 42 can be turned ON at different times.

The cell 10 is only required to include the bistable circuit 12 and a non-volatile element, but the MTJ1 and the MTJ2 have low impedance during storing especially in the case of the NV-SRAM cell 10. Thus, trying to simultaneously perform the store operations of a plurality of cells 10 increases the size of the power switch 30. Therefore, in the case of the NV-SRAM, the occupancy area of the power switch 30 can be greatly reduced by causing the cells 10 to which a voltage is commonly supplied from the same power switch 30 to perform the store operation at different times.

An exemplary case where the MTJ1 and the MTJ2 are respectively coupled to the nodes Q and QB has been described, but it is only required that one of the MTJ1 and the MTJ2 is coupled to the node Q or QB. The MTJ has been described as an example of a non-volatile element, but the non-volatile element may be a giant magnetoresistance element, a variable resistive element used for a ReRAM, or a phase-change element used for a PRAM.

Figure 22:
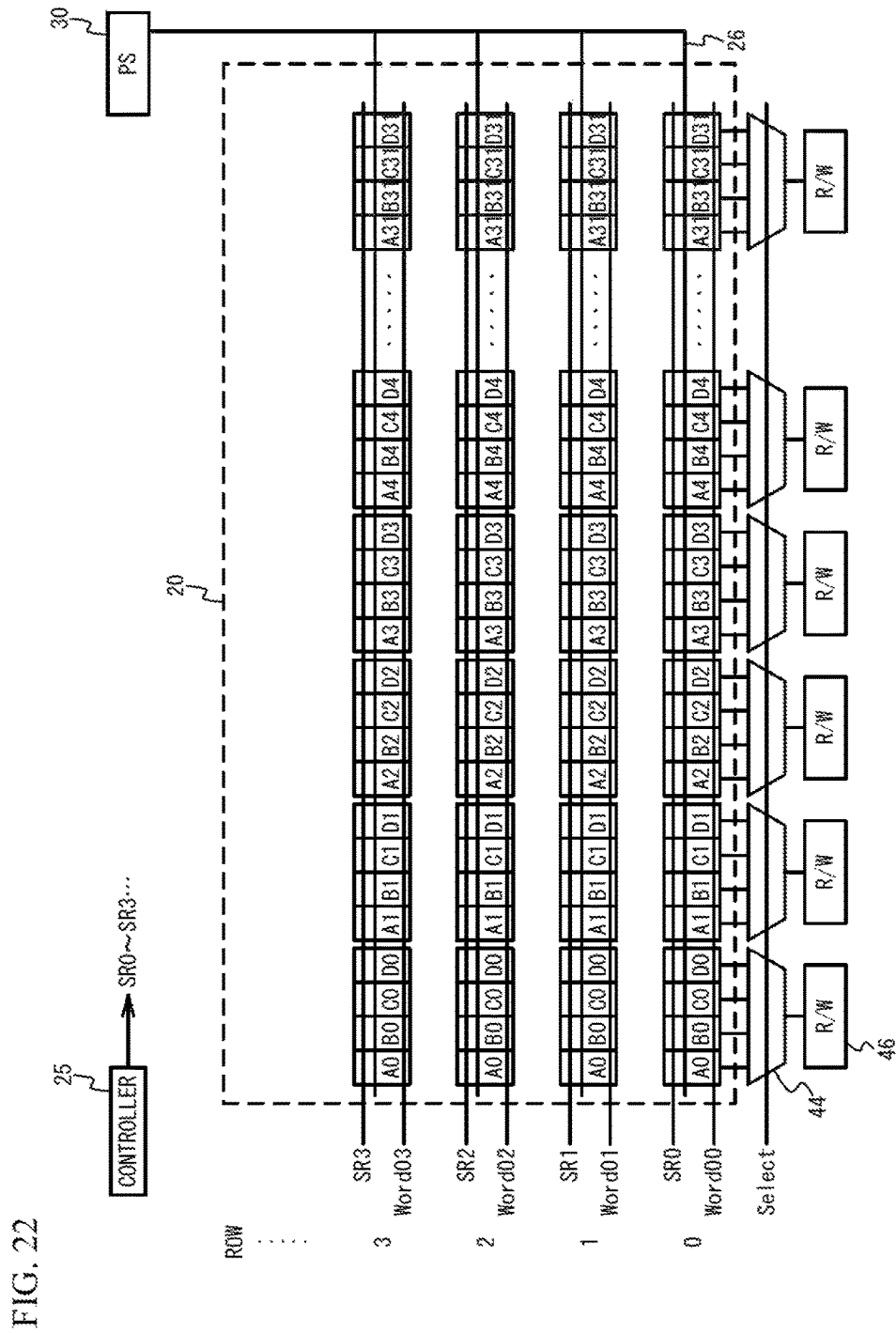
FIG. 22 is a block diagram illustrating a part of a cell array in a first variation of the second embodiment.

A description will next be given of a memory circuit that performs an interleave operation as a variation of the second embodiment. FIG. 22 is a block diagram illustrating a part of a cell array in a first variation of the second embodiment. FIG. 22 illustrates rows 0 through 3 of a plurality of rows in the cell array 20. As illustrated in FIG. 22, in the row direction, word lines Word00 through Word03, the switch lines SR0 through SR3, and the power supply lines 26 extend. In the column direction, bit lines (not illustrated) extend. The control lines CTRL (not illustrated) may extend in the row direction or the column direction. A single power switch 30 is shared by the power supply lines 26 of rows 0 through 3. The power switch 30 may be shared by all the rows of the cell array 20, or may be shared by one or some of the rows of the cell array 20. The power switch 30 may be composed of more than one transistor. The controller 25 outputs signals to the switch lines SR0 through SR3. The bit number of each row is, for example, 128 bits, and 128 cells 10 are arranged in each row. The cells 10 correspond to A0 through A31, B0 through B31, C0 through C31, and D0 through D31.

The bit lines for four cells 10 are selected by a selector 44, and coupled to read/write (R/W) circuit 46. The selector 44 couples one cell 10 of A through D to the read/write circuit 46 based on a select signal Select. The read/write circuit 46 reads data from the cell 10 or writes data to the cell 10 during the normal SRAM operation period. During the normal SRAM operation period, the selector 44 selects A through D in turn. Accordingly, the read/write circuit 46 read or write data from or to the cells 10 corresponding to A0 through A31, the cells 10 corresponding to B0 through B31, the cells 10 corresponding to C0 through C31, and the cells corresponding to D0 through D31 in turn. The store operation of each cell 10 is performed in every row in the same manner as the first embodiment. When the control lines CTRL extend in the row direction, the controller 25 may apply the voltage for storing to the control line CTRL corresponding to the row on which the store operation is performed. When the control lines CTRL extend in the column direction, the controller 25 may apply the voltage for storing to the control line CTRL corresponding to the cell 10 that is to perform the store operation. The cell 10 that is to perform the store operation can be selected with the switch lines SR0 through SR3, and thus, the controller 25 may apply the voltage for storing to all the control lines CTRL regardless of the extension direction of the control lines CTRL. This configuration eliminates the complicating control of the voltage applied to the control line CTRL. Other operations are the same as those of the first and second embodiments, and the description thereof is thus omitted. In the first variation of the second embodiment, the number of cells 10 that are simultaneously put at a high level by the switch line SR0 is 128. Thus, the channel width of the transistor of the power switch 30 is configured to be W0×128. Other configurations are the same as those of the first and second embodiments, and the description thereof is thus omitted.

As in the first variation of the second embodiment, an interleave operation may be performed dicing the normal SRAM operation period in the first and second embodiments.

Figure 23:
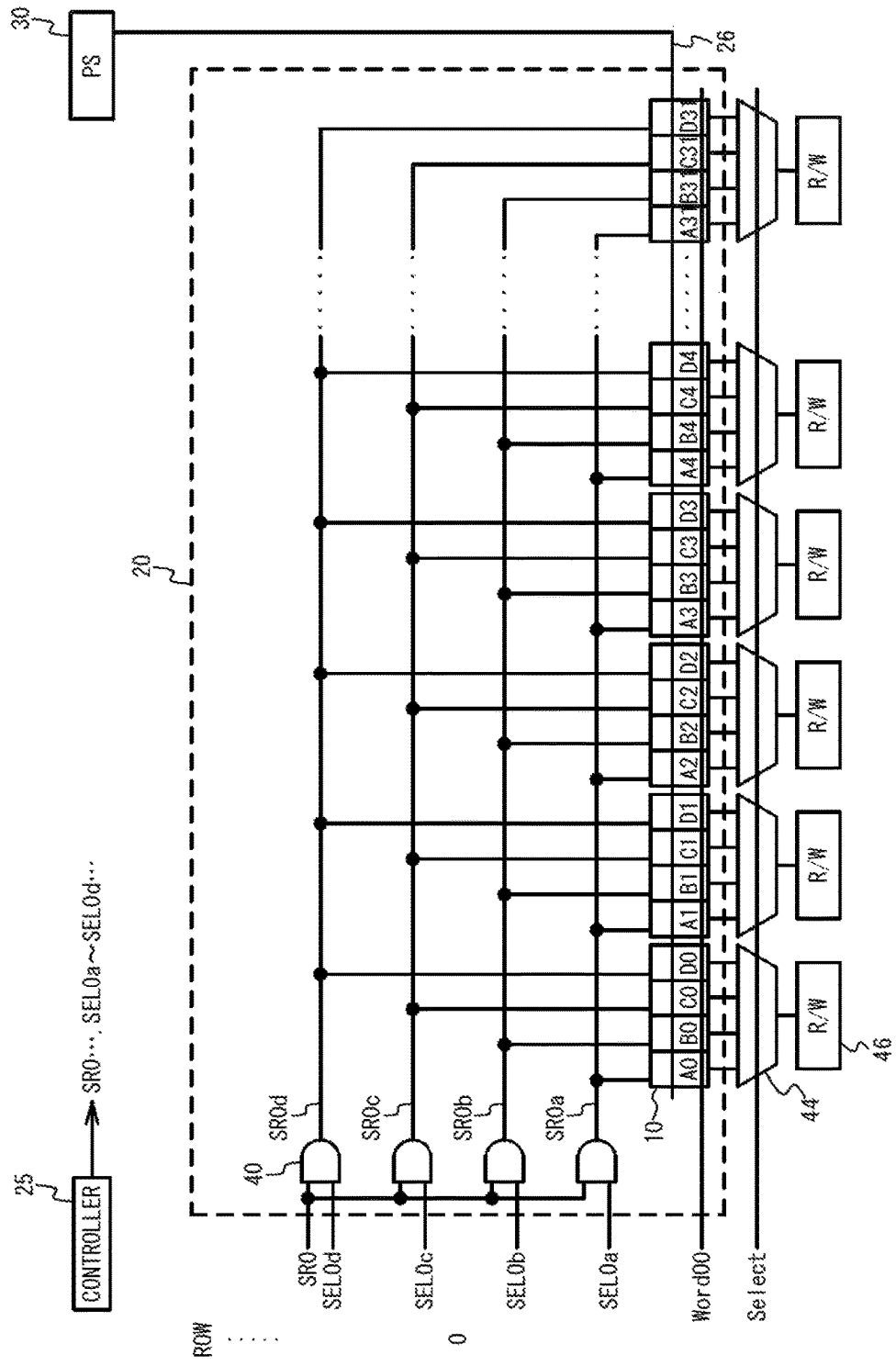
FIG. 23 is a block diagram illustrating a part of a cell array in a second variation of the second embodiment.

FIG. 23 is a block diagram illustrating a part of a cell array in a second variation of the second embodiment. FIG. 23 illustrates row 0 of the rows in the cell array 20. Each row is divided into four blocks: A0 through A31, B0 through B31, C0 through C31, and D0 through D31. The bit number of each block is 32 bits. The switch line SR0 is divided into sub-switch lines SR0a through SR0d for each divided block. Between the switch line SR0 and the sub-switch lines SR0a through SR0d, the selection circuits 40 are located. The controller 25 outputs select signals SEL0a through SEL0d, and outputs signals to the switch lines SR0 through SR3. To each selection circuit 40, the corresponding select signal SEL0a through SEL0d is input from the controller 25, and the corresponding switch line SR0 through SR7 is input. The selection circuit 40 is an AND circuit, and sets the corresponding sub-switch line SR0a through SR0d at a high level when the switch line SR0 is at a high level and the corresponding select signal SEL0a through SEL0d are at a high level. Other configurations are the same as those of the second embodiment and the variations thereof, and the description thereof is thus omitted.

Figure 24:
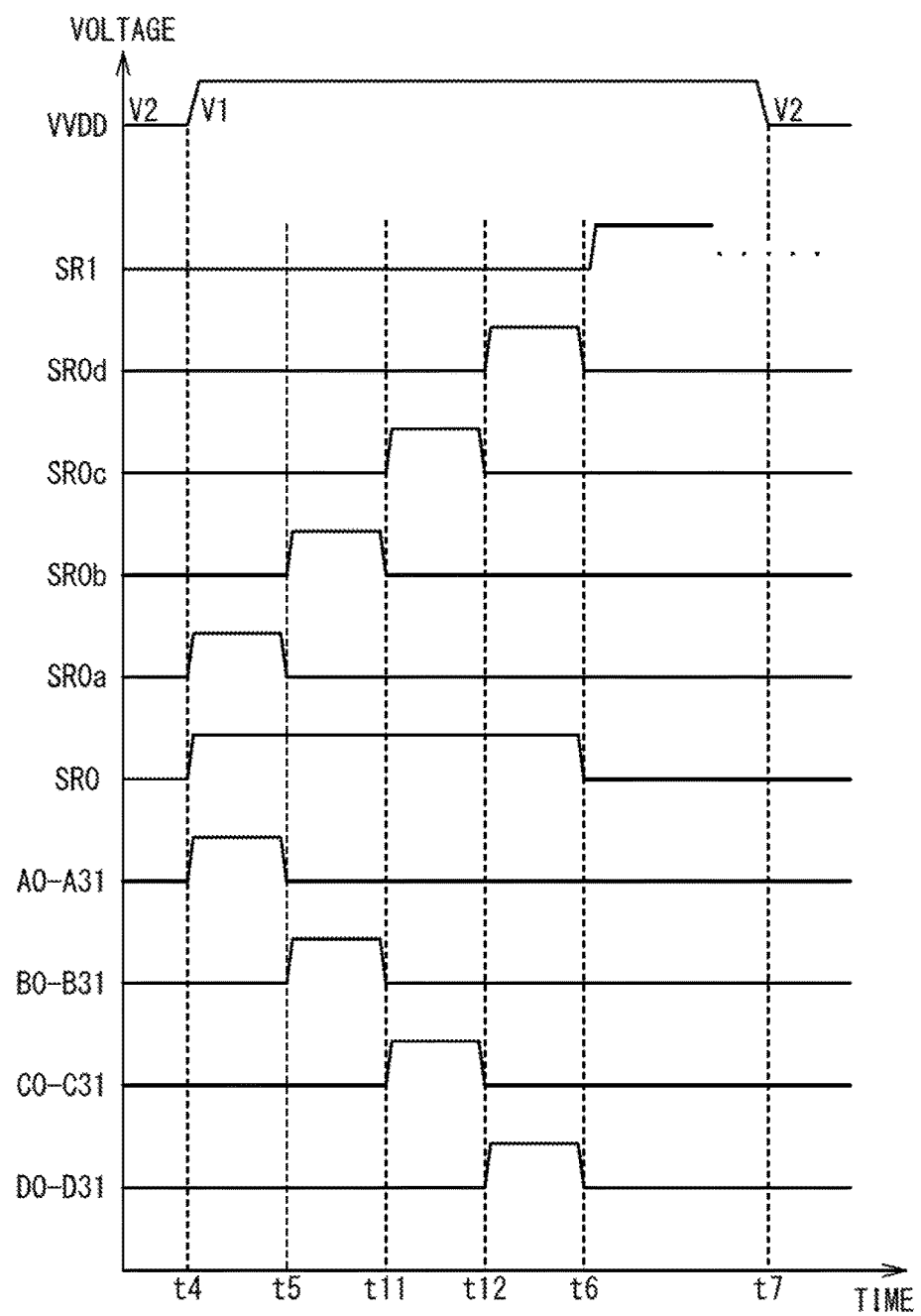
FIG. 24 is a timing chart of the store operation of each cell, switch lines, sub-switch lines, and the virtual power-supply voltage VVDD in the second variation of the second embodiment.

FIG. 24 is a timing chart of the store operation of each cell, the switch lines, the sub-switch lines, and the virtual power-supply voltage VVDD in the second variation of the second embodiment. As illustrated in FIG. 24, from time t4 to t5, the controller 25 sets the signal of the sub-switch line SR0a at a high level, and sets signals of other sub-switch lines SR0b through SR0d at a low level. The controller 25 performs the store operation for the cells 10 of A0 through A31. Similarly, from time t5 to t11, the controller 25 sets the signal of the sub-switch line SR0b at a high level, and performs the store operation for the cells 10 of B0 through B31. From time t11 to t12, the controller 25 sets the signal of the sub-switch line SR0c at a high level, and performs the store operation for the cells 10 of C0 through C31. From time t12 to t6, the controller 25 sets the signal of the sub-switch SR0d at a high level, and performs the store operation for the cells 10 of D0 through D31. Other operations are the same as those of FIG. 19 of the second embodiment, and the description thereof is thus omitted.

In the second variation of the second embodiment, the number of cells 10 coupled to each of the sub-switch lines SR0a through SR0d is 32. Thus, the channel width of the transistor of the power switch 30 is configured to be W0×32.

Figure 25:
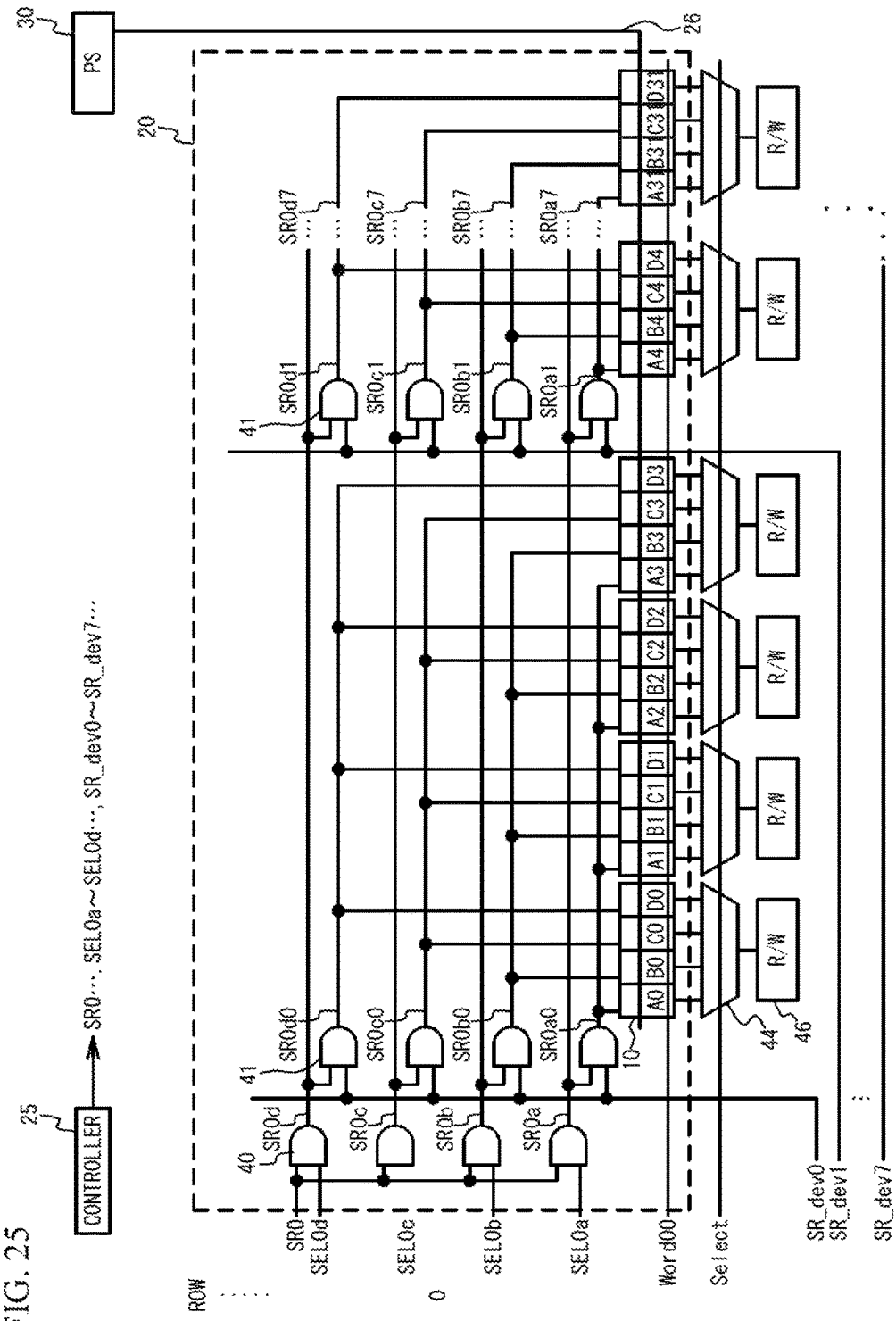
FIG. 25 is a block diagram illustrating a part of a cell array in a third variation of the second embodiment.

FIG. 25 is a block diagram illustrating a part of a cell array in a third variation of the second embodiment. FIG. 25 illustrates row 0 of the rows in the cell array 20. As illustrated in FIG. 25, the sub-switch line SR0a is divided into sub-switch lines SR0a0 through SR0a7. Similarly, the sub-switch lines SR0b through SR0d are respectively divided into sub-switch lines SR0b0 through SR0b7, sub-switch lines SR0c0 through SR0c7, and sub-switch lines SR0d0 through SR0d7. Selection circuits 41 are located between the sub-switch line SR0a and the sub-switch lines SR0a0 through SR0a7, between the sub-switch line SR0a and the sub-switch lines SR0b0 through SR0b7, between the sub-switch line SR0a and the sub-switch lines SR0c0 through SR0c7, and between the sub-switch line SR0a and the sub-switch lines SR0d0 through SR0d7. The controller 25 outputs select signals SR0_dev0 through SR_dev7. To each selection circuit 41, the corresponding select signal SR_dev0 through SR_dev7 is input from the controller 25, and the corresponding sub-switch line SR0a through SR0d is input from the selection circuit 40. The selection circuit 41 is an AND circuit, and sets the corresponding sub-switch line SR0a0 through SR0d7 at a high level when the corresponding sub-switch line SR0a through SR0d is at a high level and the corresponding select signal SR_dev0 through SR_dev7 is at a high level. Other configurations are the same as those of the second variation of the second embodiment, and thus the description thereof is omitted.

In the third variation of the second embodiment, the number of cells 10 coupled to each of the sub-switch lines SR0a0 through SR0d7 is four. Thus, the channel width of the transistor of the power switch 30 can be configured to be W0×4.

The variations of the second embodiment have described an exemplary case where the number of stages of the interleave is four, but the number of stages of the interleave can be freely selected. The third variation of the second embodiment has described an exemplary case where each of the sub-switch lines SR0a through SR0d is divided into eight, but each of the sub-switch lines SR0a through SR0d may be divided into a desired number.

When a single row is divided into a plurality of blocks, as in the second embodiment, the row may be divided so that each of the blocks 42 includes consecutive cells 10 in the same row. Alternatively, as in the second and third variations of the second embodiment, each of the blocks may include cells periodically arranged in the same row. In the second and third variations of the second embodiment, the groups A0 through A31 of the cells 10 selected by the selectors 44 when the interleave operation is performed correspond to the groups A0 through A31 of the cells 10 coupled to the same switch line. Groups coupled to the same switch line may differ from the groups of the cells for the interleave operation. In addition, in the memory circuit that does not perform the interleave operation, each of the blocks may include cells periodically arranged in the same row.

Third Embodiment

A third embodiment is exemplary store free shutdown architecture by time-sharing store control.

Figure 26:
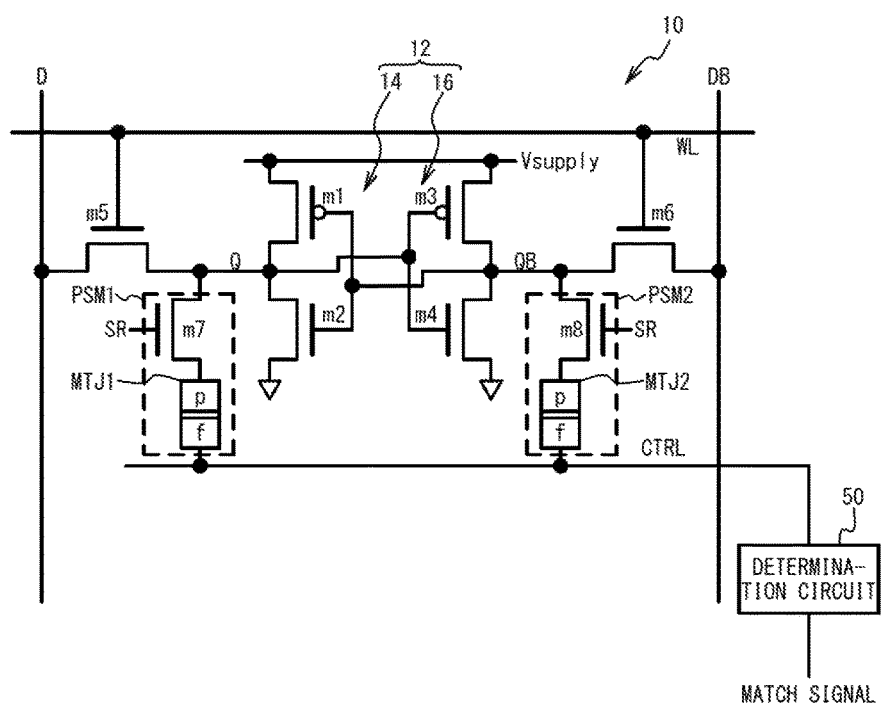
FIG. 26 is a block diagram of a determination circuit and a cell in a third embodiment.

FIG. 26 is a block diagram of a determination circuit and a cell in the third embodiment. As illustrated in FIG. 26, a determination circuit 50 is coupled to the control line CTRL. The determination circuit 50 outputs a match signal based on the signal of the control line CTRL. For example, the match signal is a signal indicating whether the data in the bistable circuit 12 and the data in the MTJ1 and the MTJ2 match in the cell 10. The determination circuit 50 simultaneously performs the determination without distinguishing between the data in the MTJ1 and the data in the MTJ2 in the cell 10. For example, in the virtual power-supply method, the determination circuit 50 determines that the data match when one MTJ1 in the antiparallel state is coupled to a node at a high level in the bistable circuit 12 and the other MTJ in the parallel state is coupled to a node at a low level. In the virtual ground method, the determination circuit 50 determines that the data match when one MTJ in the parallel state is coupled to a node at a high level in the bistable circuit 12 and the other MTJ in the antiparallel state is coupled to a node at a low level. The determination circuit 50 may output the match signal based on the voltage of the control line CTRL or based on the current of the control line CTRL. The controller does not perform the store operation of the cell 10 and shut downs the cell 10 (store free shutdown) when the match signal indicates match, while performs the store operation of the cell 10 when the match signal indicates mismatch. The specifics of the NV-SRAM cell 10 are the same as those of FIG. 1, and the description thereof is thus omitted.

Figure 27:
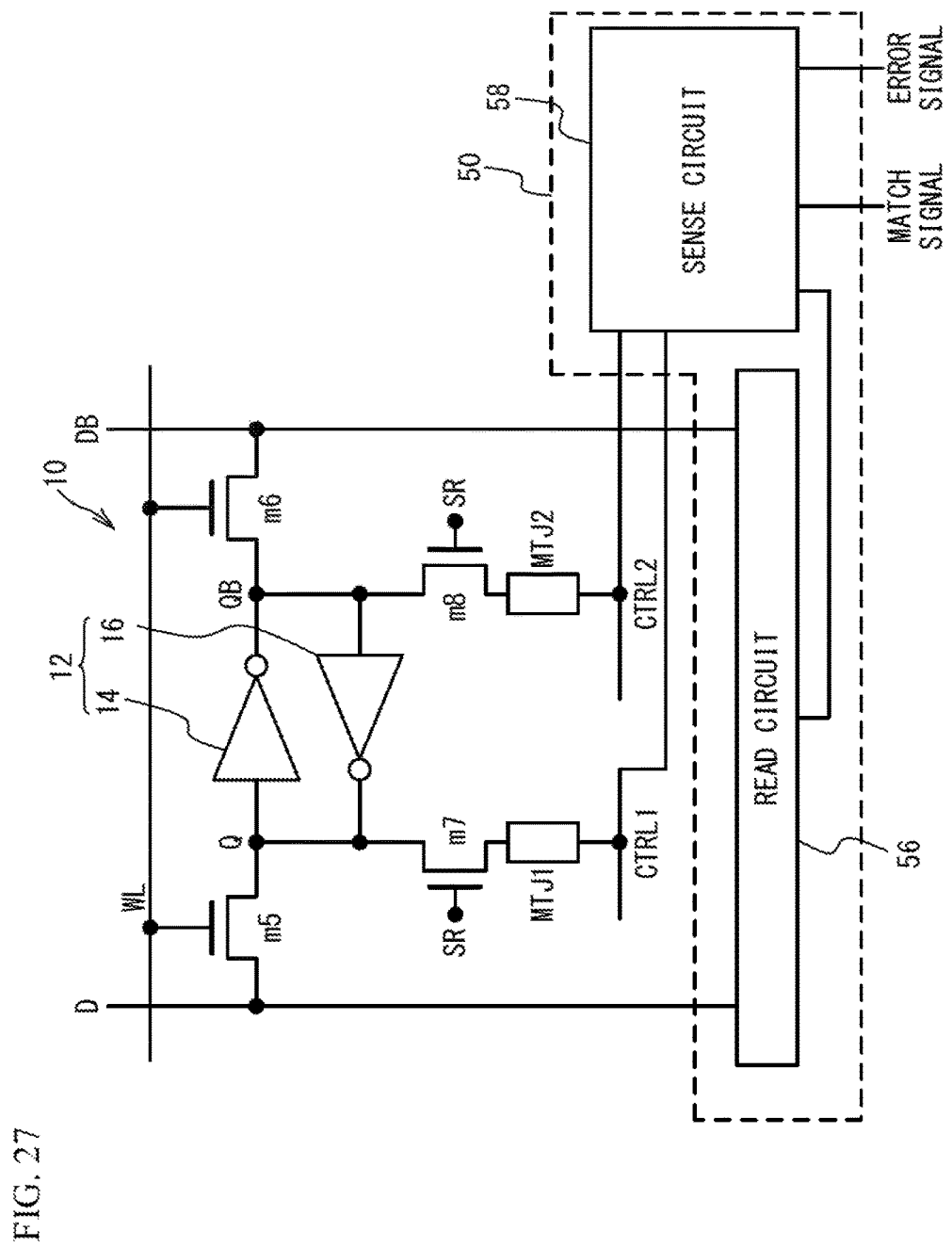
FIG. 27 is a block diagram illustrating another example of the determination circuit and the cell in the third embodiment.

FIG. 27 is a block diagram of another example of the determination circuit and the cell in the third embodiment. As illustrated in FIG. 27, the specifics of the NV-SRAM cell 10 are the same as those of FIG. 1 of the first embodiment, and the description thereof is thus omitted. The determination circuit 50 includes a read circuit 56 and a detection circuit 58. The read circuit 56 reads out data in the bistable circuit 12. The detection circuit 58 outputs the match signal and an error signal based on the output of the read circuit 56 and signals of control lines CTRL1 and CTRL2. The error signal is a signal indicating whether data in the MTJ1 and the MTJ2 is erroneous data. For example, when both the MTJ1 and the MTJ2 are in the parallel state or in the antiparallel state, this means that data is erroneous data. When the match signal indicates match, and the error signal indicates that data is not erroneous data, the controller does not perform the store operation of the cell 10 and shut downs the cell 10 (store free shutdown). In other cases, the controller performs the store operation of the cell 10. The specifics of the NV-SRAM cell 10 are the same as those of FIG. 1, and thus the description thereof is omitted.

In FIG. 26 and FIG. 27, when the data in the bistable circuit 12 and the data in the MTJ1 and the MTJ2 match, the store operation is not performed because of the store free shutdown, and therefore, power consumption during the store operation is reduced.

When the determination circuit 50 in FIG. 26 and FIG. 27 is provided for each cell 10, the size of the peripheral circuit increases. The third embodiment provides the determination circuit 50 for each column. In addition, the row is divided into a plurality of blocks. During the store operation, data stored in the non-volatile element of the cell is compared with data stored for each block. Only when data differs in at least one cell in the block, the store operation of the cells in the block is performed. When all the data match, the store operation is skipped. This configuration can greatly reduce power consumption associated with the store operation, and therefore, greatly reduce the BET.

Figure 28:
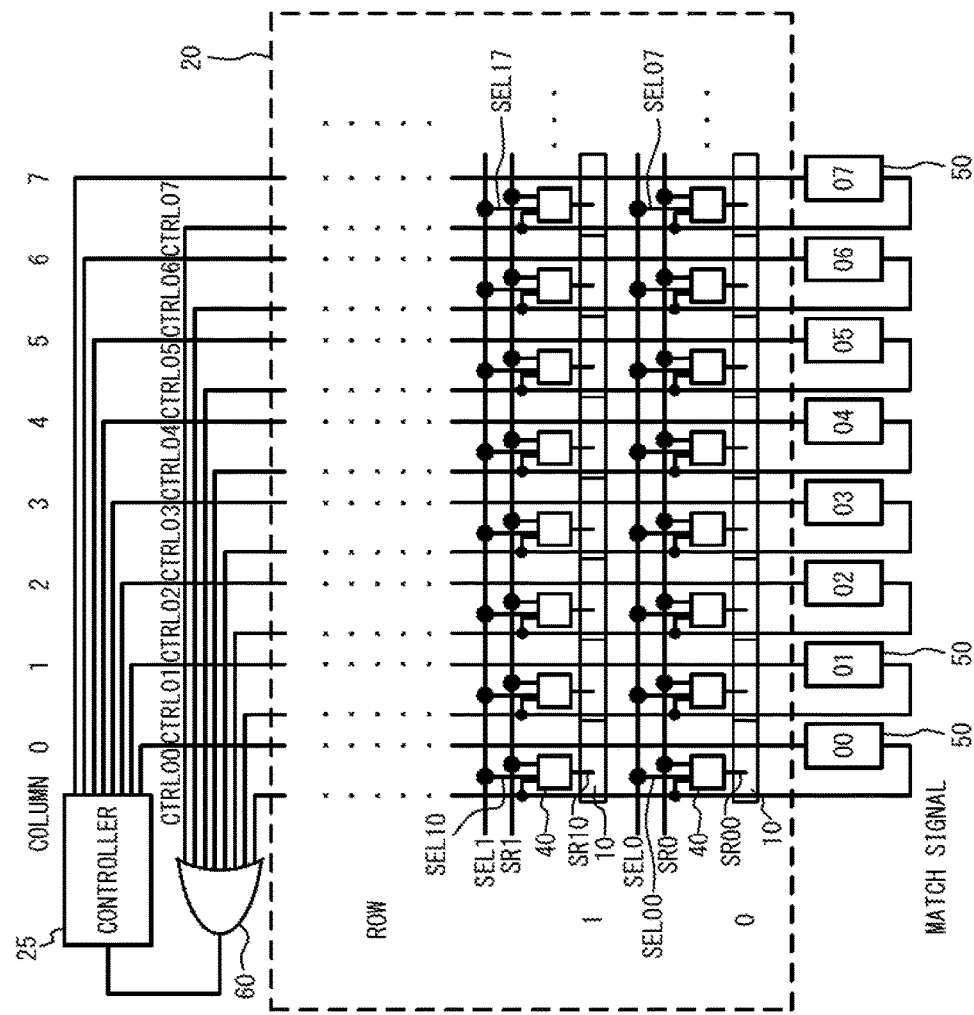
FIG. 28 is a block diagram of a memory circuit in the third embodiment.

FIG. 28 is a block diagram of a memory circuit in the third embodiment. FIG. 28 illustrates an example using the determination circuit 50 of FIG. 26. As illustrated in FIG. 28, in the memory circuit, the determination circuit 50 for each column is provided. The selection circuit 40 for each cell 10 is provided. The cells 10 in the same column (for example, column 0) share a control line (for example, CTRL00). The determination circuit 50 outputs the match signal of column 0 based on the signal of the control line CTRL00. The match signal is input to the selection circuit 40 of each row in column 0. The selection circuit 40 outputs a signal for tuning ON the MOSFETs m7 and m8 of the cell 10 to the sub-switch line SR00 when the switch line SR0 is selected and the match signal indicates mismatch. On the other hand, the selection circuit 40 outputs a signal for timing OFF the MOSFETs m7 and m8 of the cell 10 to the sub-switch line SR00 when the switch line SR0 is not selected or when the match signal indicates match. An OR circuit 60 outputs an OR signal of the match signals of columns 0 through 7 to the controller 25.

The select signal SEL0 is input to the selection circuits 40 in row 0. The select signal SEL00 is a signal for selecting the sub-switch line SR00 regardless of the match signal. For example, the signal of the sub-switch line SR00=(the signal of the switch line SR0)AND[(the select signal SEL00)OR (the match signal)]. When the determination is performed for the first time, the select signal SEL0 is used to activate the sub-switch lines SR00 through SR07. Thereafter, the sub-switch lines SR00 through SR07 are selected with the match signal to perform the store operation. In FIG. 28, the selection circuits 40 in the same row are coupled to the same select signal SEL0, but the selection circuits 40 may be coupled to different select signal lines. Alternatively, every several selection circuits 40 may be coupled to the same select signal line. In FIG. 28, two switch lines and two select signal lines are illustrated, but when the number of rows is represented by N, the switch lines SR0 through SRN−1 and the select signals SEL0 through SELN−1 are provided. The same applies to FIG. 30 through FIG. 33. In addition, the select signal SEL0 is commonly used for the select signals SEL00 through SEL07 in the row direction, and the select signal SEL1 is commonly used for the select signals SEL10 through SEL17 in the row direction. However, as illustrated in FIG. 20, one select signal may be used for the select signals in the column direction, and the lines for the select signals may be wired in the column direction. The same applies to FIG. 30 through FIG. 33.

Figure 29:
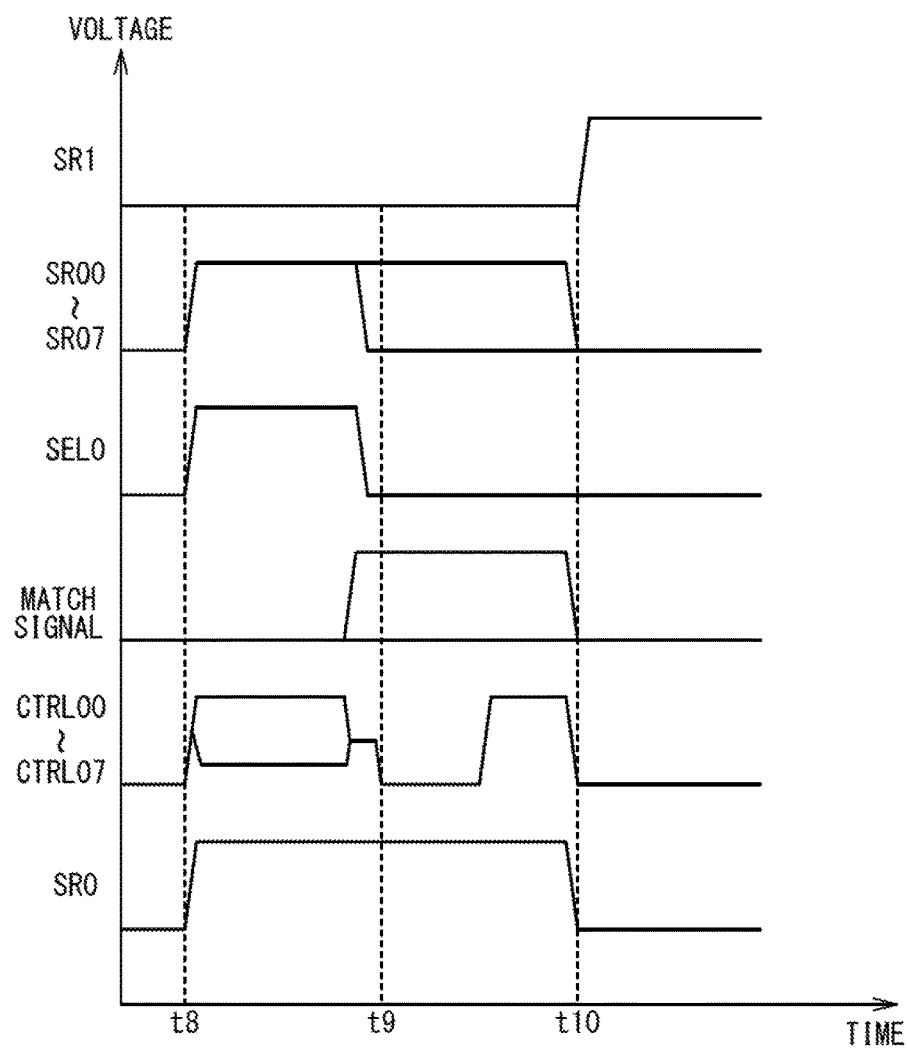
FIG. 29 is a timing chart of switch lines, control lines, and a match signal in the third embodiment.

FIG. 29 is a timing chart of the switch lines, the control lines, and the match signal in the third embodiment. As illustrated in FIG. 29, when the store operation is started at time t8, the controller 25 puts the control lines CTRL00 through CTRL07 into a floating state, sets the switch line SR0 at a high level, sets another switch line SR1 at a low level, sets the select signal SEL0 at a high level, and sets other select signals SEL1 through SELN−1 (not illustrated in FIG. 29, see FIG. 28 for SEL1) at a low level. This control activates and sets the sub-switch lines SR00 through SR07 at a high level. The control lines CTRL00 through CTRL07 are at different levels depending on whether the data match or not in the cells 10 of columns 0 through 7 in row 0, respectively. The determination circuits 50 output the match signals based on the levels of the control lines CTRL00 through CTRL07. The controller 25 sets the select signal SEL0 at a low level. As a result, the selection circuits 40 set the sub-switch lines SR00 through SR07 of which the match signals indicate mismatch at a high level, and sets the sub-switch lines SR00 through SR07 of which the match signals indicate match at a low level.

At time t9, the controller 25 sets the control lines CTRL00 through CTRL07 at a low level, and thereafter, at a high level. This control causes the cells 10 of which the match signals indicate mismatch in row 0 to perform the store operation, and remaining cells 10 not to perform the store operation. At time t10, when the store operation on row 0 ends, the controller 25 sets the switch line SR0 at a low level, and sets the switch line SR1 at a high level. Then, the controller 25 performs the store operation on each row from row 1 in turn.

In FIG. 29, the determination circuit 50 outputs the match signal after the select signal SEL0 becomes at a low level, but the determination circuit 50 may output the match signal while the select signal SEL0 is at a high level. The determination circuit 50 or the selection circuit 40 may hold the match signal for a desired period of time. This configuration allows the determination circuit 50 to output the match signal for a desired period of time.

In FIG. 28, since the determination circuit 50 can be provided for each column, the occupancy area of the determination circuits 50 can be reduced compared to the configuration where the determination circuit 50 is provided for each cell 10. In addition, the store operation of the cell 10 that does not need to perform storing is not performed. Therefore, the power for the store operation can be reduced, and the BET can be reduced.

Figure 30:
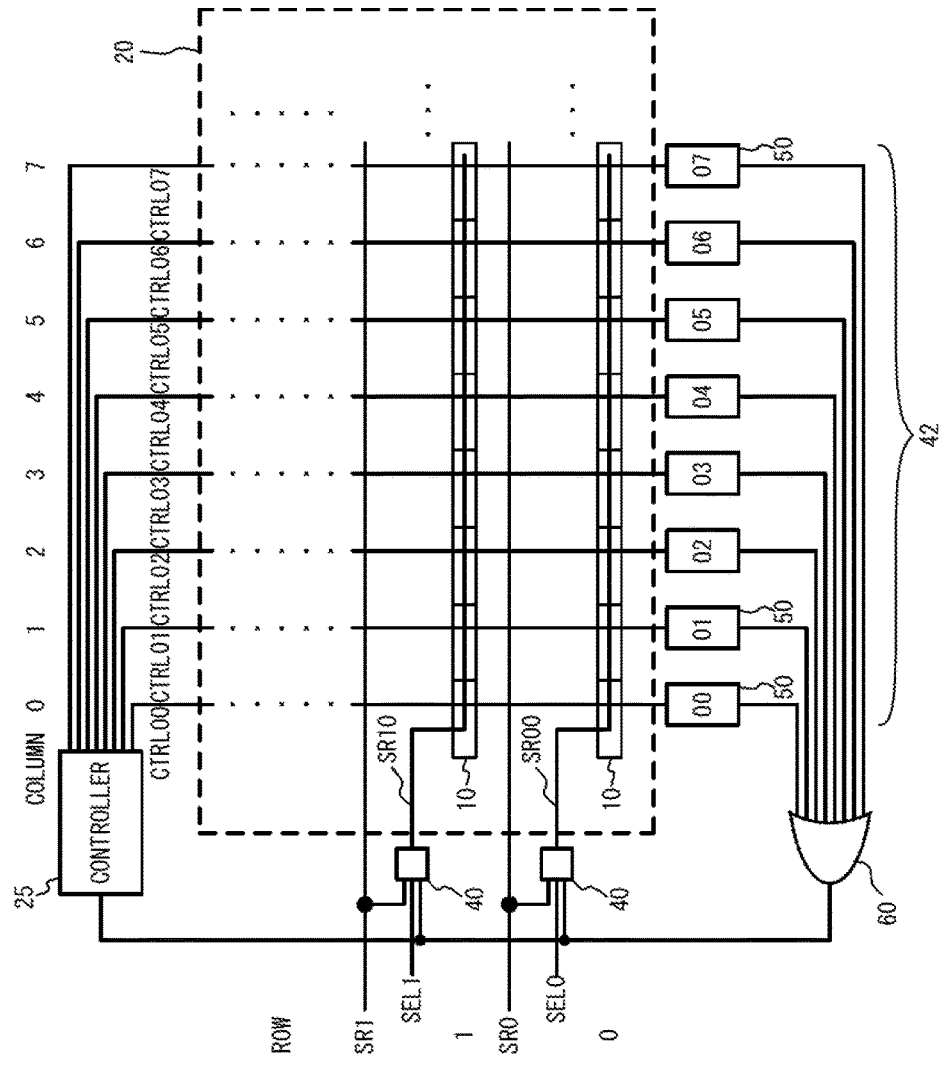
FIG. 30 is a block diagram of a memory circuit in a first variation of the third embodiment.

FIG. 30 is a block diagram of a memory circuit in a first variation of the third embodiment. As illustrated in FIG. 30, as in FIG. 17 of the second embodiment, each row is divided into a plurality of blocks 42. The match signals output from the determination circuits 50 in the block 42 are input to the OR circuit 60. The OR signal of the match signals is input to the selection circuits 40 and the controller 25. Thus, when a certain switch line (for example, SR0) is selected and even one of the determination circuits 50 outputs the match signal indicating mismatch of data in the cells 10 in the block 42, the sub-switch line (for example, SR00) becomes at a high level. Accordingly, all the cells 10 in the block 42 perform the store operation. When all the determination circuits 50 output the match signals indicating match of data in the cells 10 in the block 42, the sub-switch line (for example, SR00) becomes at a low level. Accordingly, the cells 10 in the block 42 do not perform the store operation. When the determination is performed for the first time, the select signals SEL0 through SELN-1 are used to activate the sub-switch lines SR00 through SR07. Other configurations are the same as those of FIG. 28, and thus the description is omitted In the first variation of the third embodiment, the selection circuit 40 can be provided for each block 42. Thus, the first variation of the third embodiment can reduce the peripheral circuits such as the selection circuits 40 compared to the third embodiment. In addition, the store operation for the block 42 in which storing is unnecessary is not performed. Therefore, the power for the store operation can be reduced, and the BET can be reduced.

Figure 31:
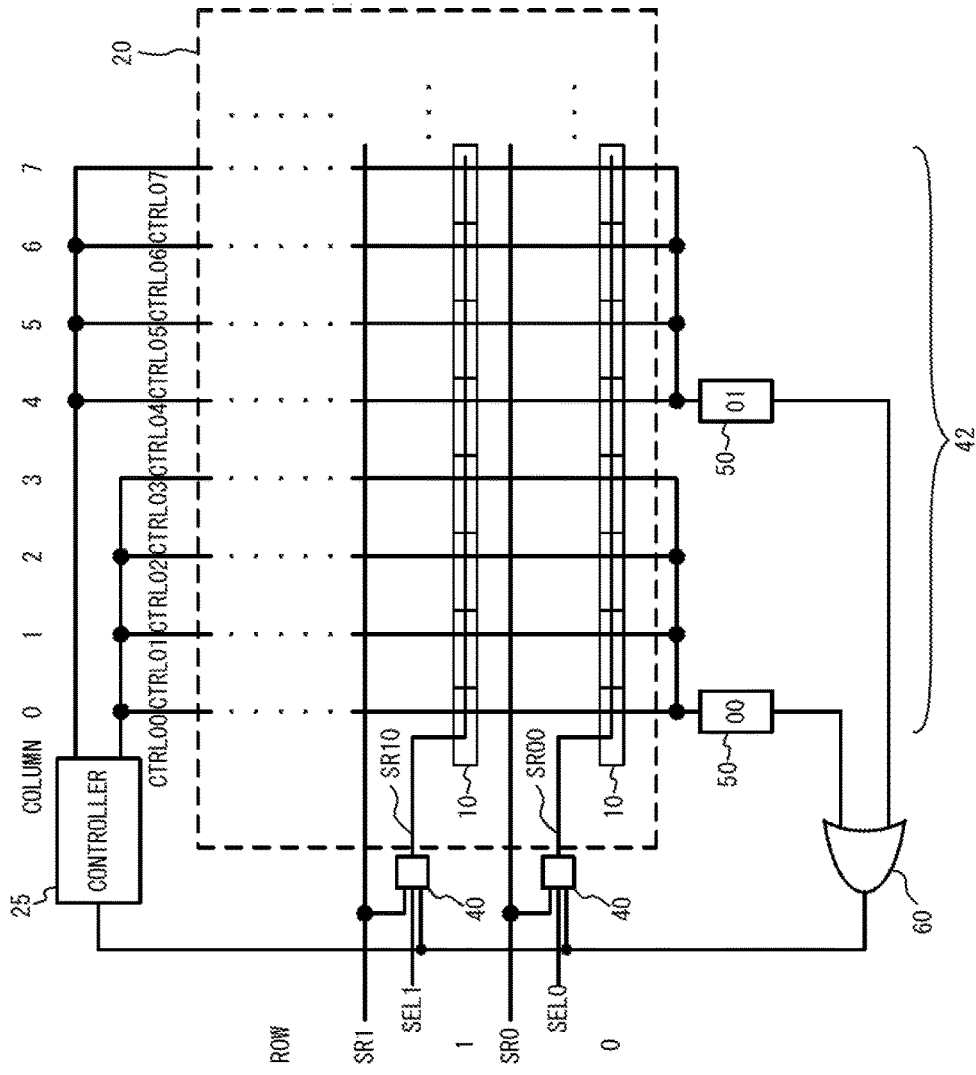
FIG. 31 is a block diagram of a memory circuit in a second variation of the third embodiment.

FIG. 31 is a block diagram of a memory circuit in a second variation of the third embodiment. As illustrated in FIG. 31, columns 0 through 3 share one determination circuit 50, and columns 4 through 7 share one determination circuit 50. The determination circuit 50 determines whether the data match or not in all four cells 10 coupled to the control lines CTRL00 through CTRL03 (or CTRL04 through CTRL07) and coupled to the selected sub-switch line SR00. When the determination is performed for the first time, the select signals SEL0 through SELN-1 are used to activate the sub-switch lines SR00 through SR07. Other configurations are the same as those of FIG. 30, and thus the description thereof is omitted.

Figure 32:
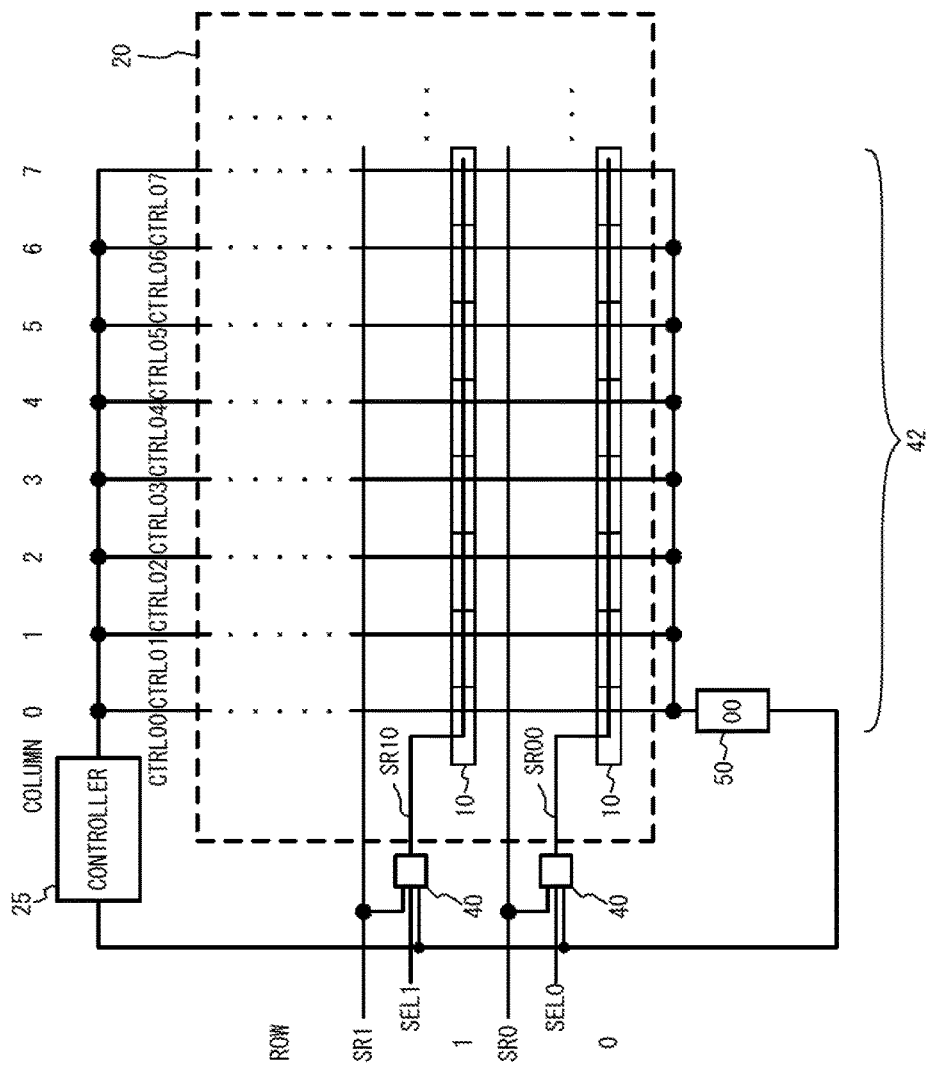
FIG. 32 is a block diagram of a memory circuit in a third variation of the third embodiment.

FIG. 32 is a block diagram of a memory circuit in a third variation of the third embodiment. As illustrated in FIG. 32, columns 0 through 7 share one determination circuit 50. The determination circuit 50 determines whether data match or not in all eight cells 10 coupled to the control lines CTRL00 through CTRL07 and coupled to the selected sub-switch line SR00. Other configurations are the same as those of FIG. 30, and the description thereof is thus omitted.

As described in the second and third variations of the third embodiment, a plurality of columns in the block 42 can share one determination circuit 50. Accordingly, the second and third variations of the third embodiment can reduce the number of the determination circuits 50 and can reduce the occupancy area thereof compared to the first variation of the third embodiment. In addition, the store operation for the block 42 in which storing is unnecessary is not performed. Therefore, the power for the store operation can be reduced, and the BET can be reduced.

Figure 33:
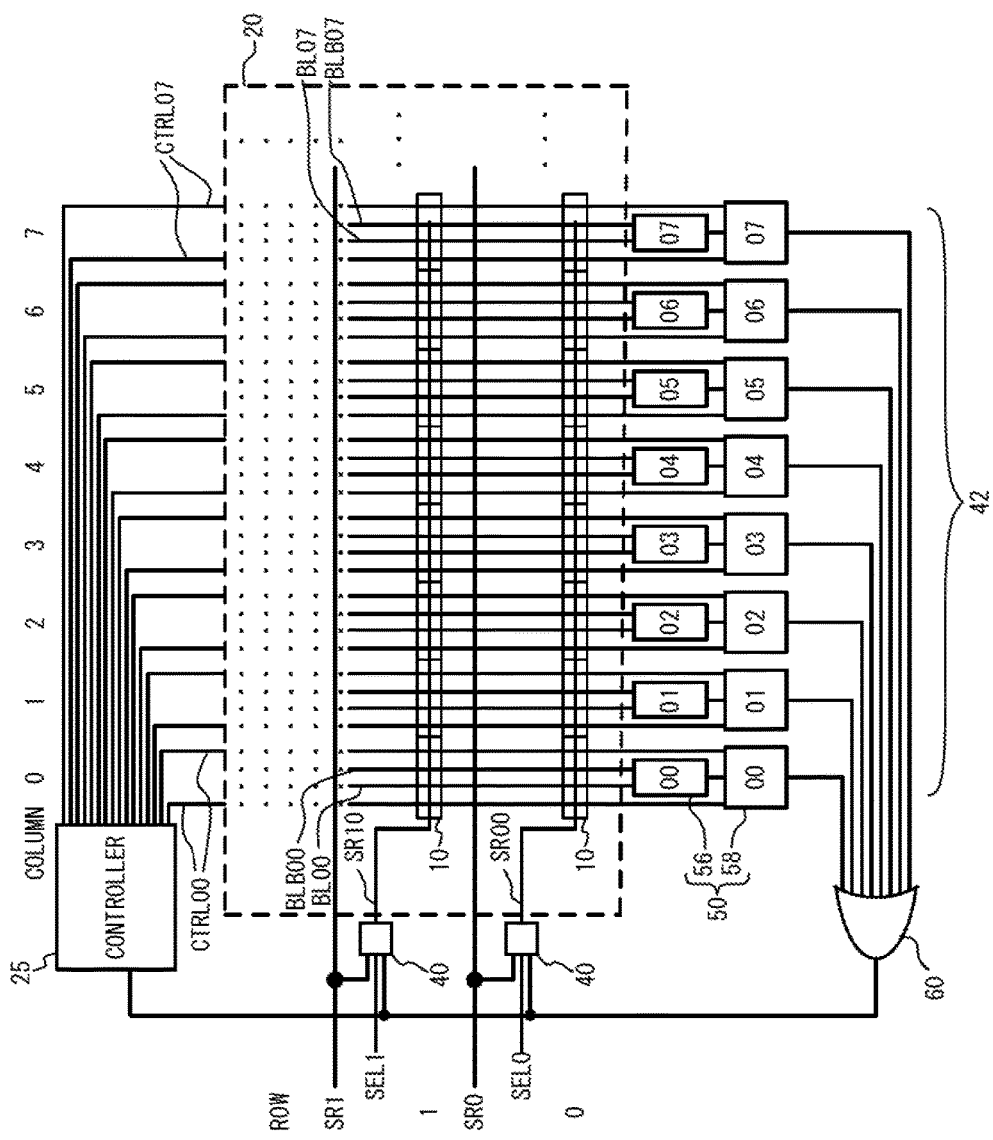
FIG. 33 is a block diagram of a memory circuit in a fourth variation of the third embodiment.

FIG. 33 is a block diagram of a memory circuit in a fourth variation of the third embodiment. FIG. 33 illustrates an example using the read circuit 56 and the detection circuit 58 as the determination circuit 50 as described in FIG. 27. As illustrated in FIG. 33, in the column direction, the control lines CTRL00 through CTRL07, the bit lines BL00, BLB00 through BL07, and BLB07 are provided. One of the control lines CTRL00 is coupled to the MTJ1 of the cell 10, while the other is coupled to the MTJ2. The read circuit 56 in column 0 reads out data in the bistable circuit 12 of the cell 10 from the bit lines BL00 and BLB00. The detection circuit 58 outputs the match signal and the error signal based on the output of the read circuit 56 and signals of the corresponding control lines CTRL00 through CTRL07. The OR circuit 60 performs an OR operation on the match signals. When the determination is performed for the first time, the select signals SEL0 through SELN-1 are used to activate the sub-switch lines SR00 through SR07. Other configurations are the same as those of the first variation of the third embodiment, and the description thereof is thus omitted.

The third embodiment and the first through third variations thereof cannot detect whether data stored in the MTJ1 and the MTJ2 is erroneous data. The fourth variation of the third embodiment can detect whether data stored in the MTJ1 and the MTJ2 is erroneous data. The determination circuit 50 of the fourth variation of the third embodiment may be used for the determination circuit 50 in the third embodiment and the second and third variations thereof.

In the third embodiment and the first through fourth variations thereof, the NV-SRAM cells 10 are arranged in rows 0 through N-1, each of which is coupled to the corresponding switch line SR0 through SRN-1, and columns 0 through M-1, each of which is coupled to the corresponding control line CTRL00 through CTRLM-1. The cells 10 coupled to the same control line (for example, CTRL00) share the determination circuit 50. The determination circuit 50 determines, based on the signal of the corresponding control line CTRL00, whether the data in the bistable circuit 12 and the data in the MTJ1 and the MTJ2 match in the cells 10 coupled to the control line CTRL00. The selection circuit 40 turns ON the MOSFETs m7 and m8 in the cells 10 coupled to the control line CTRL00 when the data fail to match. The selection circuit 40 turns OFF the MOSFETs m7 and m8 in the cells 10 coupled to the control line CTRL00 when the data match. Accordingly, the determination circuit 50 can be provided for each control line. Therefore, the occupancy area of the determination circuits 50 can be reduced.

In the first through fourth variations of the third embodiment, an individual row is divided into a plurality of blocks 42 each including a plurality of cells 10. The selection circuit 40 turns ON the MOSFETs m7 and m8 in the corresponding block 42 when the data fail to match in at least one of the cells 10 in the corresponding block 42. The selection circuit 40 turns OFF the MOSFETs m7 and m8 in the corresponding block 42 when the data match in all the cells 10 in the corresponding block 42. Accordingly, the selection circuit 40 can be provided for each block 42. Therefore, the occupancy area of the selection circuits 40 can be reduced. In addition, the store operation for the block 42 in which storing is unnecessary is not performed. Therefore, the power for the store operation can be reduced, and the BET can be therefore reduced.

In the second and third variations of the third embodiment, the determination circuit 50 is shared by a plurality of control lines in the block 42. Thus, the occupancy area of the determination circuit 50 can be reduced.

In the fourth variation of the third embodiment, the determination circuit 50 determines whether the data match or not based on the data in the bistable circuit 12 of the cell 10 and the signals of a pair of control lines CTRL00. Accordingly, it can be determined whether data stored in a pair of the MTJ1 and the MTJ2 in the cell 10 is erroneous data.

The block 42 described in the second embodiment may be used for the block in the first through fourth variations of the third embodiment.

An exemplary case where the MTJ1 and the MTJ2 are respectively coupled to the nodes Q and QB has been described, but it is only required that one of the MTJ1 or the MTJ2 is coupled to the node Q or QB. The MTJ has been described as an example of a non-volatile element, but the non-volatile element may be a giant magnetoresistance element, a variable resistive element used for a ReRAM, or a phase-change element used for a PRAM.

In the first through third embodiments and the variations thereof, the high level and the low level of each signal may be a low level and a high level by appropriately designing each circuit.

Fourth Embodiment

Figure 34A:
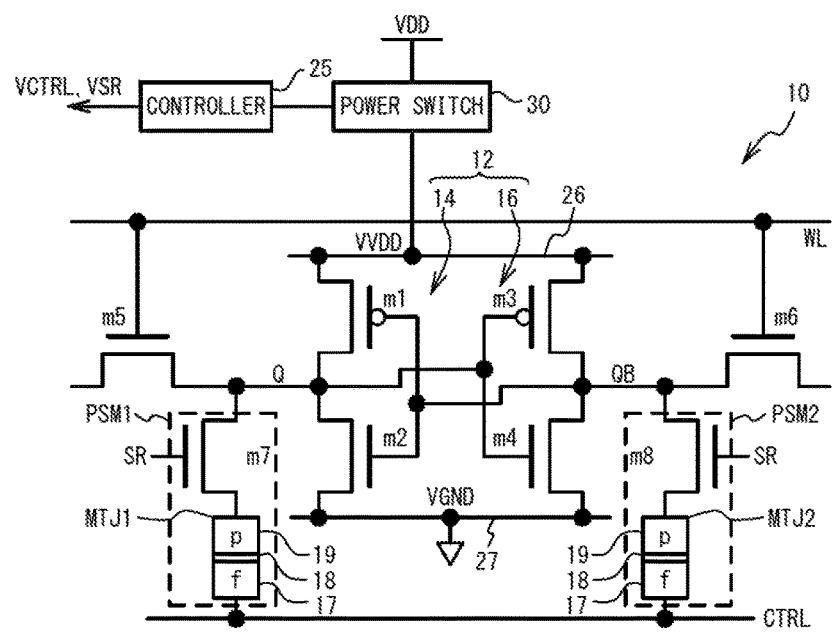
FIG. 34A and FIG. 34B are circuit diagrams of cells in the first through fourth embodiments and the variations thereof.
Figure 34B:
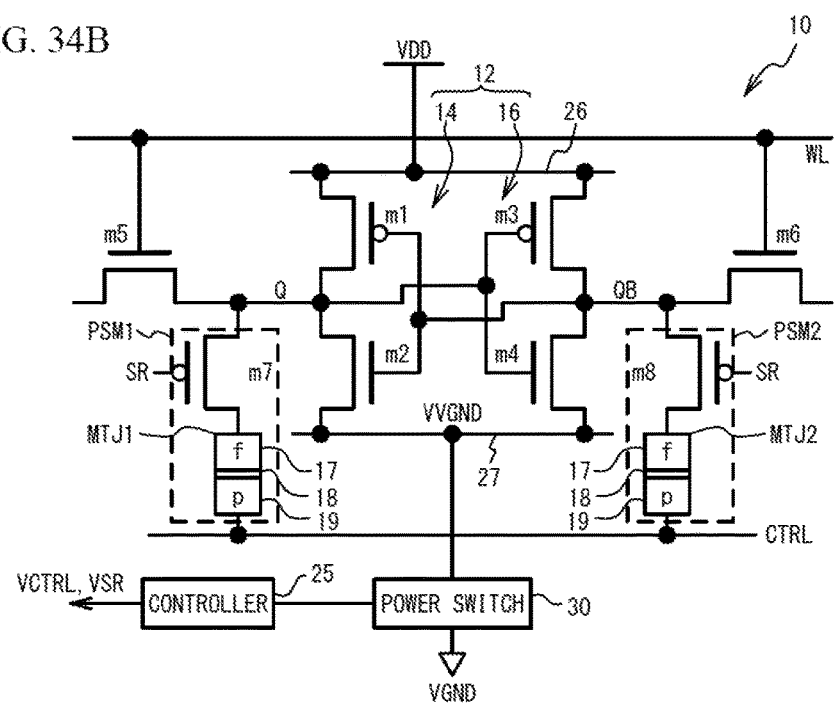

A fourth embodiment changes the voltage applied to a switch line. FIG. 34A and FIG. 34B are circuit diagrams of a cell in the first through fourth embodiments and the variations thereof. FIG. 34A illustrates an example of the virtual power-supply method, and FIG. 34B illustrates an example of the virtual ground method. As illustrated in FIG. 34A, the power supply line 26 and the ground line 27 are coupled to the bistable circuit 12. In the virtual power-supply method, the power switch 30 is coupled to the power supply line 26, decreases the power-supply voltage VDD, and supplies the voltage VVDD to the power supply line 26. The difference between the voltage VVDD across the power supply line 26 and the voltage VGND across the ground line 27 is the voltage supplied, as a power supply voltage, to the cell 10. The controller 25 instructs the power switch 30 to change the voltage VVDD. The controller 25 outputs voltage VCTRL across the control line CTRL and the voltage VSR across the switch line SR. Other configurations of the cell 10 are the same as those of FIG. 1, and the description thereof is thus omitted. The configurations of the components of the memory circuit other than the cell 10 are the same as those of the first through the third embodiments and the variations thereof, and the description thereof is thus omitted.

As illustrated in FIG. 34B, in the virtual ground method, the power switch 30 is coupled to the ground line 27, increases the ground voltage VGND, and supplies the voltage VVGND to the ground line 27. The difference between the voltage VDD across the power supply line 26 and the voltage VVGND across the ground line 27 is the voltage supplied, as a power-supply voltage, to the cell 10. The controller 25 instructs the power switch 30 to change the voltage VVGND. The MOSFETs m7 and m8 are p-channel FETs. The connection relation between the free layer 17 and the pin layer 19 in the MTJ1 and the MTJ2 is inverted with respect to that of FIG. 34A. Other configurations are the same as those of FIG. 34A, and the description thereof is thus omitted.

Hereinafter, the virtual power-supply method illustrated in FIG. 34A will be described. In the virtual power-supply method, the MOSFETs m7 and m8 are n-channel FETs. First, the first embodiment was simulated with the same sequences as those of FIG. 12A and FIG. 12B. In the simulation, the FET was assumed to be a 20 nm node Fin-FET. Time tSL was set to 100 ns. Table 1 lists the voltage VVDD across each power supply line 26, the voltage VCTRL across the control line CTRL, and the voltage VSR across the switch line SR during the sleep period, the normal SRAM operation period (normal period), the store period, the shutdown period, and the restore period in the first embodiment.

TABLE 1

|  | Sleep | Normal | Store | Shutdown | Restore |
| --- | --- | --- | --- | --- | --- |
| VVDD [V] | 0.7 | 0.9 | 0.9 | 0 | 0.9 |
| VCTR [V] | 0.07 | 0.07 | 0 0.55 | 0 | 0 |
| VSR [V] | 0 | 0 | 0.65 | 0 | 0.65 |

As presented in Table 1, the voltage VVDD during the sleep period, the normal SRAM operation period, the store period, the shutdown period, and the restore period is respectively 0.7 V, 0.9 V, 0.9 V, 0 V, and 0.9 V. The voltage VCTRL during the sleep period, the normal SRAM operation period, the store period, the shutdown period, and the restore period is respectively 0.07 V, 0.07 V, 0.55 V (0 V), 0 V and 0 V. During the store period, after 0 V is applied as the voltage VCTRL, 0.55 V is applied. The voltage VSR during the sleep period, the normal SRAM operation period, the store period, the shutdown period, and the restore period is respectively 0 V, 0 V, 0.65 V, 0 V, and 0.65 V. The reason why the voltage VCTRL is set not to 0 V but to 0.07 V during the sleep period and the normal SRAM operation period is to reduce leakage current flowing in the MOSFETs m7 and m8. The current density that reverses the MTJ1 and the MTJ2 was set to Jc=5 MA/cm$^2$, the voltages VCTRL and VSR were respectively set to be 0.55 V and 0.65 V so that current flowing in the MTJ1 and the MTJ2 during the store period was a half times more than Jc. The ground voltage VGND is 0 V.

Figure 35A:
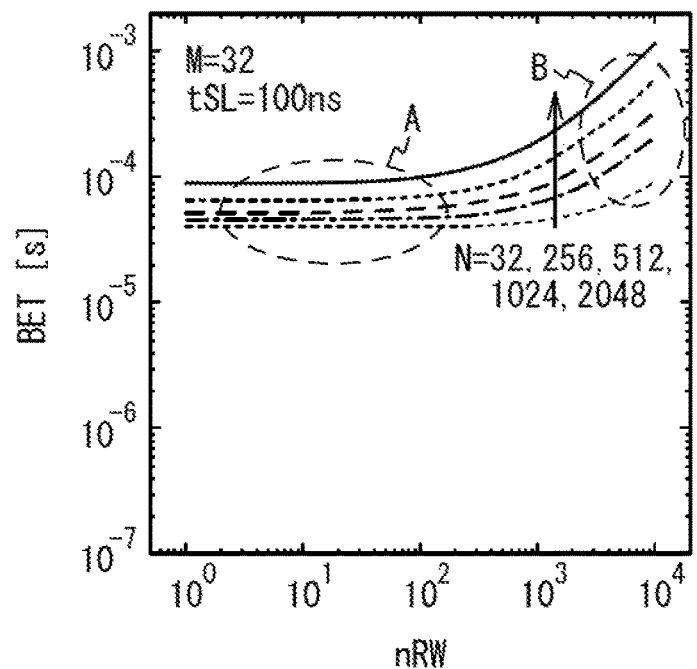
FIG. 35A and FIG. 35B are graphs of BET versus nRW in the first embodiment.
Figure 35B:
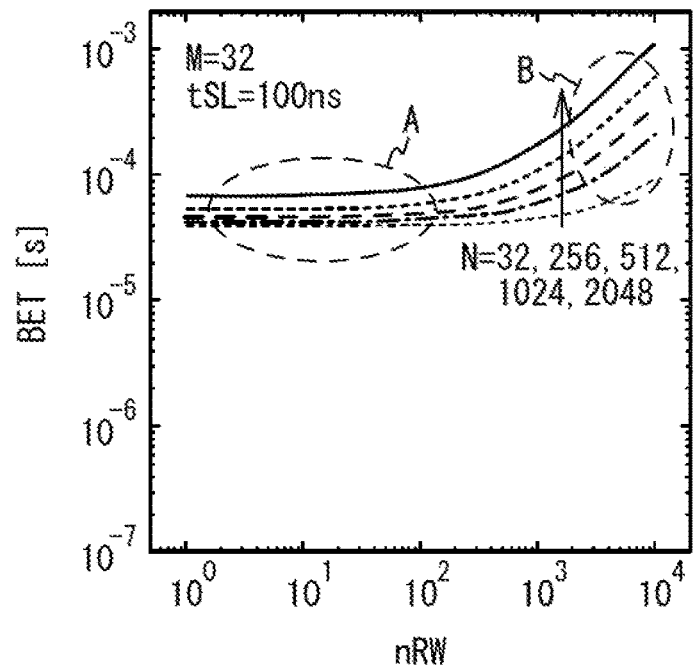

FIG. 35A and FIG. 35B are graphs of BET versus nRW in the first embodiment. FIG. 35A illustrates simulation results of a case where the power-supply voltage to rows other than the row in which storing is performed was set to the voltage during the sleep period as illustrated in FIG. 7 (hereinafter, referred to as an ante/post-storing sleep operation). FIG. 35B illustrates simulation results of a case where the power-supply voltage to the row before its storing was set to the voltage during the sleep period, and the row after its storing is shut down (hereinafter, referred to as a ante-storing sleep and post-storing shutdown operation) as illustrated in FIG. 8. The nRW represents the number of repetitions of read, write, and sleep, and the BET represents Break-Even Time. Column M was set to 32. Each line in FIG. 35A and FIG. 35B indicates 32, 256, 512, 1024, and 2048 of row N in this order in the arrow direction.

As illustrated in FIG. 35A, as row N increases, the BET increases. In a region A where the nRW is $10^2$ or less, the BET hardly depends on the nRW. This region is a region where the BET is governed by the store operation and the restore operation. In a region B where the nRW is $10^2$ or greater, the BET increases as the nRW increases. This region is a region where the BET is governed by the normal SRAM operation.

As illustrated in FIG. 35B, shutdown after storing makes the BET in the region A less than that of FIG. 35A. Especially when row N is large, the BET is small. Thus, shutdown after storing can reduce the BET. This exhibits that power consumption can be reduced. As described above, the first embodiment can reduce power consumption.

Figure 36A:
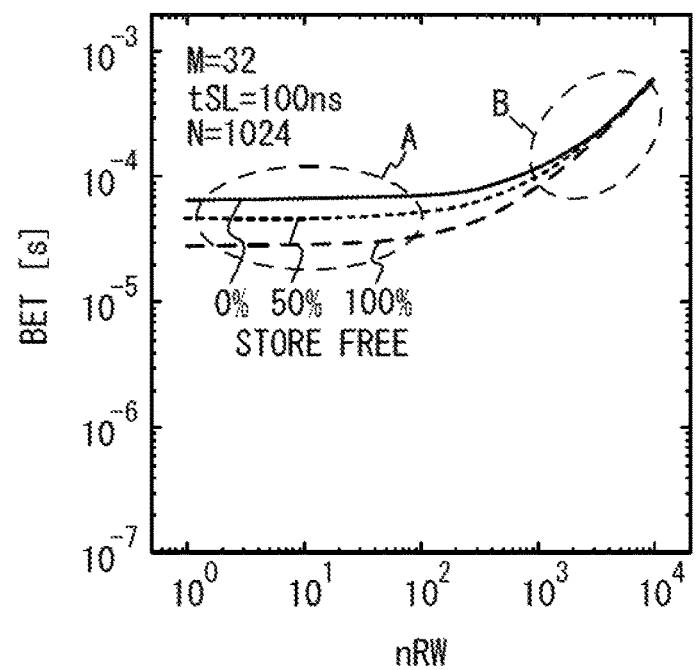
FIG. 36A and FIG. 36B are graphs of BET versus nRW when a store free ratio is varied in the first embodiment.
Figure 36B:
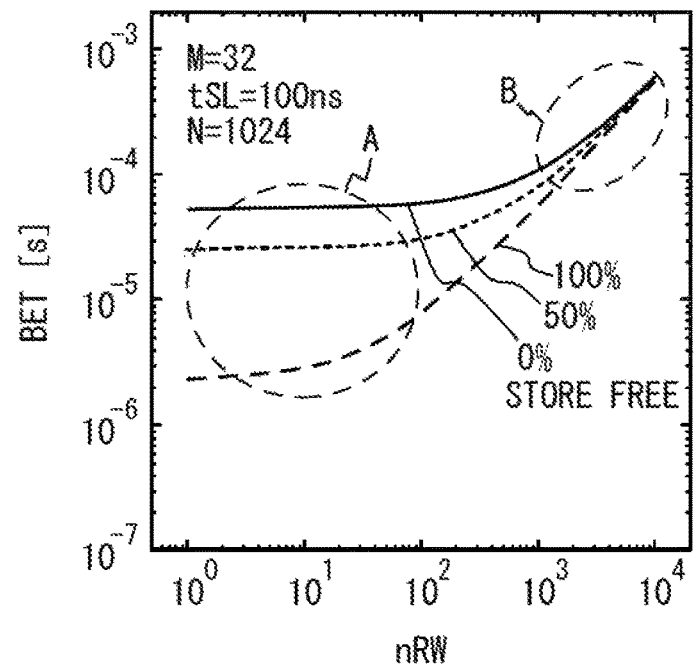

FIG. 36A and FIG. 36B are graphs of BET versus nRW when the store free ratio is varied in the first embodiment. FIG. 36A illustrates simulation results in the ante/post-storing sleep operation. FIG. 36B illustrates simulation results in the ante-storing sleep and post-storing shutdown operation. Simulated was a case where the store free shutdown architecture such as the third embodiment and the variations thereof is applied to the first embodiment. The store free represents the ratio of the number of cells 10 that do not perform the store operation to the total number of cells 10. When the store free is 0%, the store operation is performed in all the cells 10. When the store free is 100%, the store operation is performed in none of the cells 10. When the store free is 50%, the store operation is performed in a half of the cells 10, and the store operation is not performed in the remaining half of the cells 10.

As illustrated in FIG. 36A, in the ante/post-storing sleep operation, as the store free ratio increases, the BET decreases especially in the region A. As illustrated in FIG. 36B, in the ante-storing sleep and post-storing shutdown operation, as the store free ratio increases, the BET greatly decreases. As described above, the application of the third embodiment and the variations thereof to the first embodiment enables for the reduction of power consumption.

Figure 37A:
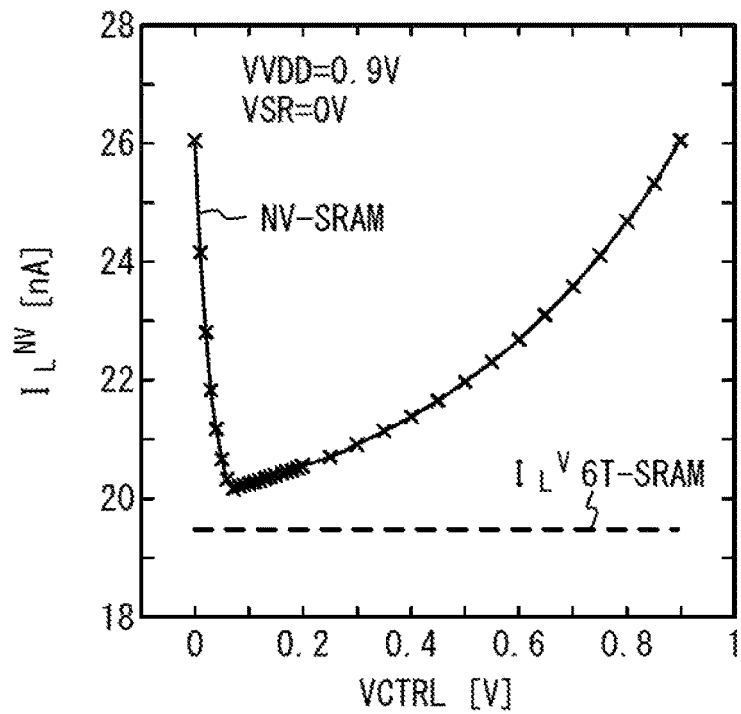
FIG. 37A is a graph of leakage current $I_L^{NV}$ versus voltage VCTRL during a normal SRAM operation period.
Figure 37B:
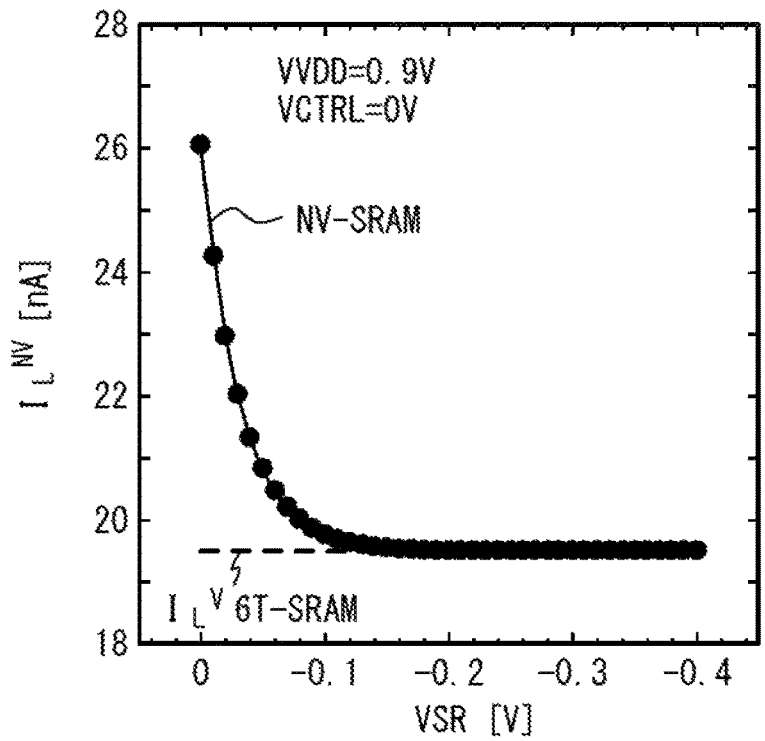
FIG. 37B is a graph of leakage current $I_L^{NV}$ versus voltage VSR during the normal SRAM operation period.

To reduce the BET in the region A, it is important to reduce leakage current via the MOSFETs m7 and m8 during the normal SRAM operation period. FIG. 37A and FIG. 37B are graphs of leakage current $I_L^{NV}$ versus voltages VCTRL and VSR in the normal SRAM operation period, respectively. The leakage current $I_L^{NV}$ is leakage current per NV-SRAM cell during the normal SRAM operation period illustrated in FIG. 3. Dots indicate simulation results, and the solid line is a line connecting the dots. The dashed line is the leakage current of the 6T-SRAM during the normal SRAM operation period illustrated in FIG. 3. In FIG. 37A, the voltage VVDD is set to 0.9V and the voltage VSR is set to 0 V, while in FIG. 37B, the voltage VVDD is set to 0.9 V and the voltage VCTRL is set to 0 V.

As illustrated in FIG. 37A, the leakage current $I_L^{NV}$ is greater than the leakage current $I_L^V$ of the 6T-SRAM at any voltage VCTRL. The voltage VCTRL at which the leakage current $I_L^{NV}$ has a minimum value is 0.07 V. This is the reason why the voltage VCTRL during the sleep period, the normal SRAM operation period, and the restore period is set to 0.07V in Table 1.

As illustrated in FIG. 37B, when the voltage VSR is reduced to less than 0 V, the leakage current $I_L^{NV}$ becomes smaller. When the voltage VSR is approximately −0.14 V or less, the leakage current $I_L^{NV}$ is approximately equal to the leakage current $I_L^V$ of the 6T-SRAM.

The fourth embodiment sets the voltage VSR to less than the voltage VGND (0 V) across the ground line 27 during the normal SRAM operation period and the sleep period. In this manner, the power consumption is reduced. Table 2 lists the voltages VVDD, VCTRL, and VSR during the sleep period, the normal RAM operation period (normal period), the store period, the shutdown period, and the restore period in the fourth embodiment.

TABLE 2

|  | Sleep | Normal | Store | Shutdown | Restore |
|---|---|---|---|---|---|
| VVDD [V] | 0.7 | 0.9 | 0.9 | 0 | 0.9 |
| VCTR ]V] | 0 | 0 | 0.55 | 0 | 0 |
| VSR [V] | −0.2 | −0.2 | 0.65 | 0 | 0.65 |

As presented in Table 2, the voltage VCTRL during the sleep period, the normal SRAM operation period, and the restore period is set to 0 V. The voltage VSR during the sleep period and the normal SRAM operation period is set to −0.2 V, which is less than the voltage VGND across the ground line 27. Other voltages are the same as those presented in Table 1, and the description thereof is thus omitted.

Figure 38A:
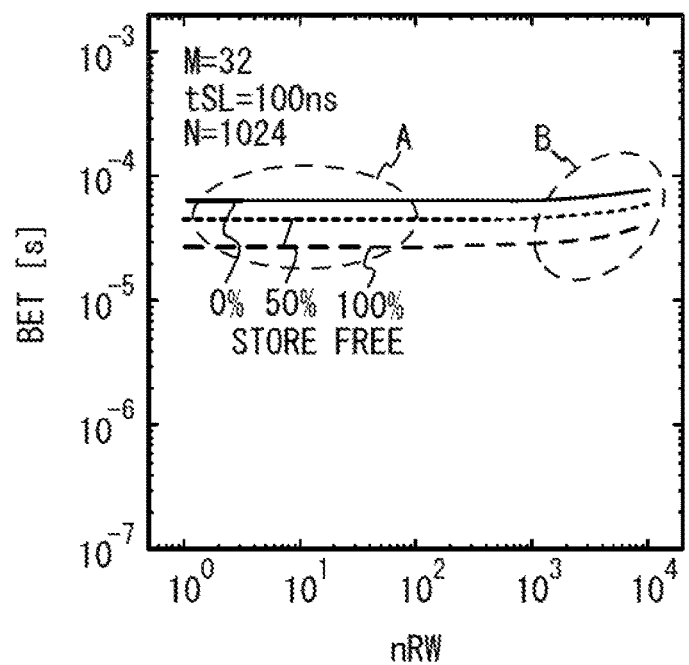
FIG. 38A and FIG. 38B are graphs of BET versus nRW in the fourth embodiment.
Figure 38B:
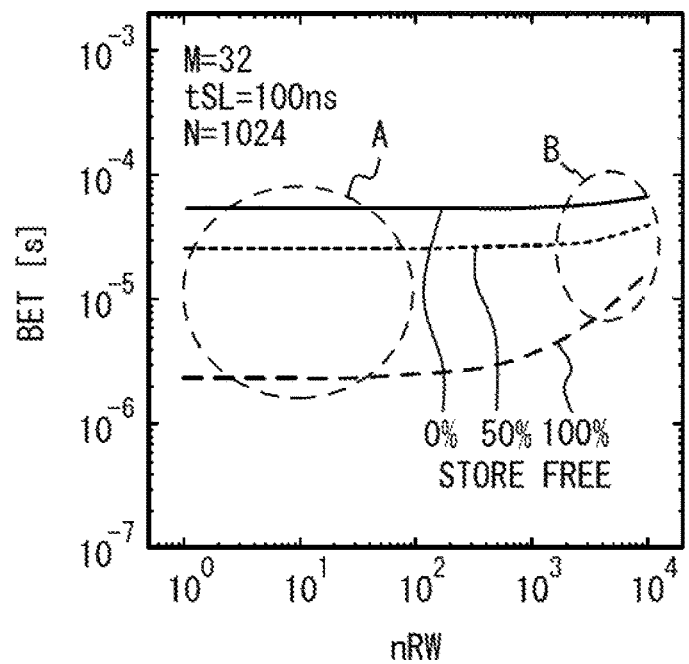

FIG. 38A and FIG. 38B are graphs of BET versus nRW in the fourth embodiment. FIG. 38A illustrates simulation results in the ante/post-storing sleep operation. FIG. 38B illustrates simulation results in the ante-storing sleep and post-storing shutdown operation. The BET in FIG. 38A and FIG. 38B is small compared to that in FIG. 36A and FIG. 36B. As described above, in the fourth embodiment, the leakage current via the MOSFETs m7 and m8 during the sleep period and the normal SRAM operation period is reduced. Accordingly, power consumption can be reduced.

The above description has described each voltage in the fourth embodiment for an example of the virtual power-supply method in FIG. 34A. The fourth embodiment may employ the virtual ground method illustrated in FIG. 34B. In the virtual ground method, the MOSFETs m7 and m8 are p-channel FETs. When the MOSFETs m7 and m8 are p-channel FETs, the voltage VSR higher than the voltage VDD across the power supply line 26 is applied to the gates of the MOSFETs m7 and m8 during the sleep period and the normal SRAM operation period. This configuration reduces the leakage current via the MOSFETs m7 and m8.

As described above, in the fourth embodiment, the controller 25 supplies the bistable circuit 12 with the voltage VVDD or VDD across the power supply line 26 and the voltage VGND or VVGND across the ground line 27 during the normal SRAM operation period (a first time period during which data is written to or read from the bistable circuit 12 in a volatile manner). In this case, the voltage VSR applied to the gates of the MOSFETs m7 and m8 is set to less than the voltage VGND across the ground line 27 when the MOSFETs m7 and m8 are n-channel FETs, while to greater than the voltage VDD across the power supply line 26 when the MOSFETs m7 and m8 are p-channel FETs. This configuration can reduce the leakage current via the MOSFETs m7 and m8. The first time period may include a time period for standby during which voltages equal to the voltages of the power supply line 26 and the ground line 27 when data is written to or read from the bistable circuit 12 in a volatile manner are respectively applied to the power supply line 26 and the ground line 27.

The controller 25 may set the voltage VSR applied to the gates of the MOSFETs m7 and m8 to less than the voltage VGND across the ground line 27 when the MOSFETs m7 and m8 are n-channel FETs, while to greater than the voltage VDD across the power supply line 26 when the MOSFETs m7 and m8 are p-channel FETs even during the sleep period (a second time period during which data in the bistable circuit 12 is retained and the difference between the voltage of the power supply line 26 and the voltage of the ground line is set to less than the difference between the voltage of the power supply line and the voltage of the ground line during the normal SRAM operation period).

A first variation of the fourth embodiment makes the voltage VSR during the restore period low. The virtual power-supply method will be described as an example. Table 3 lists the voltages VDD, VCTRL, and VSR during the sleep period, the normal operation period, the store period, the shutdown period, and the restore period in the first variation of the fourth embodiment.

TABLE 3

| | Sleep | Normal | Store | Shutdown | Restore |
|---|---|---|---|---|---|
| VVDD [V] | 0.7 | 0.9 | 0.9 | 0 | 0.9 |
| VCTR [V] | 0 | 0 | 0 | 0.55 | 0 |
| VSR [V] | −0.2 | −0.2 | 0.65 | 0 | 0.2 |

As presented in Table 3, the voltage VSR during the restore period is set to 0.2 V, which is less than the voltage VSR during the store period. Other voltages are the same as those presented in Table 2, and the description thereof is omitted.

Figure 39A:
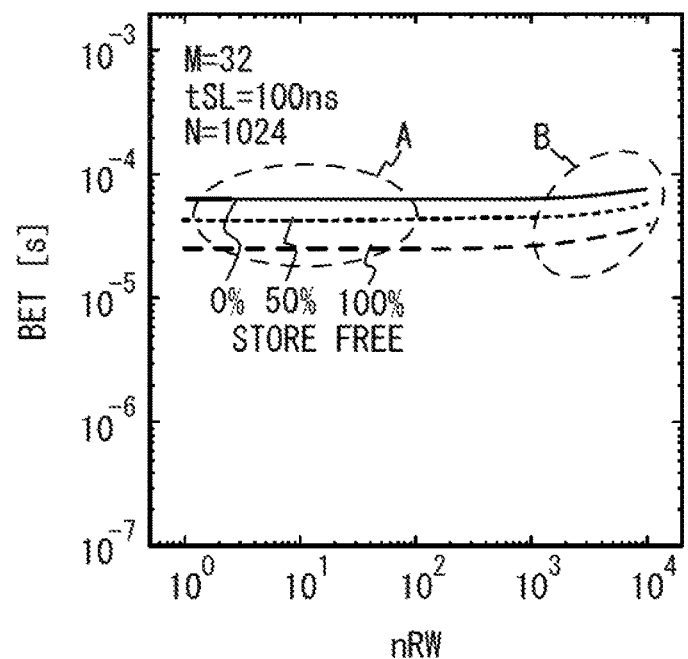
FIG. 39A and FIG. 39B are graphs of BET versus nRW in the first variation of the fourth embodiment.
Figure 39B:
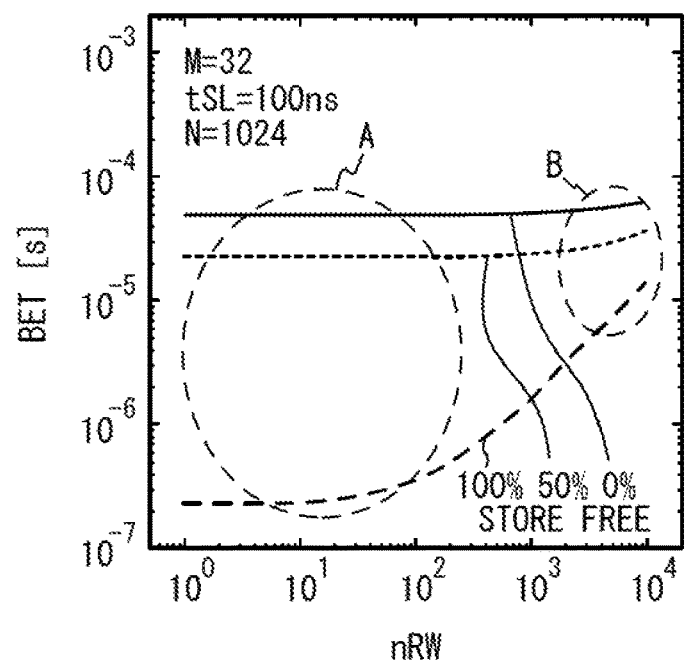

FIG. 39A and FIG. 39B are graphs of BET versus nRW in the first variation of the fourth embodiment. FIG. 39A illustrates simulation results in the ante/post-storing sleep operation. FIG. 39B illustrates simulation results in the ante-storing sleep and post-storing shutdown operation. The BET in FIG. 39A and FIG. 39B is less than that in FIG. 38A and FIG. 38B when the store free ratio is large in the region A of the ante-storing sleep and post-storing shutdown operation. As described above, the first variation of the fourth embodiment can reduce power consumption during the store period and the restore period.

The first variation of the fourth embodiment may employ the virtual ground method. That is, the MOSFETs m7 and m8 may be p-channel FETs. When the MOSFETs m7 and m8 are p-channel FETs, it is only required that the voltage VSR during the restore period is set to greater than the voltage VSR during the store period.

In the first variation of the fourth embodiment, the controller 25 sets the voltage VSR applied to the gates of the MOSFETs m7 and m8 during the restore period to less than the voltage VSR applied to the MOSFETs m7 and m8 during the store period when the MOSFETs m7 and m8 are n-channel FETs, while to greater than the voltage VSR applied to the MOSFETs m7 and m8 during the store period when the MOSFETs m7 and m8 are p-channels FET. This configuration can reduce power consumption during the restore period.

The fourth embodiment and the first variation thereof are exemplary cases where the ante/post-storing sleep operation or the ante-storing sleep and post-storing shutdown operation is performed as in the first embodiment. The fourth embodiment and the variation thereof may be used in operations other than the above-described operations.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10 cell
12 bistable circuit
20 cell array
25 controller
26 power supply line
27 ground line
30 power switch
40 selection circuit
50 determination circuit
SR0-SR7 switch line
SR00-SR73 sub-switch line
CTRL00-CTRL07 control line

The invention claimed is:

1. A memory circuit comprising:
   a plurality of cells arranged in a plurality of rows and a plurality of columns so that the plurality of rows are grouped to form a plurality of banks each including one or more rows, each of the plurality of cells including:
      a bistable circuit configured to store data; and a non-volatile element configured to store data stored in the bistable circuit in a non-volatile manner and to restore data stored in a non-volatile manner to the bistable circuit; and
   a controller configured to:
   perform a store operation on each of the plurality of rows in turn;
   set a voltage supplied, as a power-supply voltage, to cells in a first bank of the plurality of banks to a first voltage, the first bank including a row on which the store operation is performed; and
   set a voltage supplied, as a power-supply voltage, to cells in a bank of the plurality of banks other than the first bank to a second voltage that is less than the first voltage but at which data in the bistable circuit is retained.

2. The memory circuit according to claim 1, wherein the controller is configured to sequentially set a voltage supplied, as a power-supply voltage, to the cells in a bank of which all rows have been subject to the store operation to the second voltage among the plurality of banks.

3. The memory circuit according to claim 1, wherein the controller is configured to sequentially shut down a voltage supplied, as a power-supply voltage, to the cells in a bank of which all rows have been subject to the store operation among the plurality of banks.

4. The memory circuit according to claim 1, wherein:
   the non-volatile element includes a first end coupled to a node in the bistable circuit and a second end coupled to a control line;
   each of the plurality of cells includes a switch connected in series to the non-volatile element between the node and the control line; and a voltage supplied, as a power-supply voltage, to the plurality of cells is supplied to the bistable circuit.

5. The memory circuit according to claim 1, wherein each of the plurality of banks includes one row.

6. A memory circuit comprising:
a plurality of cells, each including: a bistable circuit configured to store data; and a non-volatile element configured to store data stored in the bistable circuit in a non-volatile manner and to restore data stored in a non-volatile manner to the bistable circuit;
one or more power switches configured to change a voltage supplied, as a power-supply voltage, to the plurality of cells; and
a controller configured to perform a store operation on each of a plurality of blocks at different times in a region, the region to which a same voltage is supplied by a single power switch being divided into the plurality of blocks.

7. The memory circuit according to claim 6, wherein:
the plurality of cells are arranged in a plurality of rows and a plurality of columns;
the region includes one or more rows; and
one row is divided into the plurality of blocks.

8. The memory circuit according to claim 7, wherein:
each of the plurality of cells includes a switch for performing storing of data;
the switches in cells of each of the plurality of blocks are coupled to a same sub-switch line;
sub-switch lines in a same row are coupled to a single switch line; and
the memory circuit further comprises a selection circuit configured to select one block of the plurality of blocks, and to output a signal for turning on the switch to a sub-switch line of a selected block.

9. The memory circuit according to claim 8, wherein:
the non-volatile element includes a first end coupled to a node in the bistable circuit, and a second end coupled to a control line;
the switch is connected in series to the non-volatile element between the node and the control line; and
a voltage supplied, as a power-supply voltage, to the cell is supplied to the bistable circuit.

10. The memory circuit according to claim 7, wherein each of the plurality of blocks includes consecutive cells in a same row.

11. The memory circuit according to claim 7, wherein each of the plurality of blocks includes cells periodically arranged in a same row.

12. The memory circuit according to claim 6, further comprising:
a determination circuit configured to determine whether data in the bistable circuit and data in the non-volatile element match in cells of each of the plurality of blocks; and
a selection circuit configured to perform the store operation of the cells in a corresponding block when the data in the bistable circuit and the date in the no-volatile element fail to match, and not to perform the store operation of the cells in the corresponding block when the data in the bistable circuit and the date in the no-volatile element match.

* * * * *